(12) United States Patent
Yamazaki

(10) Patent No.: US 10,886,412 B2
(45) Date of Patent: Jan. 5, 2021

(54) SEMICONDUCTOR DEVICE AND MANUFACTURING METHOD THEREOF

(71) Applicant: Semiconductor Energy Laboratory Co., Ltd., Atsugi (JP)

(72) Inventor: Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 15/477,443

(22) Filed: Apr. 3, 2017

(65) Prior Publication Data

US 2017/0294541 A1 Oct. 12, 2017

(30) Foreign Application Priority Data

Apr. 8, 2016 (JP) .................................. 2016-078507

(51) Int. Cl.
*H01L 29/10* (2006.01)
*H01L 29/786* (2006.01)
(Continued)

(52) U.S. Cl.
CPC ........ *H01L 29/7869* (2013.01); *C01B 33/113* (2013.01); *C01F 7/02* (2013.01);
(Continued)

(58) Field of Classification Search
CPC ..................... H01L 29/66742; H01L 29/7869
(Continued)

(56) References Cited

U.S. PATENT DOCUMENTS 7,674,650 B2 3/2010 Akimoto et al.
8,384,080 B2 2/2013 Taniguchi et al.
(Continued)

FOREIGN PATENT DOCUMENTS

CN 104821338 A 8/2015
DE 102015201707 8/2015
(Continued)

OTHER PUBLICATIONS

International Search Report (Application No. PCT/IB2017/051782) dated Jun. 20, 2017.
(Continued)

*Primary Examiner* — Jay C Kim
(74) *Attorney, Agent, or Firm* — Fish & Richardson P.C.

(57) ABSTRACT

A highly reliable semiconductor device includes a first insulator, a second insulator, a first conductor, a third insulator, an oxide semiconductor, second and third conductors, a fourth insulator, a fourth conductor overlapping with a region between the second and third conductors, a fifth insulator, and a sixth insulator in this order. The fourth insulator is in contact with top and side surfaces of the oxide semiconductor, and a top surface of the third insulator. The fifth insulator is in contact with the side surface of the oxide semiconductor and the top surface of the third insulator so as to cover the oxide semiconductor, the second to fourth conductors, and the fourth insulator. The first, second, fifth, and sixth insulators have low permeability for hydrogen, water, and oxygen. The first and sixth insulators have a thinner thickness than the second and sixth insulators, respectively.

7 Claims, 31 Drawing Sheets

(51) Int. Cl.

| | |
|---|---|
| *C23C 14/08* | (2006.01) |
| *H01L 27/12* | (2006.01) |
| *C01B 33/113* | (2006.01) |
| *C01F 7/02* | (2006.01) |
| *C01G 15/00* | (2006.01) |
| *C23C 14/34* | (2006.01) |
| *C23C 16/40* | (2006.01) |
| *C23C 16/455* | (2006.01) |
| *C23C 16/56* | (2006.01) |
| *H01L 21/02* | (2006.01) |
| *H01L 21/306* | (2006.01) |
| *H01L 21/324* | (2006.01) |
| *H01L 29/66* | (2006.01) |

(52) U.S. Cl.
CPC ............ *C01G 15/006* (2013.01); *C23C 14/08* (2013.01); *C23C 14/081* (2013.01); *C23C 14/34* (2013.01); *C23C 16/401* (2013.01); *C23C 16/403* (2013.01); *C23C 16/45525* (2013.01); *C23C 16/56* (2013.01); *H01L 21/0228* (2013.01); *H01L 21/30604* (2013.01); *H01L 21/324* (2013.01); *H01L 27/1225* (2013.01); *H01L 29/66742* (2013.01); *H01L 29/78648* (2013.01); *H01L 29/78696* (2013.01)

(58) Field of Classification Search
USPC .......................................................... 257/43
See application file for complete search history.

(56) References Cited

U.S. PATENT DOCUMENTS

| | | | |
|---|---|---|---|
| 8,692,252 B2 | 4/2014 | Takata et al. | |
| 8,737,109 B2 | 5/2014 | Yamazaki et al. | |
| 8,860,108 B2 | 10/2014 | Yamazaki et al. | |
| 8,878,173 B2* | 11/2014 | Yamazaki | H01L 27/1225 257/43 |
| 8,901,558 B2* | 12/2014 | Yamazaki | H01L 29/4908 257/43 |
| 8,947,158 B2 | 2/2015 | Watanabe | |
| 9,024,317 B2 | 5/2015 | Endo et al. | |
| 9,219,164 B2* | 12/2015 | Yamazaki | H01L 29/7869 |
| 9,236,408 B2* | 1/2016 | Yamazaki | H01L 27/14609 |
| 9,276,121 B2* | 3/2016 | Yamazaki | H01L 29/78609 |
| 9,281,408 B2* | 3/2016 | Yamazaki | H01L 29/66969 |
| 9,337,826 B2 | 5/2016 | Koyama et al. | |
| 9,768,317 B2* | 9/2017 | Ito | H01L 21/02178 |
| 2001/0049064 A1 | 12/2001 | Lee et al. | |
| 2011/0281394 A1 | 11/2011 | Yamazaki | |
| 2012/0001170 A1 | 1/2012 | Yamazaki | |
| 2013/0221345 A1 | 8/2013 | Ohno et al. | |
| 2014/0361291 A1 | 12/2014 | Sasagawa et al. | |
| 2015/0048368 A1 | 2/2015 | Yamazaki et al. | |
| 2015/0187824 A1 | 7/2015 | Yamazaki et al. | |
| 2015/0221678 A1 | 8/2015 | Yamazaki et al. | |
| 2015/0287831 A1 | 10/2015 | Tanaka et al. | |
| 2015/0340505 A1 | 11/2015 | Yamazaki et al. | |
| 2016/0163880 A1 | 6/2016 | Ohno et al. | |
| 2016/0336352 A1 | 11/2016 | Yamazaki et al. | |
| 2017/0263650 A1 | 9/2017 | Tochibayashi et al. | |

FOREIGN PATENT DOCUMENTS

| | | |
|---|---|---|
| JP | 2007-096055 A | 4/2007 |
| JP | 2007-123861 A | 5/2007 |
| JP | 2011-119674 A | 6/2011 |
| JP | 2011-124360 A | 6/2011 |
| JP | 2011-138934 A | 7/2011 |
| JP | 2013-211543 A | 10/2013 |
| JP | 2015-019057 A | 1/2015 |
| JP | 2015-156477 A | 8/2015 |
| JP | 2015-179822 A | 10/2015 |
| JP | 2016-001722 A | 1/2016 |
| JP | 2016-001736 A | 1/2016 |
| KR | 2013-0098924 A | 9/2013 |
| KR | 2015-0092722 A | 8/2015 |
| KR | 2015-0126771 A | 11/2015 |
| KR | 2017-0004994 A | 1/2017 |
| TW | 201532243 | 8/2015 |
| TW | 201535690 | 9/2015 |
| TW | 201603252 | 1/2016 |
| WO | WO-2015/097596 | 7/2015 |
| WO | WO-2015/177685 | 11/2015 |

OTHER PUBLICATIONS

Written Opinion (Application No. PCT/IB2017/051782) dated Jun. 20, 2017.
Taiwanese Office Action (Application No. 106111791) dated Nov. 4, 2020.

* cited by examiner

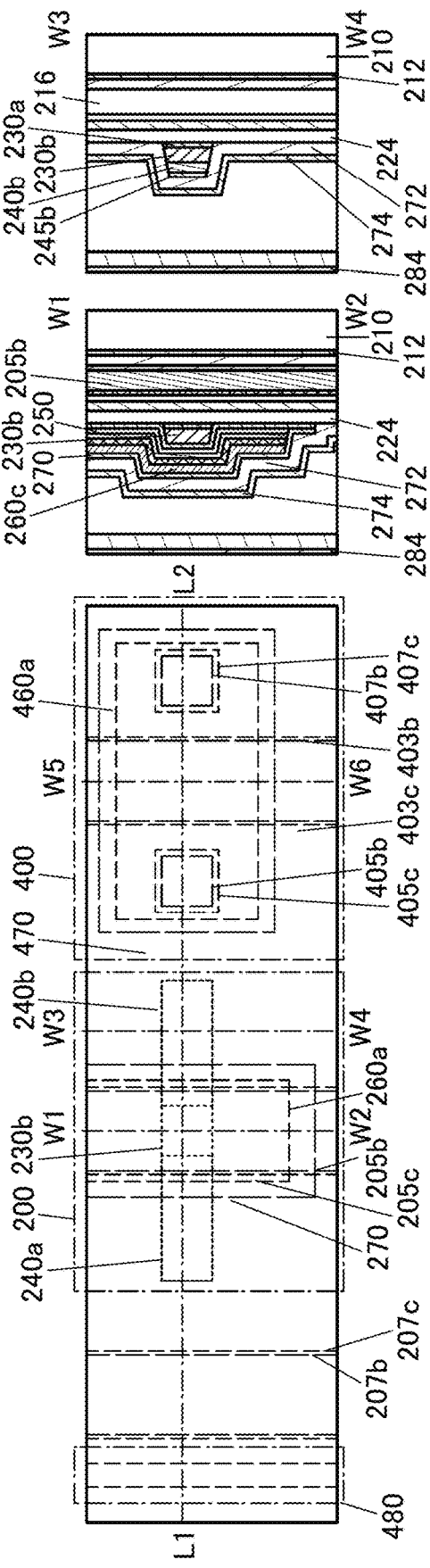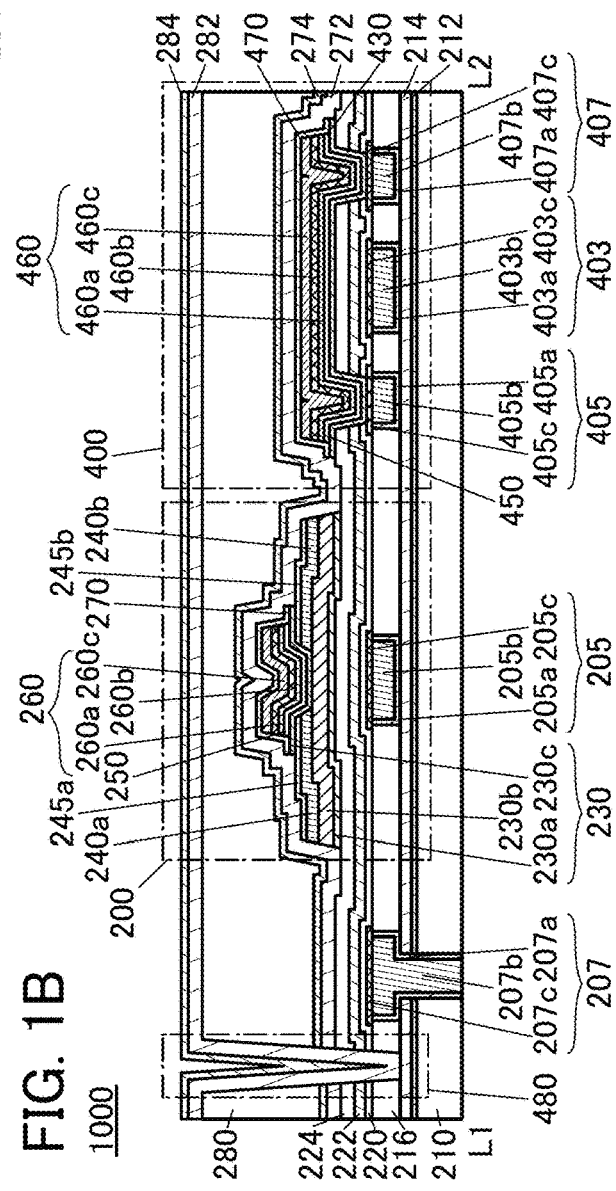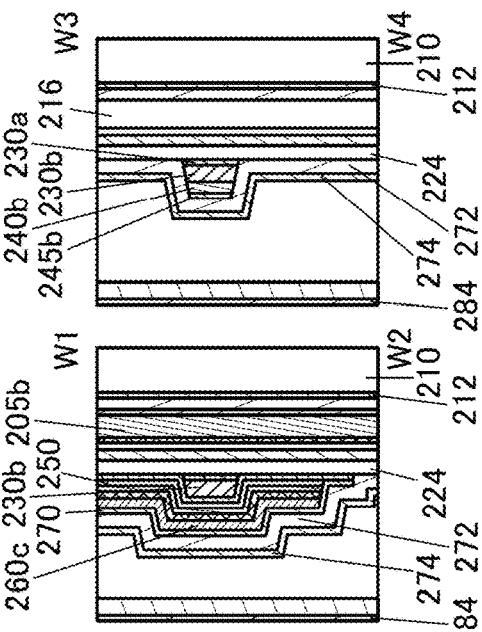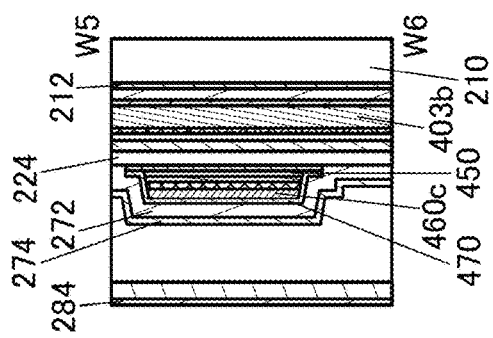

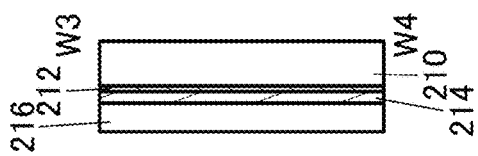
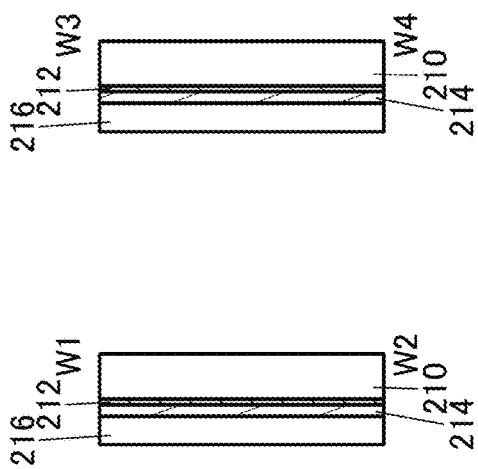
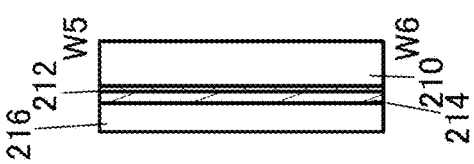
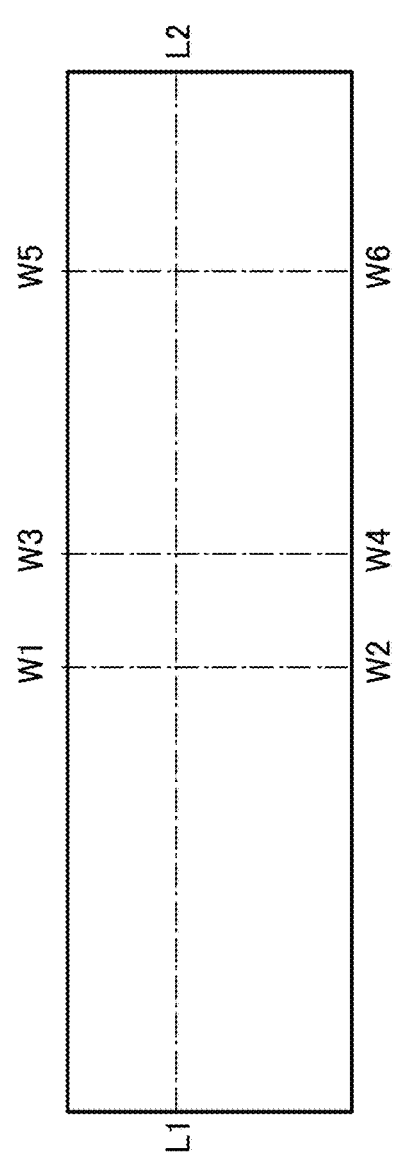
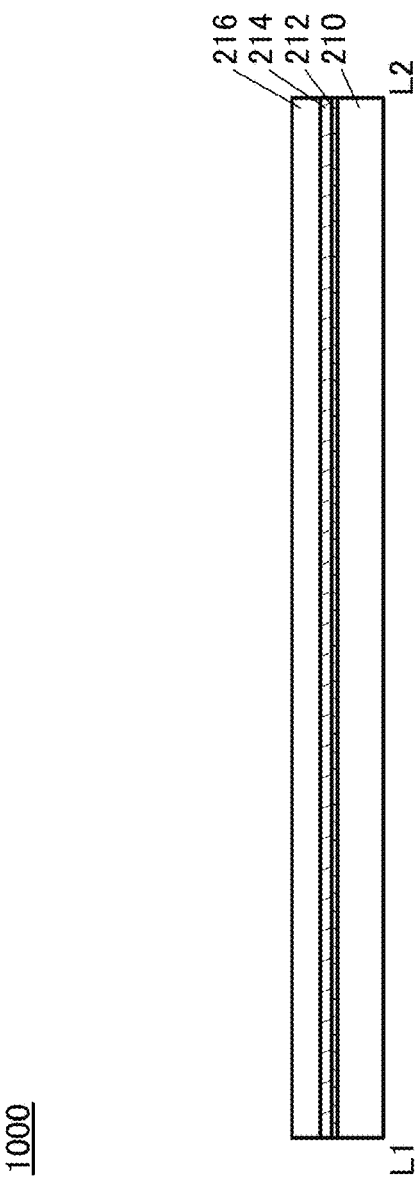

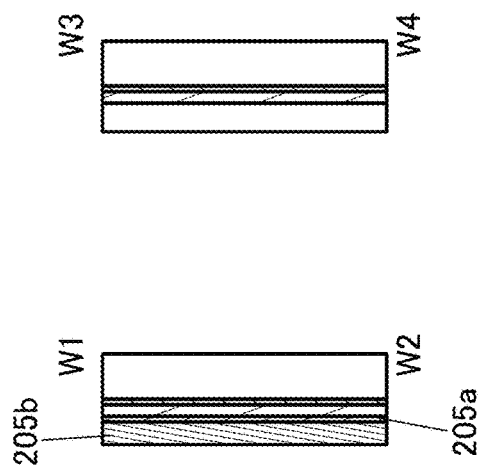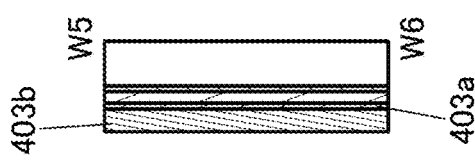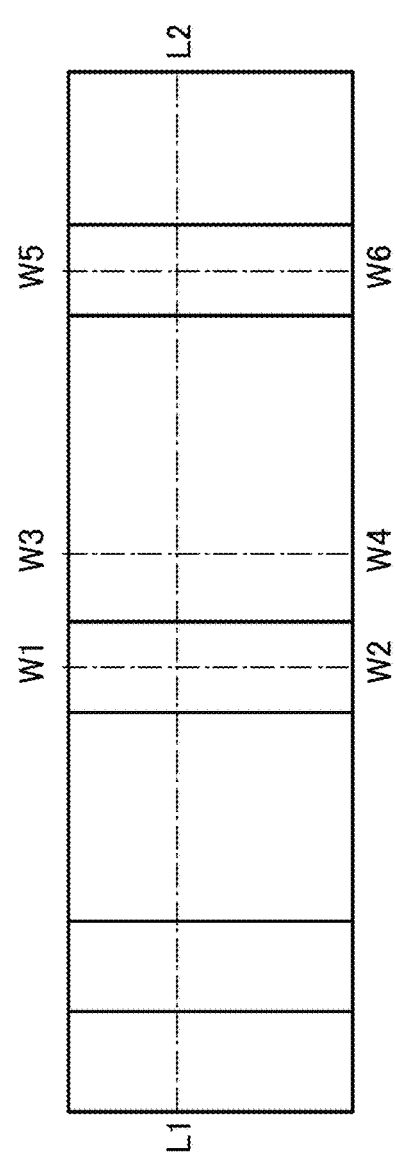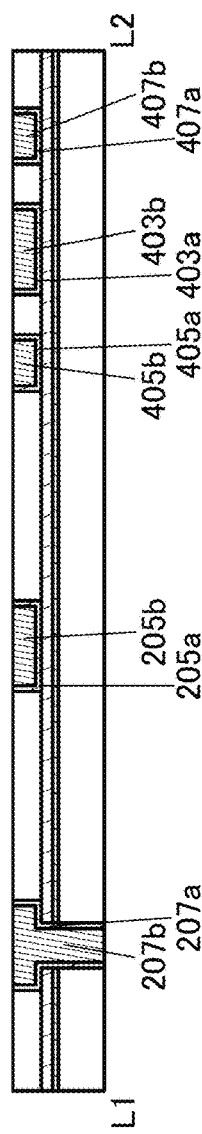

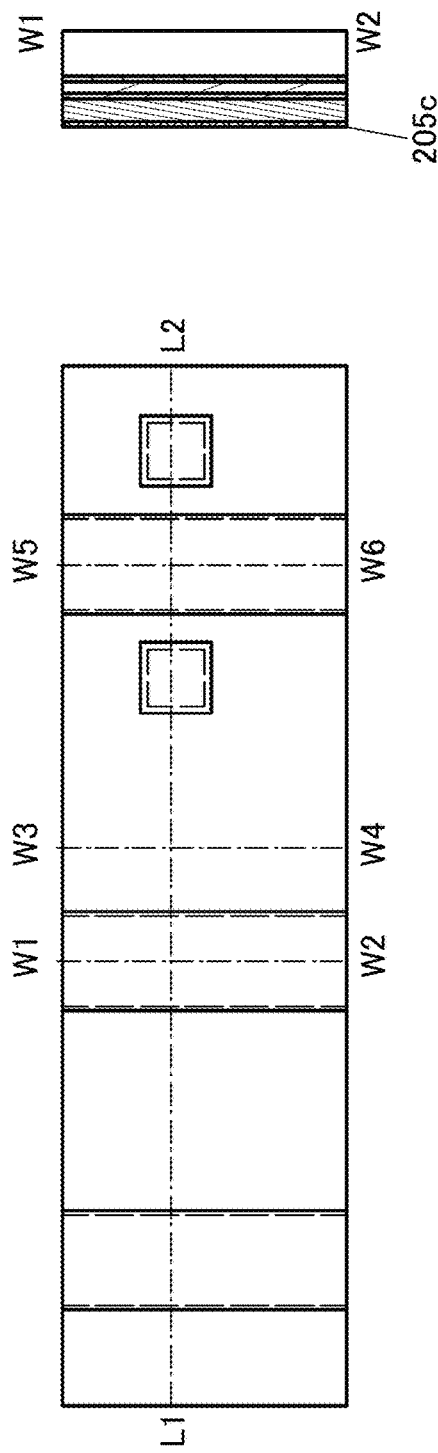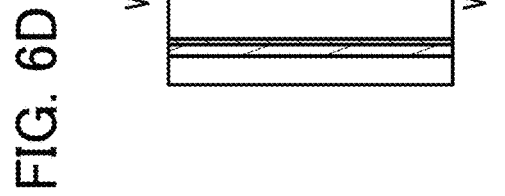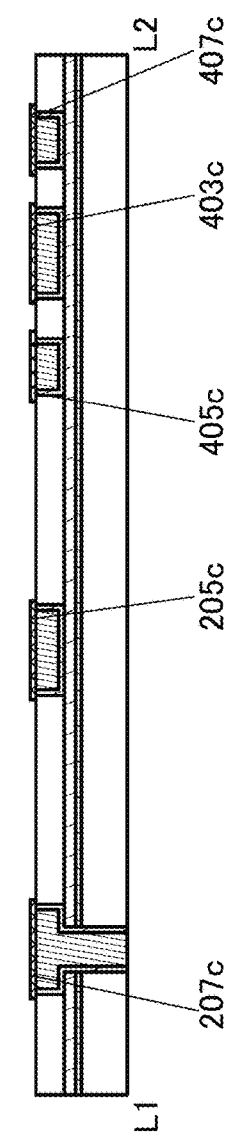

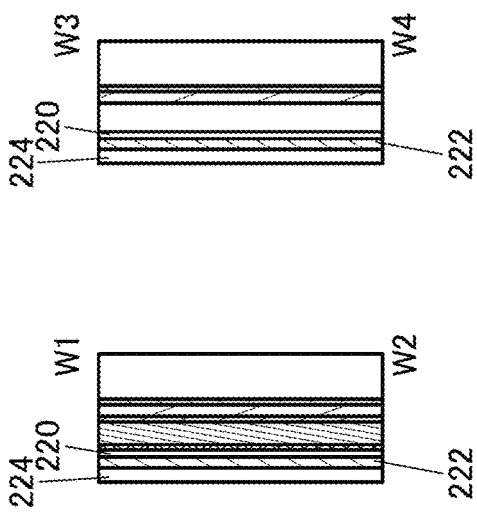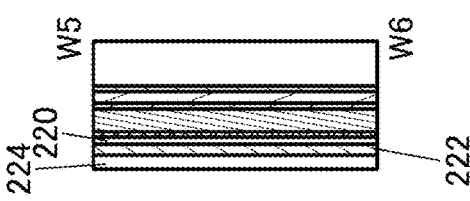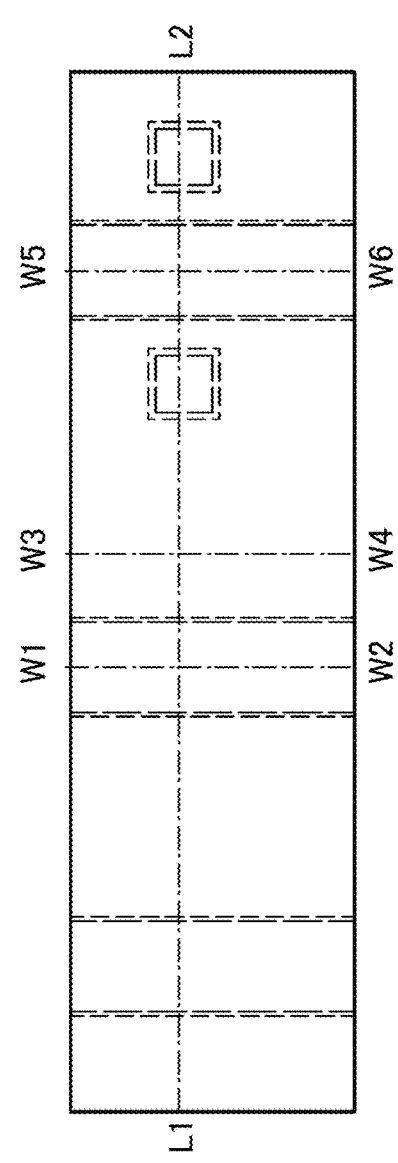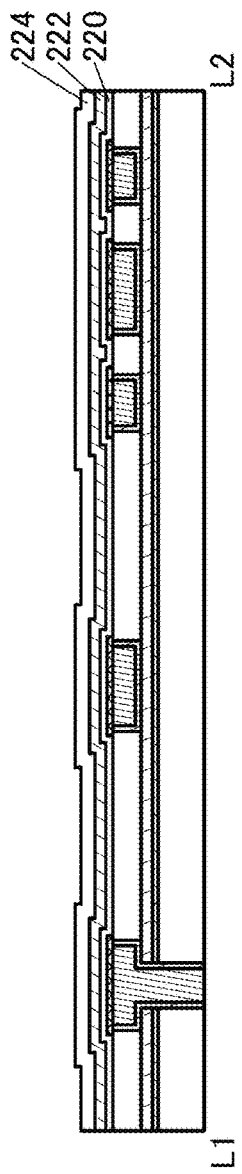

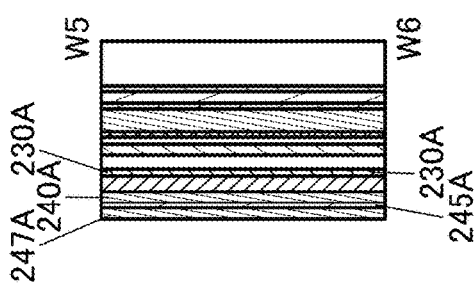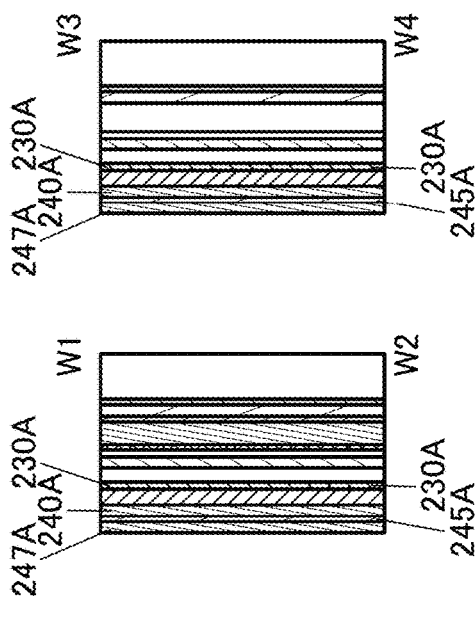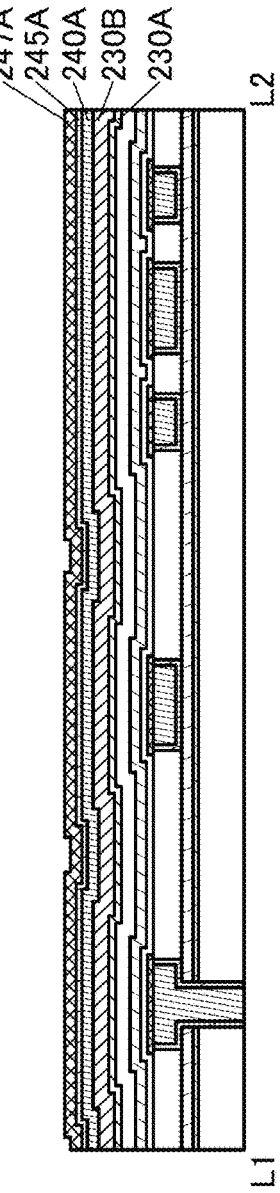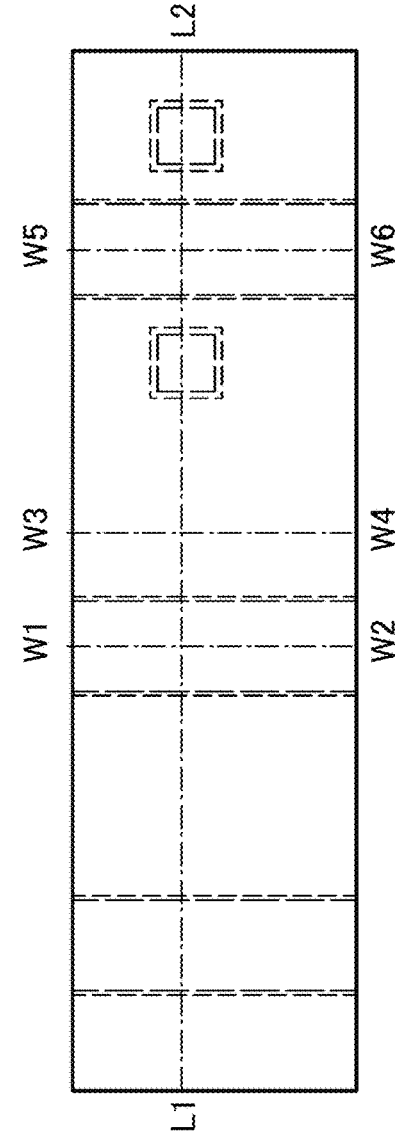

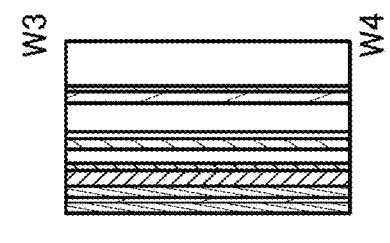
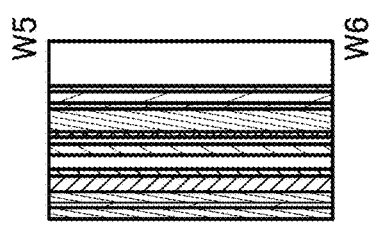
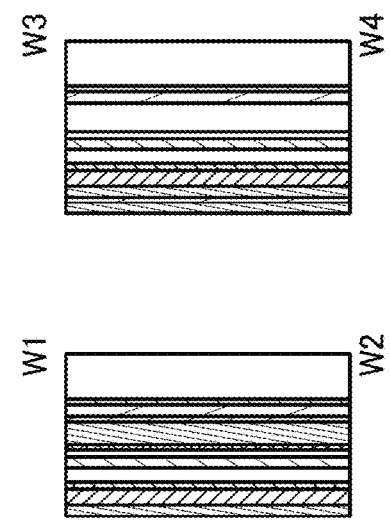
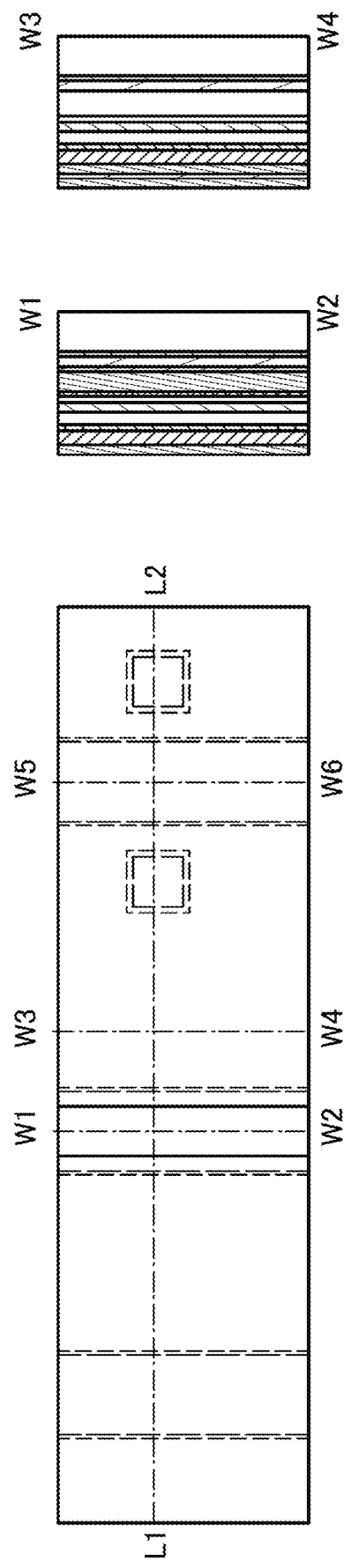
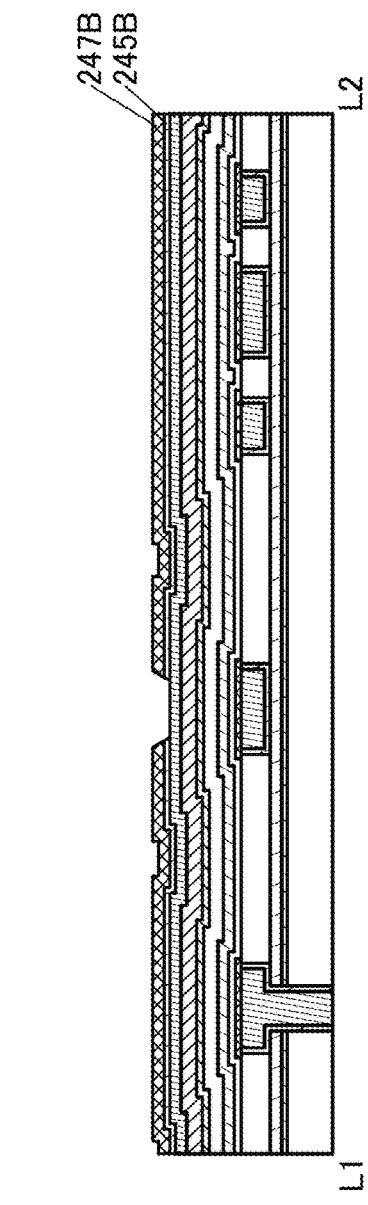

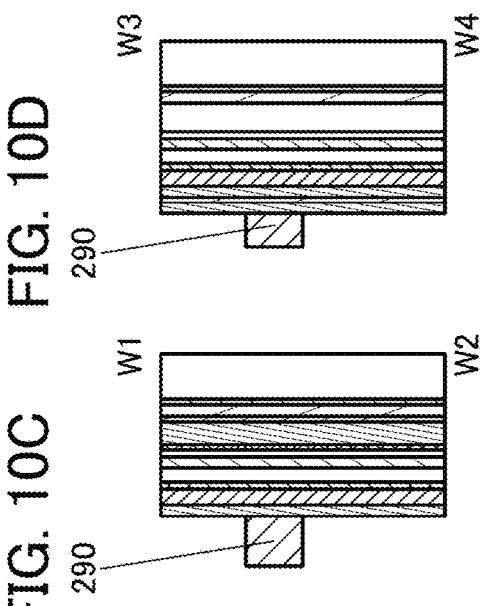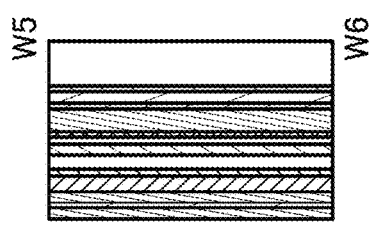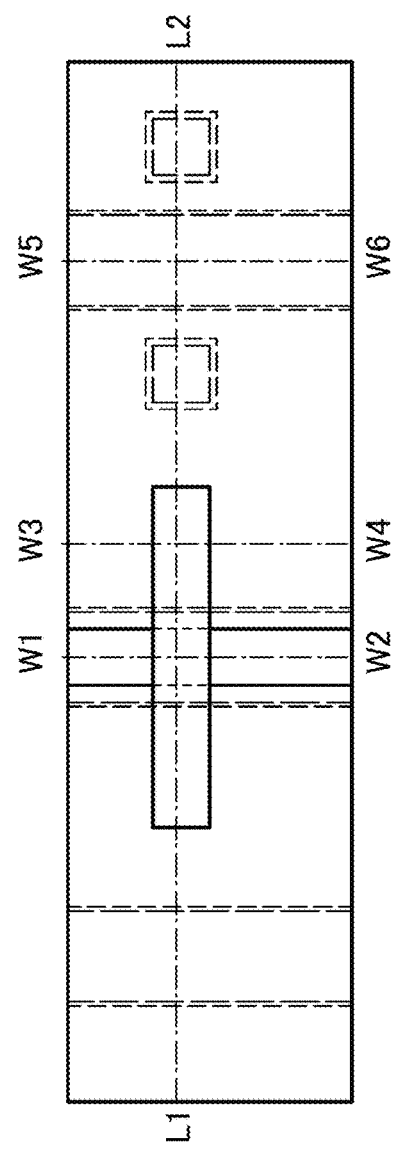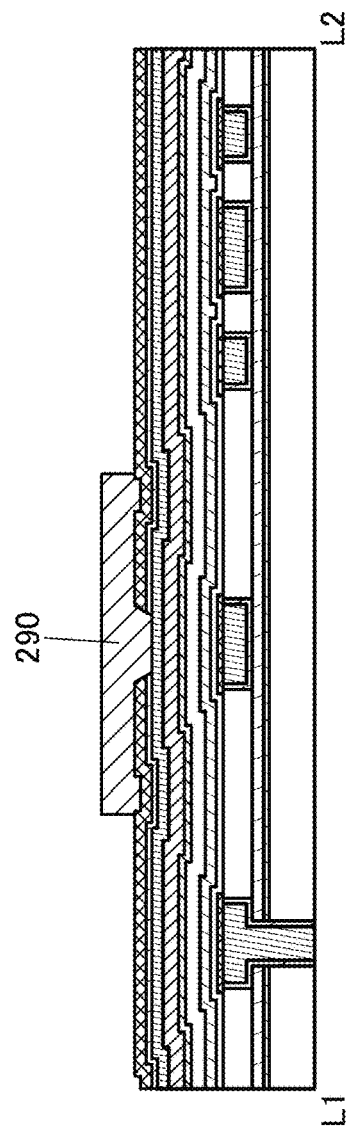

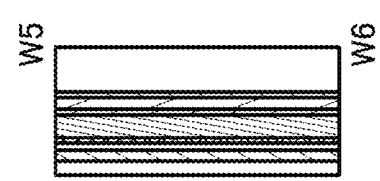
FIG. 11D
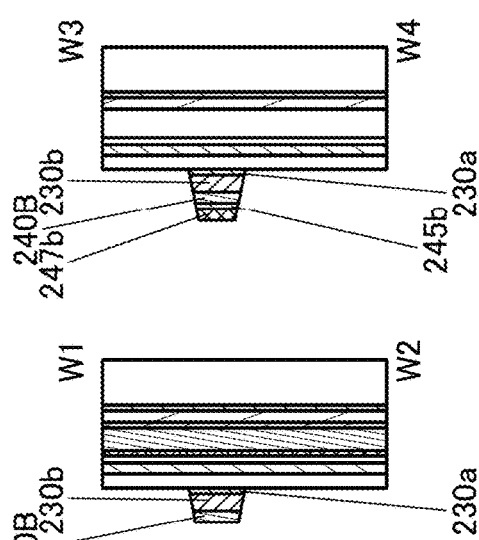
FIG. 11E
FIG. 11C
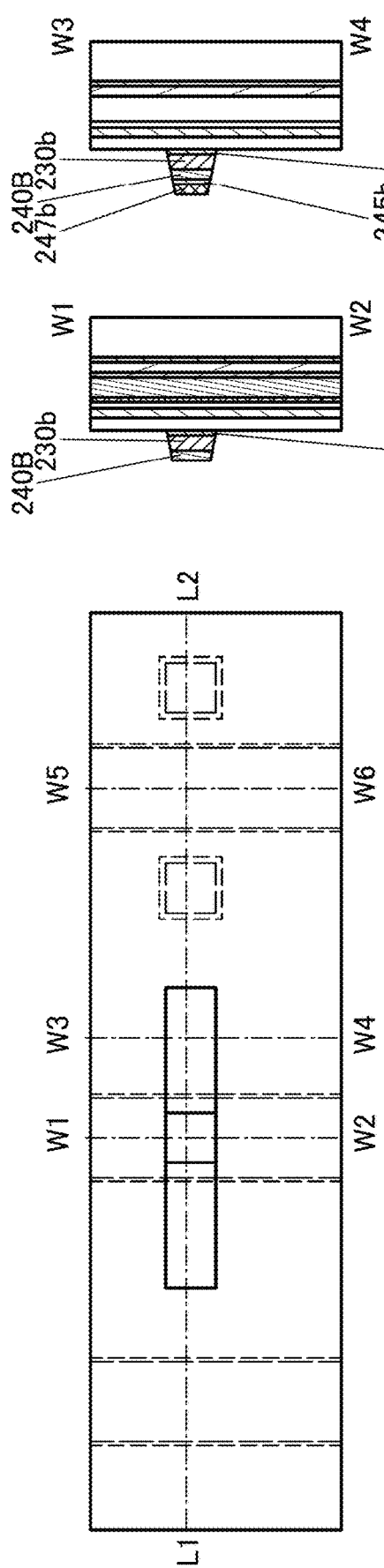
FIG. 11A
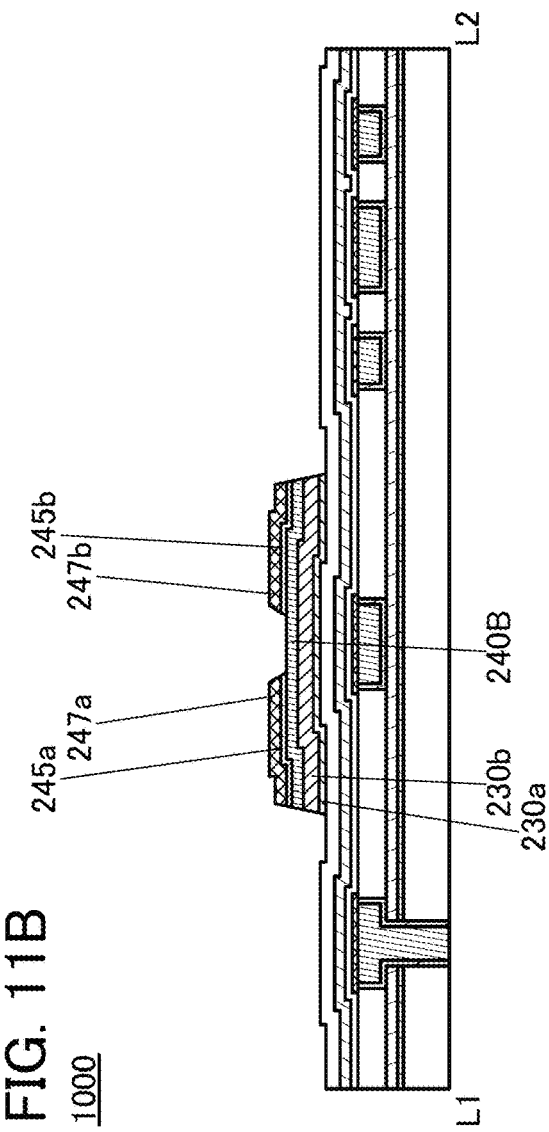
FIG. 11B

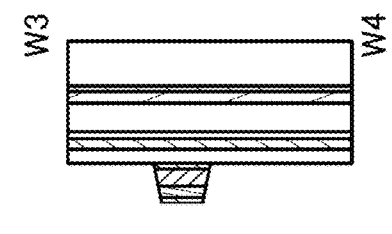
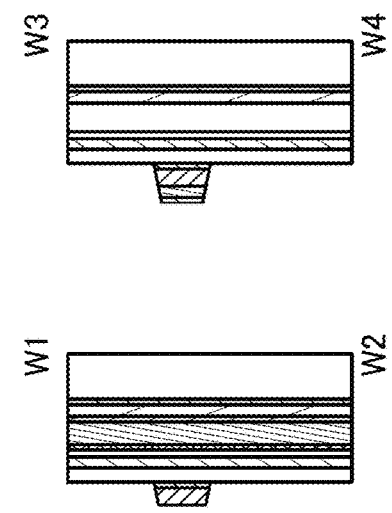
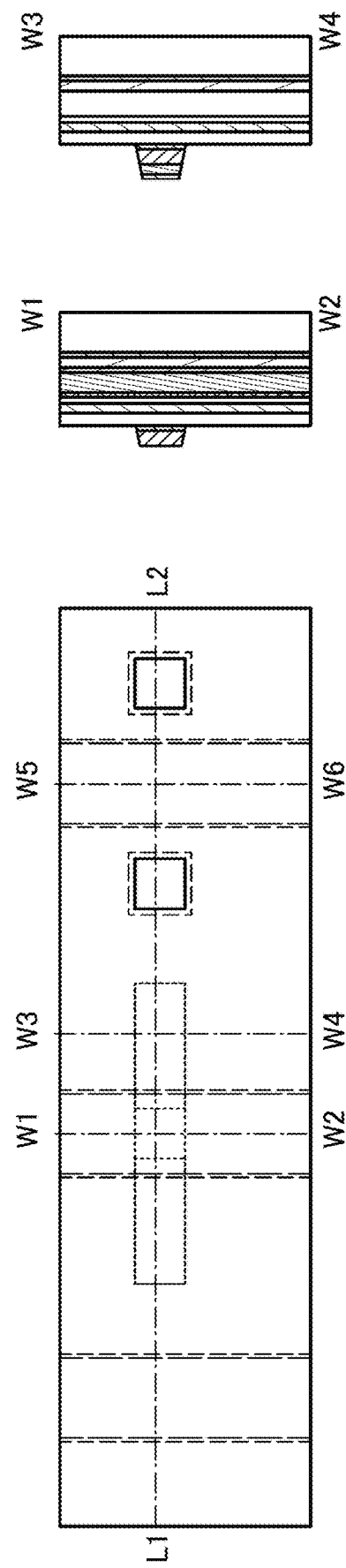
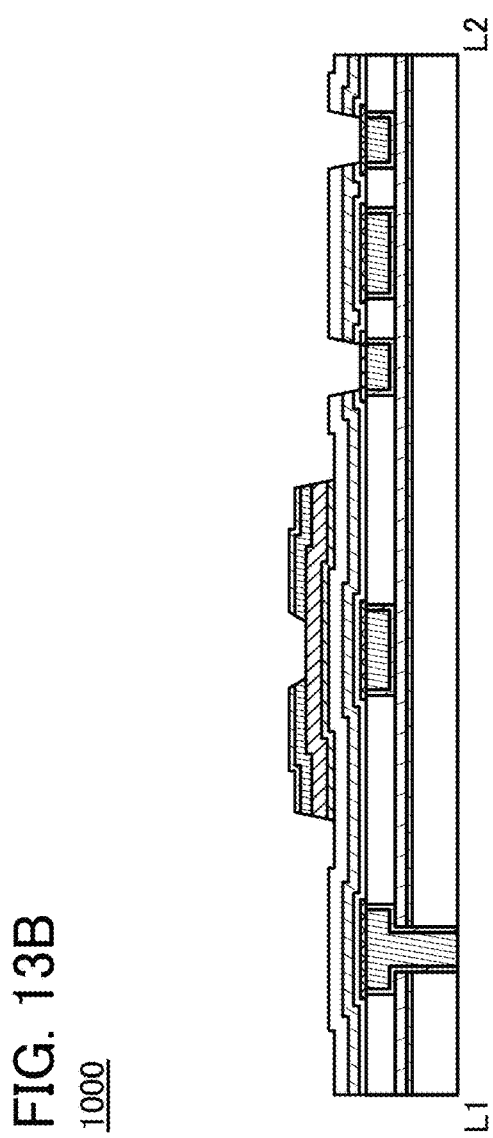

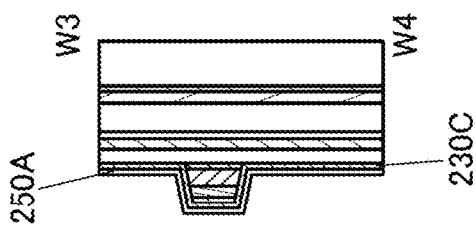
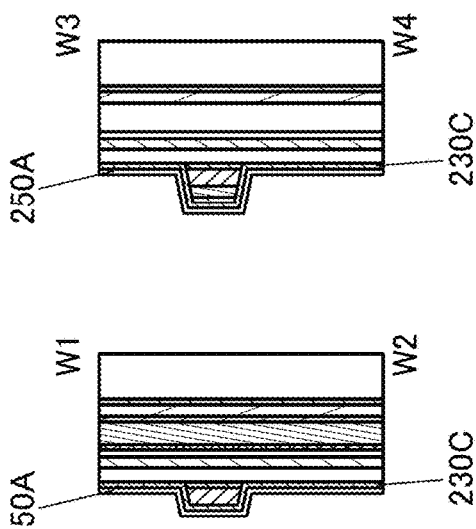
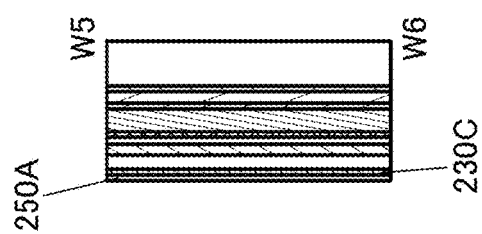
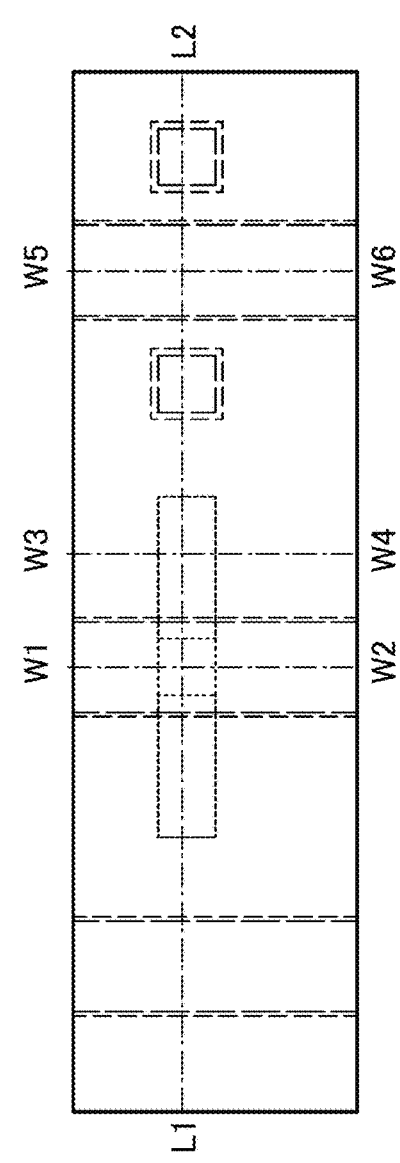
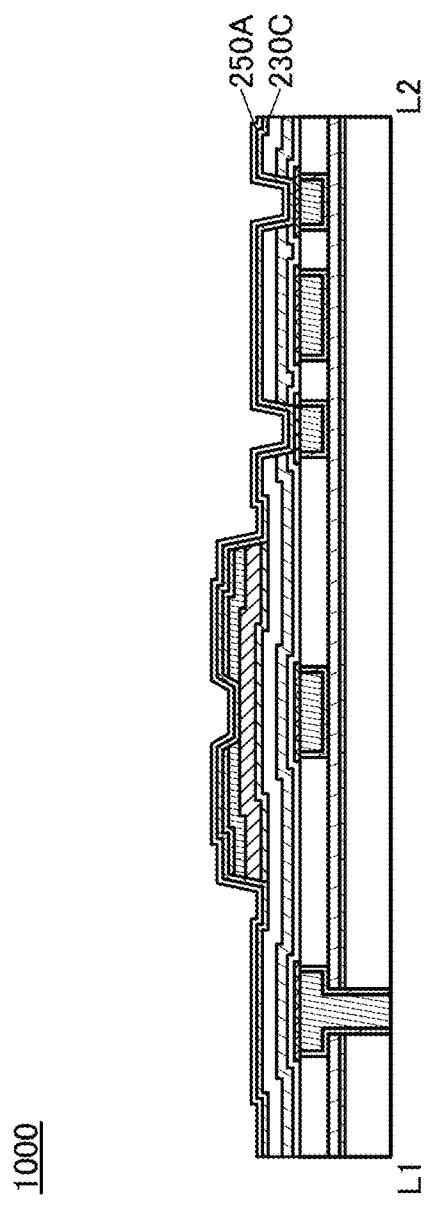

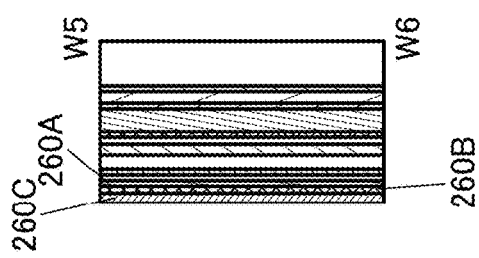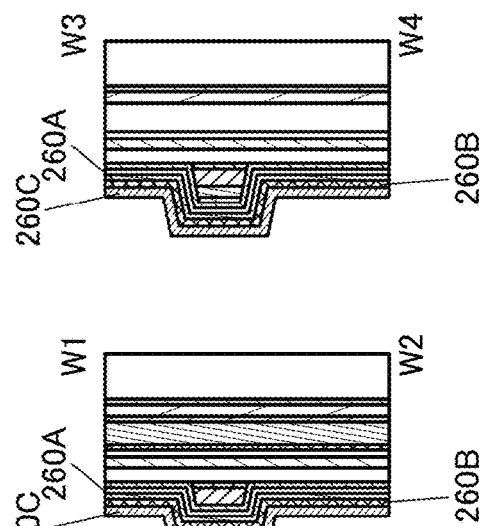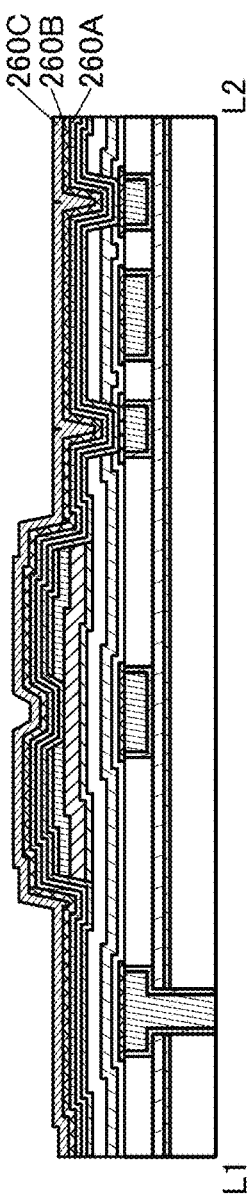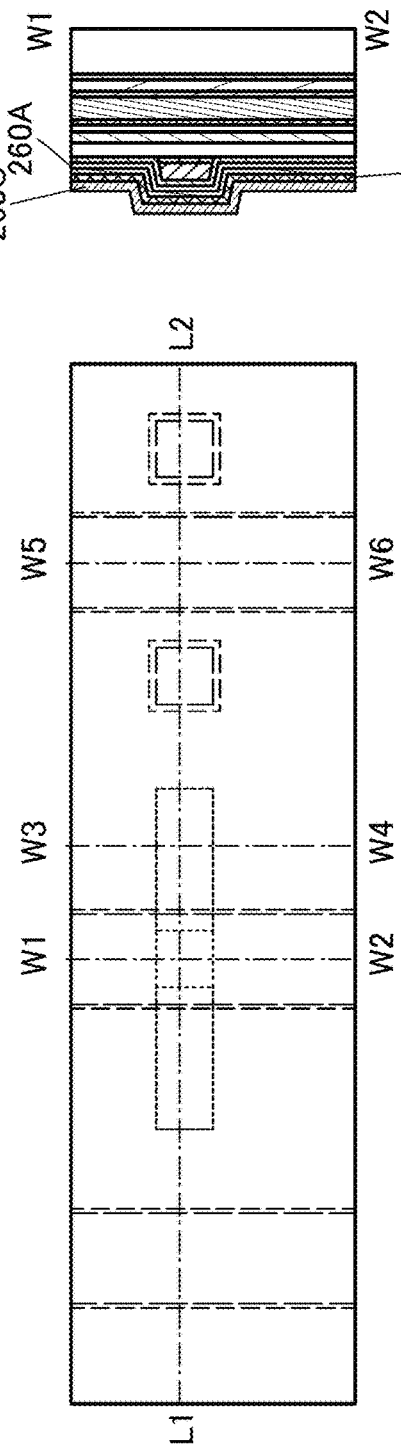

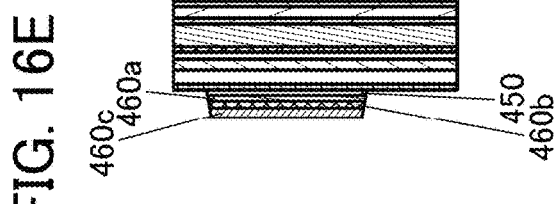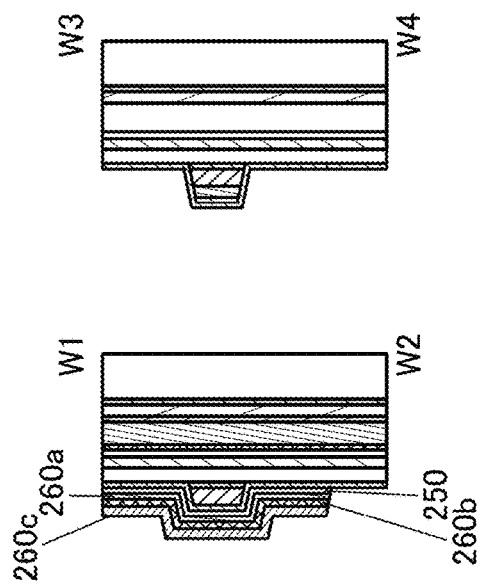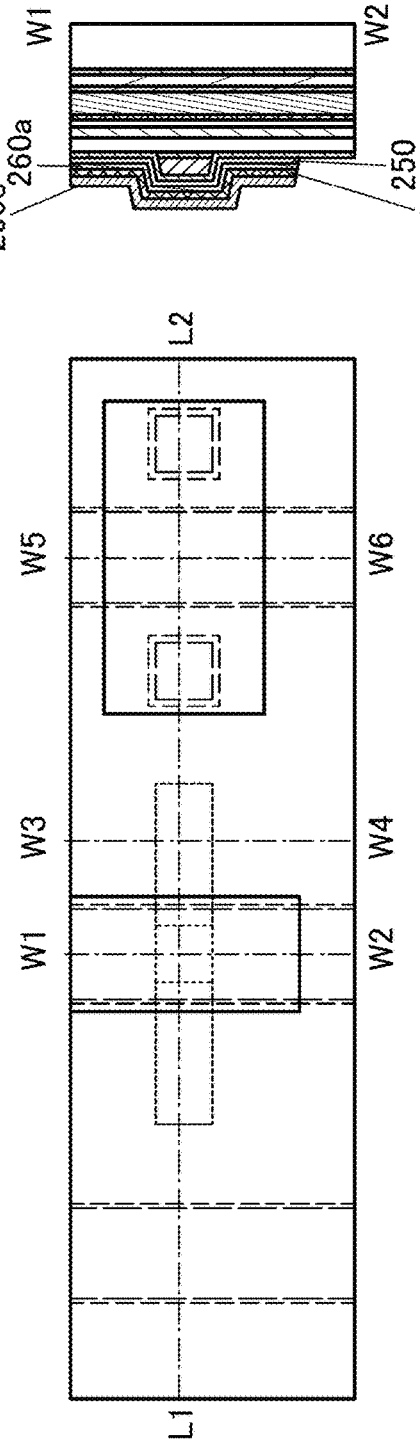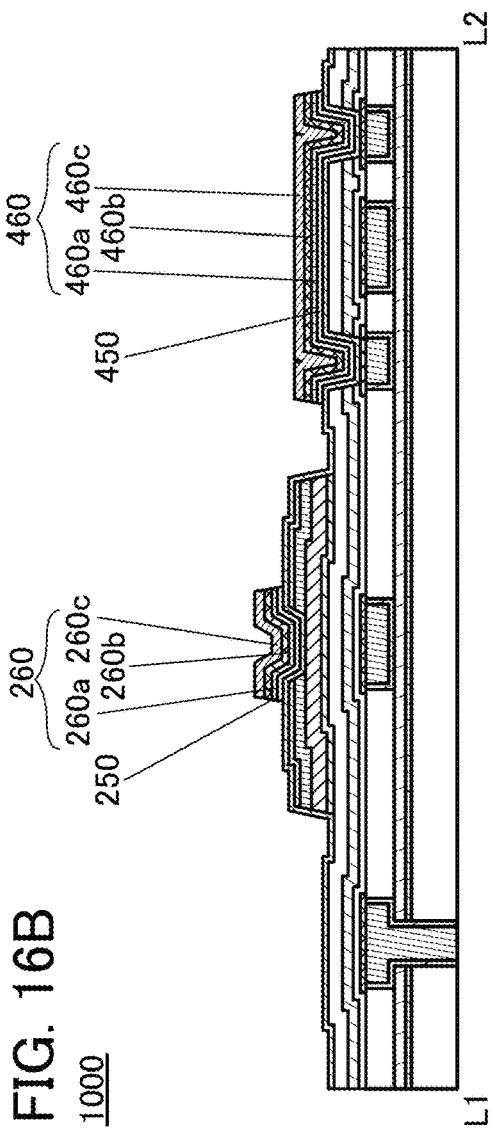

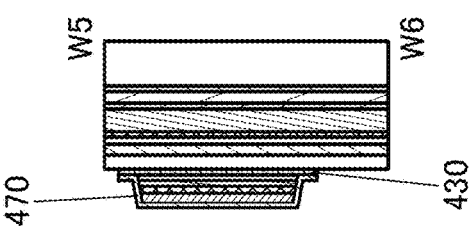
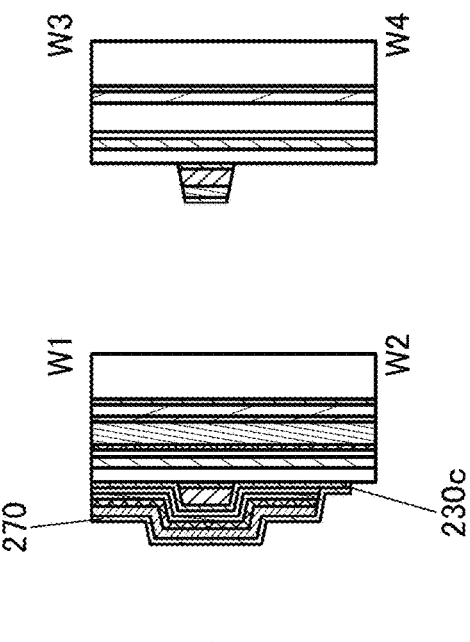
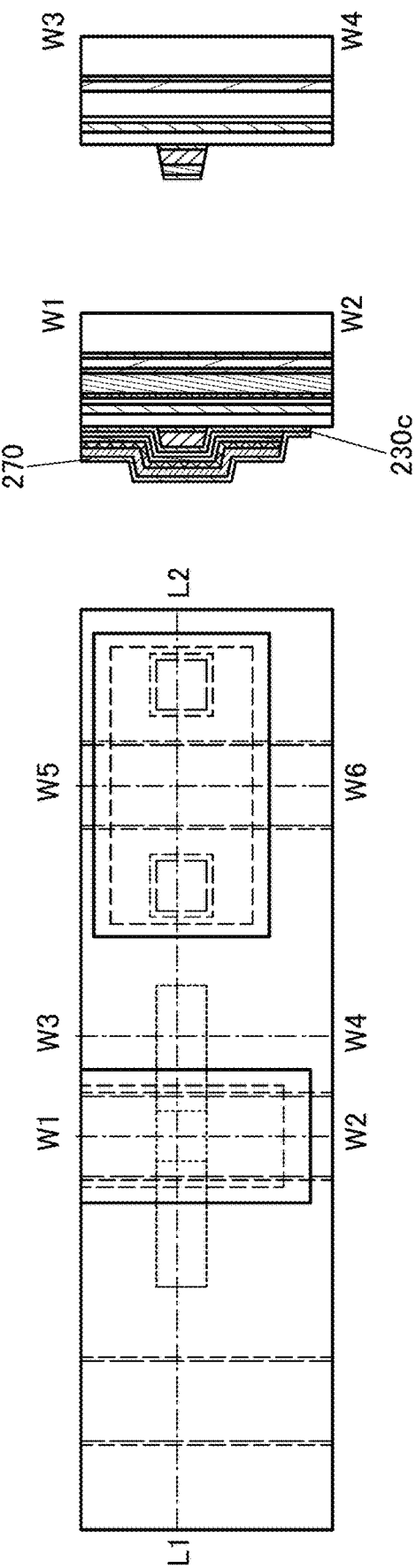
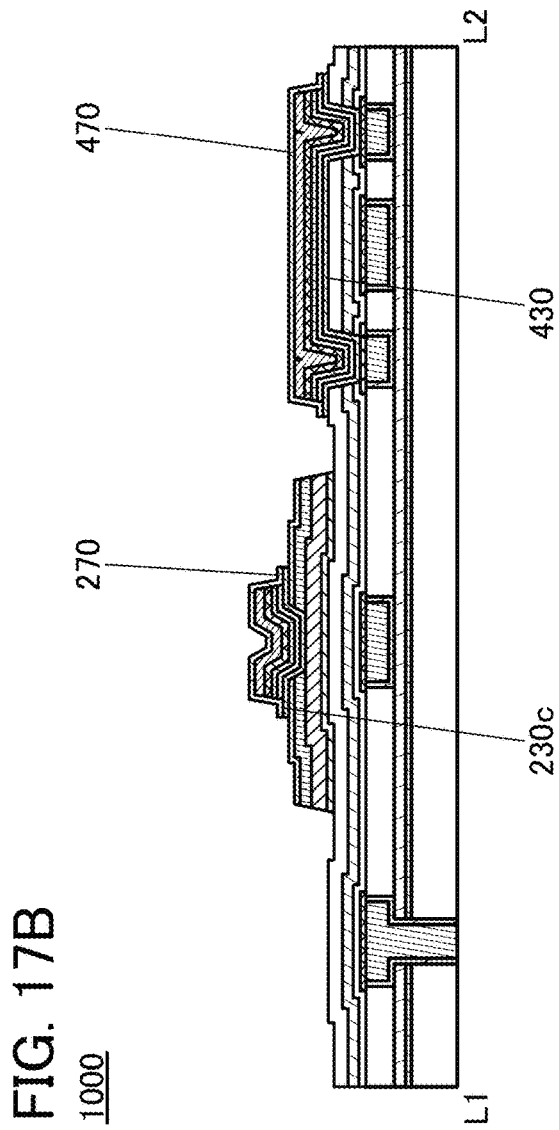

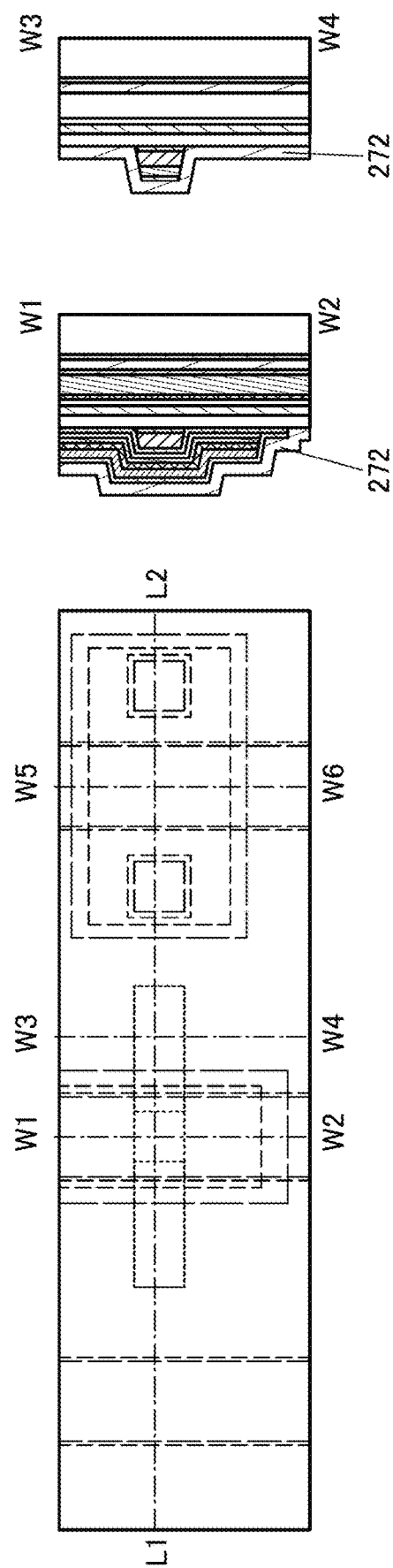
FIG. 18A
FIG. 18B
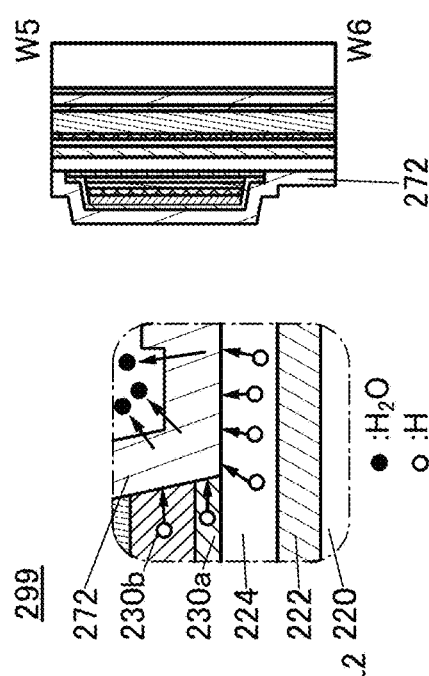
FIG. 18C
FIG. 18D
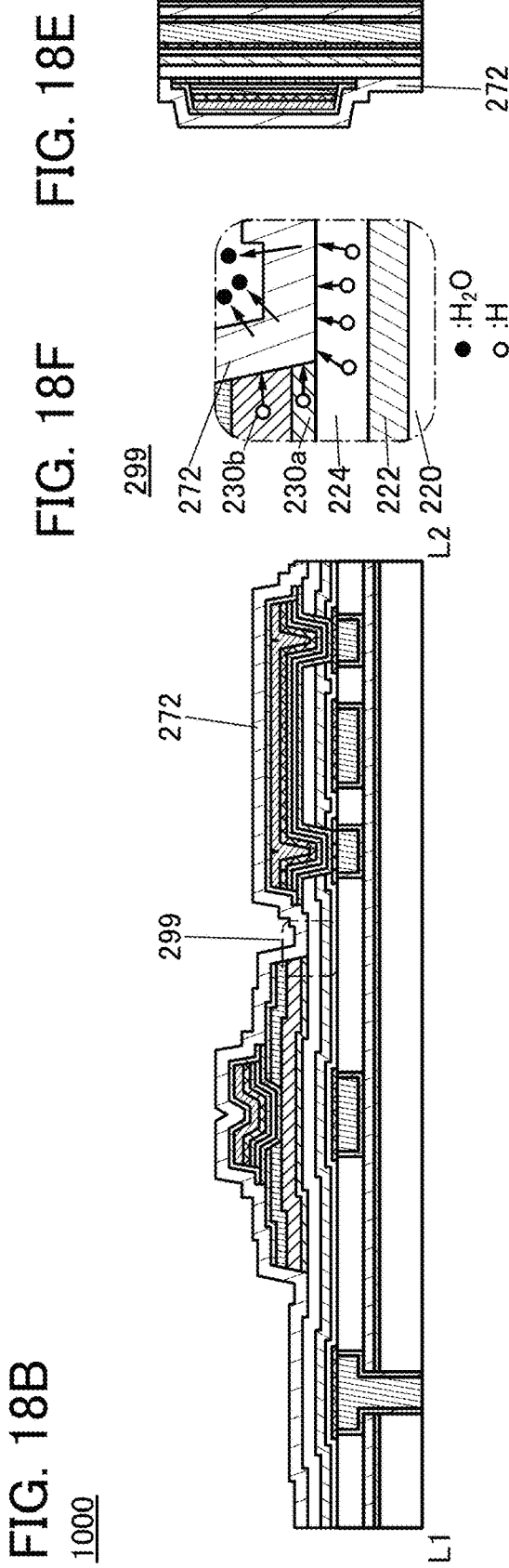
FIG. 18E
FIG. 18F

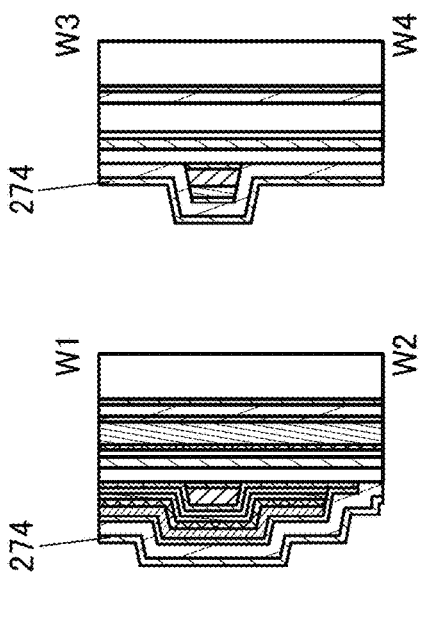
FIG. 19C
FIG. 19D
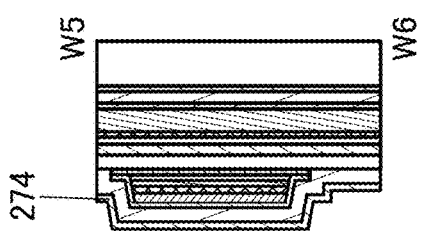
FIG. 19E
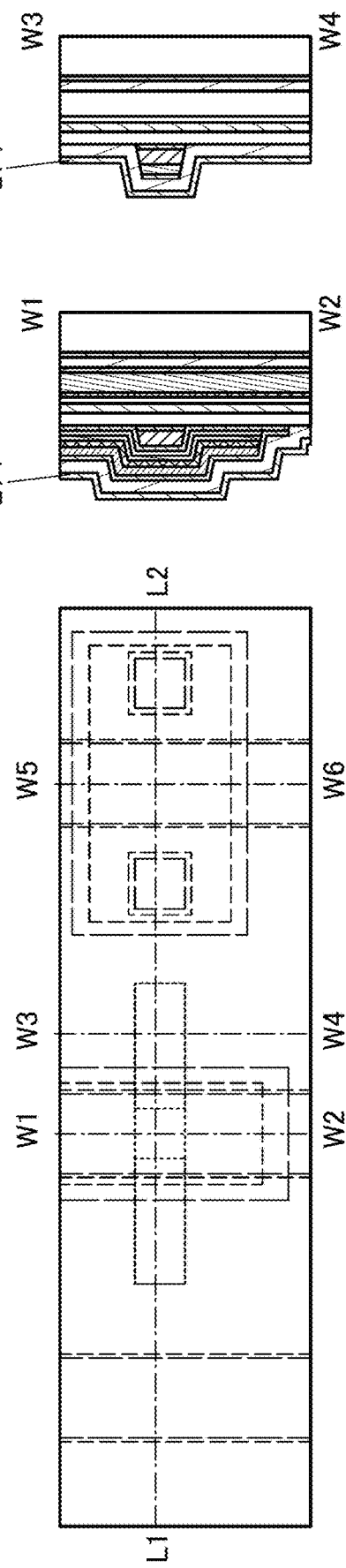
FIG. 19A
FIG. 19B

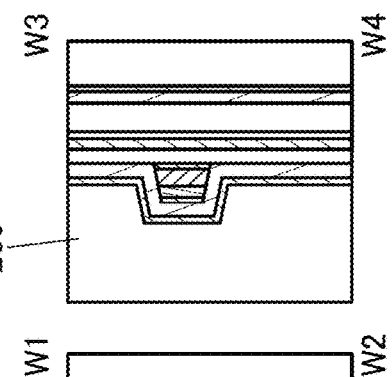
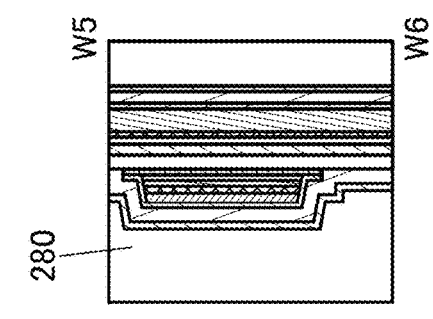
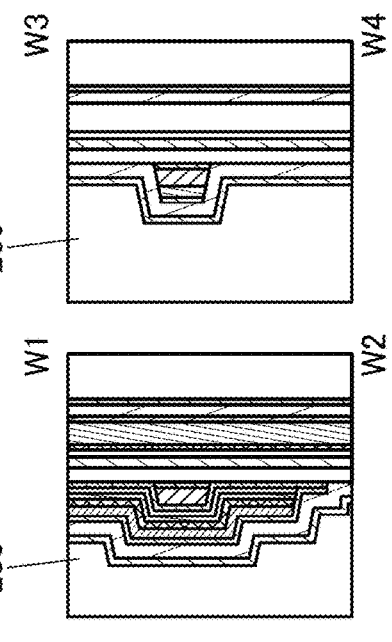
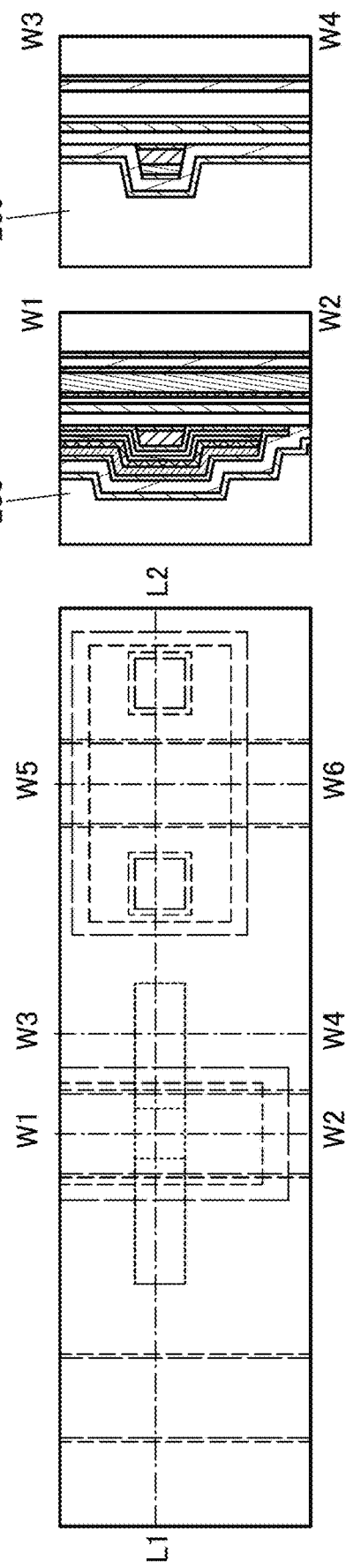
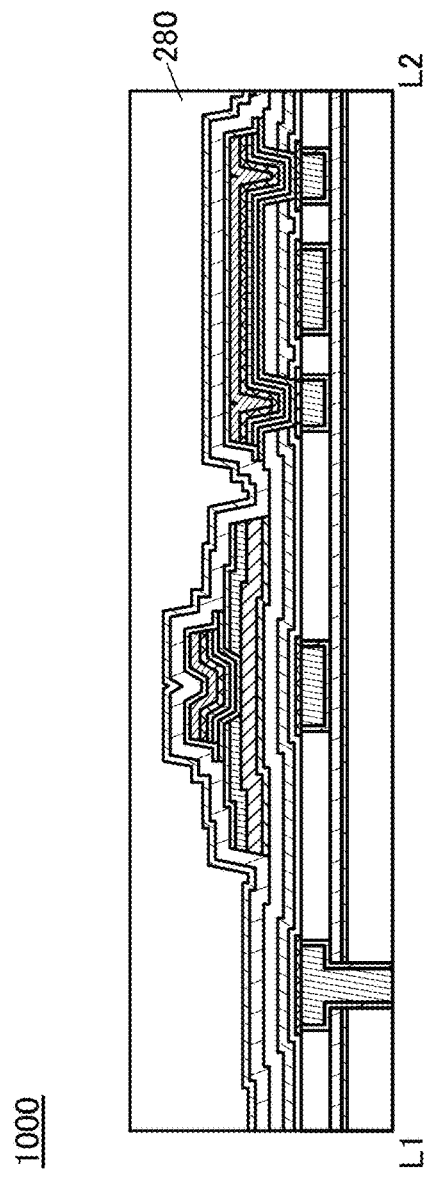

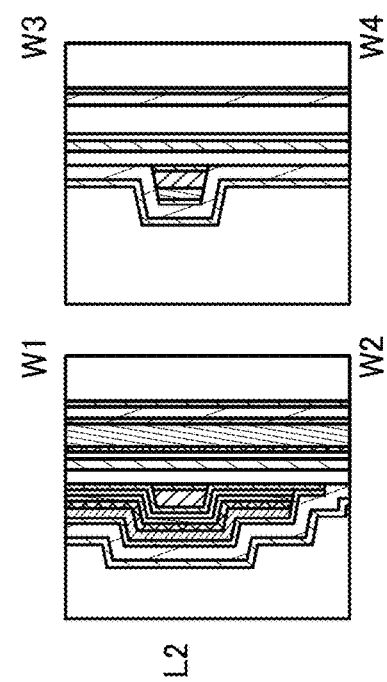
FIG. 21C
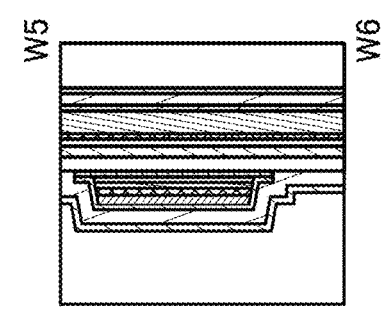
FIG. 21D
FIG. 21E
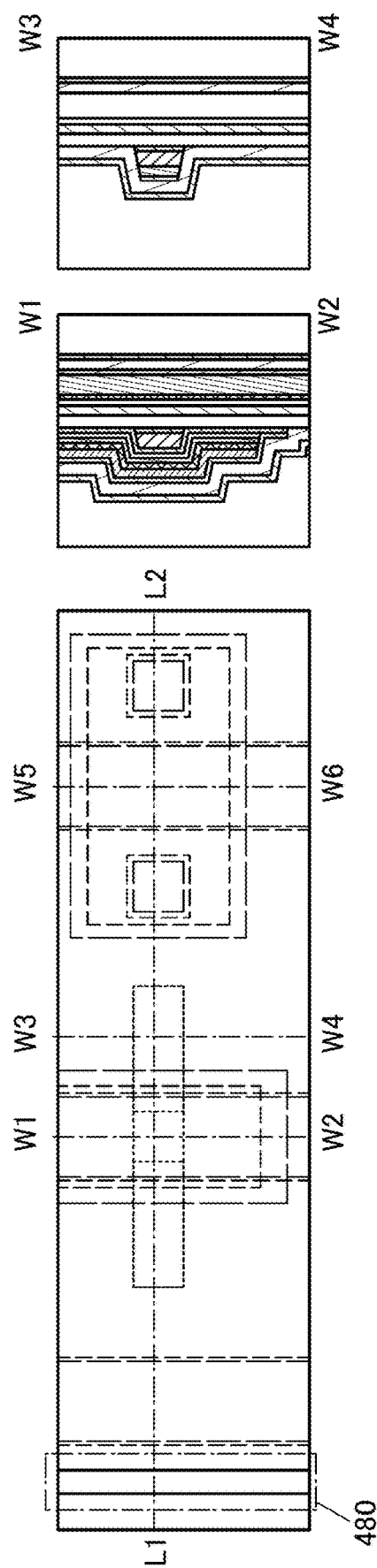
FIG. 21A
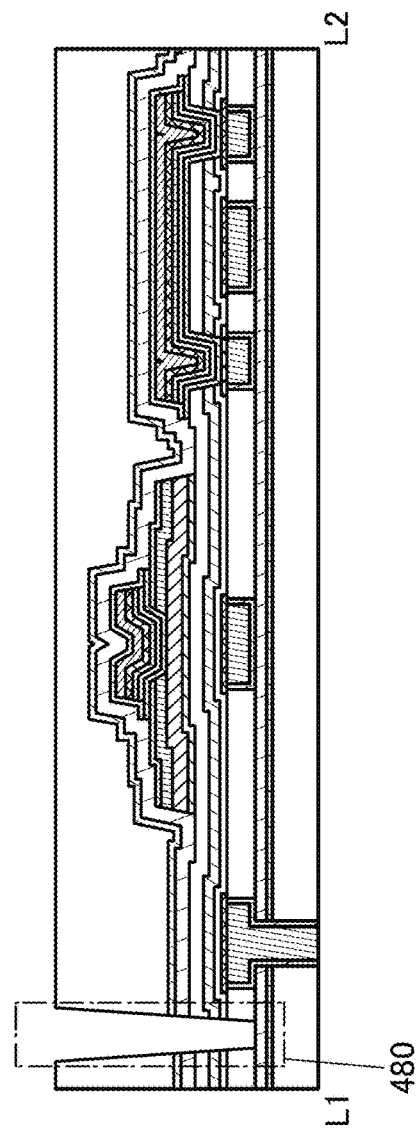
FIG. 21B

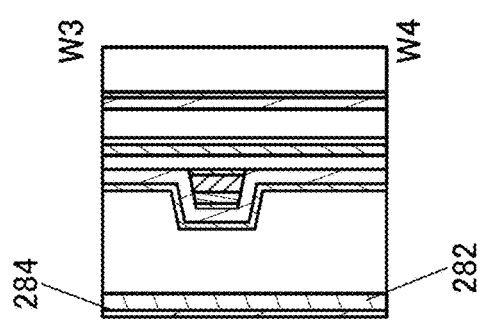
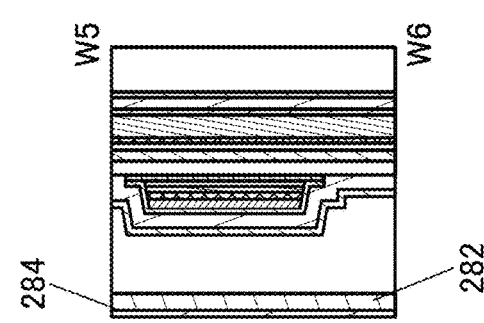
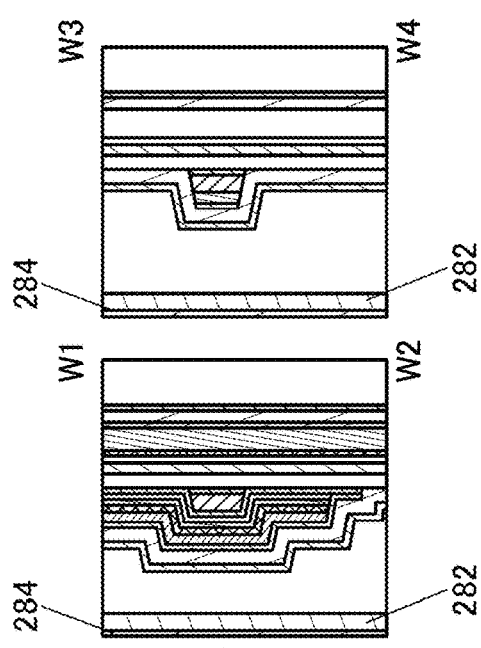
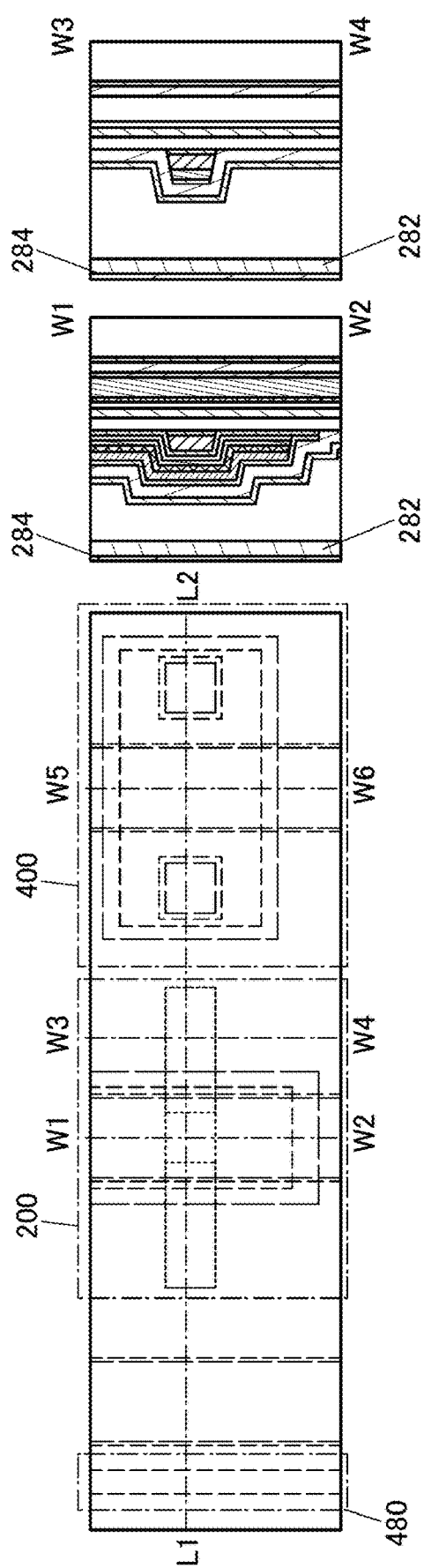
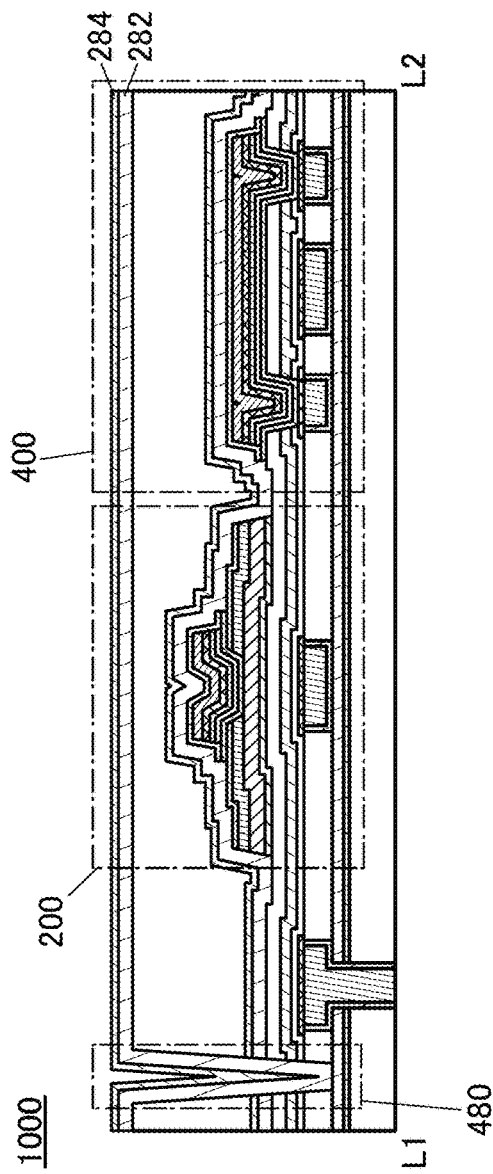

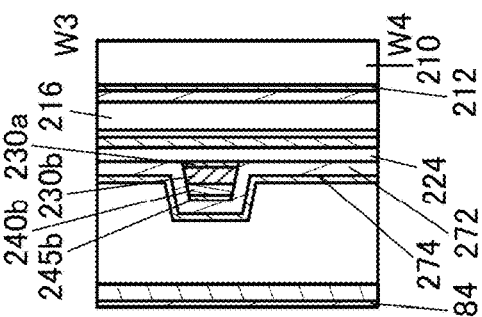
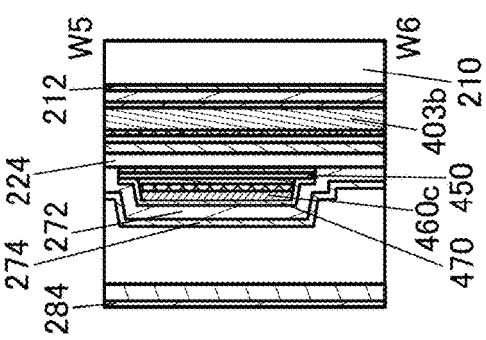
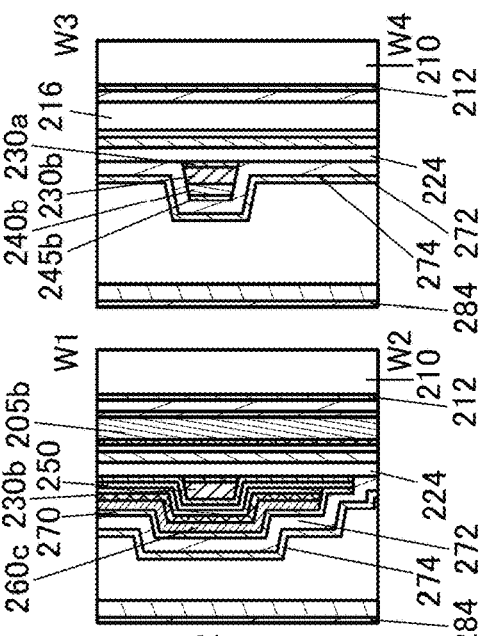
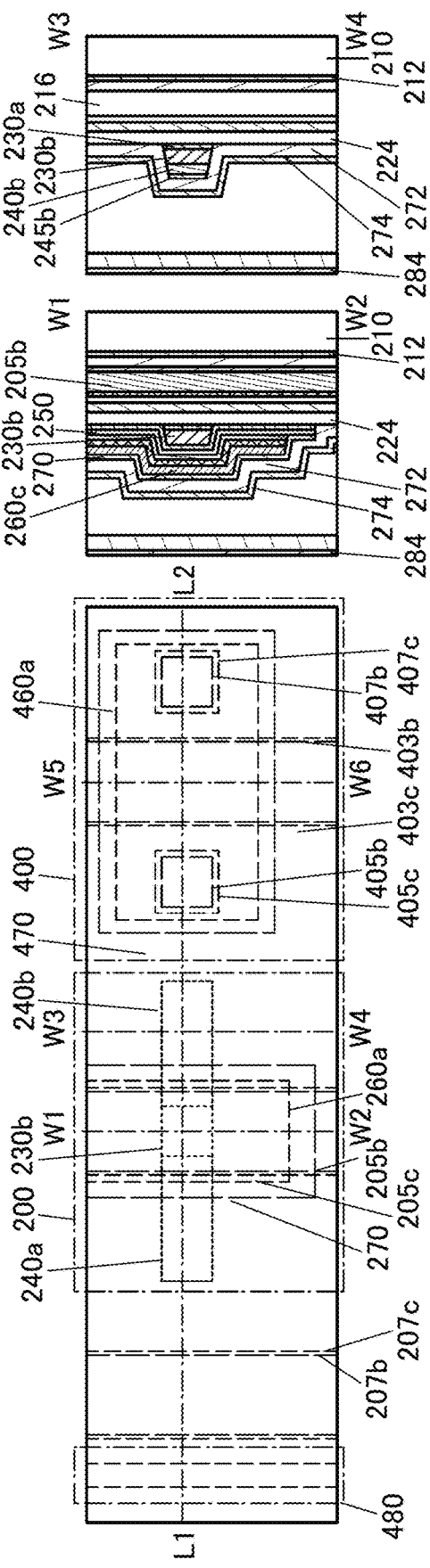
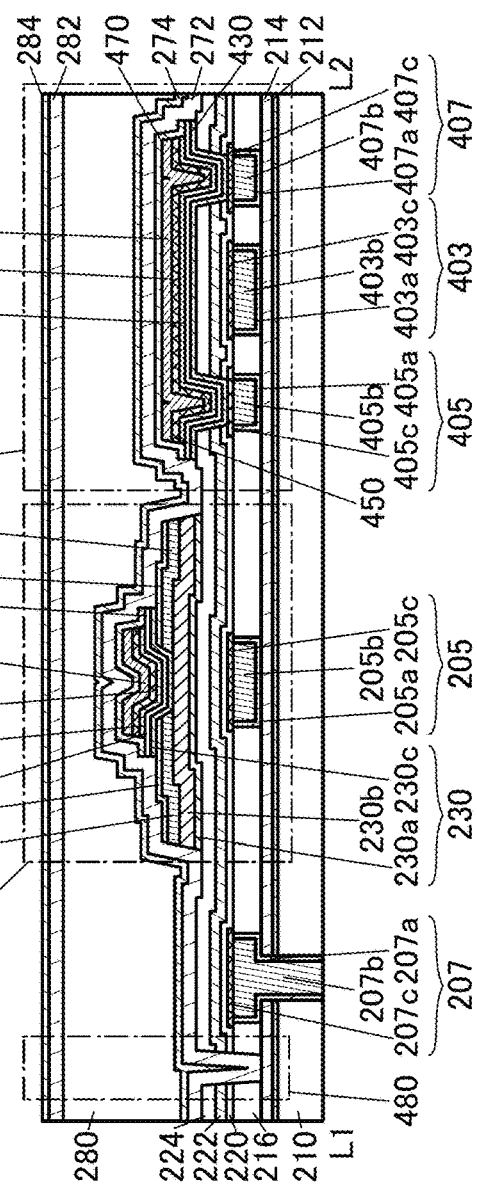

Sample A

S3  In:Ga:Zn = 1:1:1
with SP-AlOx \ ALD-AlOx

Sample B

S3  In:Ga:Zn = 1:3:2
with SP-AlOx \ ALD-AlOx

Sample C

S3  In:Ga:Zn = 1:3:2
without SP-AlOx \ ALD-AlOx

Sample A

S3  In:Ga:Zn = 1:1:1
with SP-AlOx \ ALD-AlOx

Sample B

S3  In:Ga:Zn = 1:3:2
with SP-AlOx \ ALD-AlOx

Sample C

S3  In:Ga:Zn = 1:3:2
without SP-AlOx \ ALD-AlOx

Sample A

S3  In:Ga:Zn = 1:1:1
with SP-AlOx \ ALD-AlOx

Sample B

S3  In:Ga:Zn = 1:3:2
with SP-AlOx \ ALD-AlOx

Sample C

S3  In:Ga:Zn = 1:3:2
without SP-AlOx \ ALD-AlOx

SEMICONDUCTOR DEVICE AND MANUFACTURING METHOD THEREOF

TECHNICAL FIELD

One embodiment of the present invention relates to a semiconductor device and a manufacturing method thereof.

Note that one embodiment of the present invention is not limited to the above technical field. One embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device (e.g., a liquid crystal display device or a light-emitting display device), a projection device, a lighting device, an electro-optical device, a power storage device, a memory device, a semiconductor circuit, an imaging device, an electronic device, and the like may include a semiconductor device.

BACKGROUND ART

A technique in which a transistor is formed using a semiconductor thin film has been attracting attention. Such a transistor is applied to a wide range of electronic devices such as an integrated circuit (IC) and an image display device (also simply referred to as a display device). A silicon-based semiconductor material is widely known as a material for a semiconductor thin film applicable to a transistor. As another material, an oxide semiconductor has been attracting attention.

For example, a technique in which a display device is formed using a transistor including an oxide semiconductor (a zinc oxide or an In—Ga—Zn-based oxide) as an active layer is disclosed (see Patent Documents 1 and 2).

Moreover, in recent years, a technique in which an integrated circuit of a memory device is formed using a transistor including an oxide semiconductor has been disclosed (see Patent Document 3). In addition, not only the memory device but also an arithmetic device or other devices have been formed using a transistor including an oxide semiconductor.

However, it is known that a transistor including an oxide semiconductor as an active layer has a problem in that the electrical characteristics are easily changed by impurities and oxygen vacancies in the oxide semiconductor and thus the reliability is low. For example, the threshold voltage of the transistor is changed in some cases after a bias temperature stress test (BT test).

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2011-119674

DISCLOSURE OF INVENTION

An object of one embodiment of the present invention is to provide a semiconductor device having favorable reliability. Another object of one embodiment of the present invention is to provide a semiconductor device including an oxide semiconductor in which the concentration of impurities is reduced. Another object of one embodiment of the present invention is to provide a semiconductor device including an oxide semiconductor in which oxygen vacancies are reduced.

Another object of one embodiment of the present invention is to provide a semiconductor device having favorable electrical characteristics. Another object of one embodiment of the present invention is to provide a semiconductor device with low power consumption. Another object of one embodiment of the present invention is to provide a semiconductor device that can be miniaturized or highly integrated. Another object of one embodiment of the present invention is to provide a semiconductor device that can be manufactured with high producibility.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention achieves reduction of oxygen vacancies in an oxide semiconductor by supplying excess oxygen to the oxide semiconductor from an oxide insulator in the vicinity of the oxide semiconductor.

Moreover, the embodiment of the present invention achieves dehydration and dehydrogenation by heat treatment or the like to prevent impurities such as water or hydrogen from entering an oxide semiconductor from the oxide insulator or the like in the vicinity of the oxide semiconductor. Furthermore, an insulator having a barrier property against impurities such as water or hydrogen is formed to cover the oxide insulator and the oxide semiconductor so that impurities such as water or hydrogen are prevented from entering the dehydrated and dehydrogenated oxide insulator or the like from the outside.

Furthermore, the insulator having a barrier property against impurities such as water or hydrogen is made less likely to transmit oxygen. Accordingly, oxygen is prevented from diffusing outward and effectively supplied to the oxide semiconductor and the oxide insulator in the vicinity thereof.

In such a manner, the concentration of impurities such as water or hydrogen contained in the oxide semiconductor and the oxide insulator in the vicinity thereof is reduced and oxygen vacancies in the oxide semiconductor are reduced.

(1) One embodiment of the present invention is a semiconductor device including a first insulator, a second insulator provided over the first insulator, a first conductor provided over the second insulator, a third insulator provided over the first conductor, an oxide semiconductor provided over the third insulator, a second conductor and a third conductor provided over the oxide semiconductor with a space therebetween, a fourth insulator provided over the oxide semiconductor, the second conductor, and the third conductor, a fourth conductor provided over the fourth insulator so that at least part of the fourth conductor overlaps with a region between the second conductor and the third conductor, a fifth insulator covering the oxide semiconductor, the second to fourth conductors so as to be in contact with a side surface of the oxide semiconductor and a top surface of the third insulator, and the fourth insulator and a sixth insulator provided over the fifth insulator. The first, second, fifth, and sixth insulators are less likely to transmit hydrogen, water, and oxygen than the third and fourth insulators. The first insulator and the sixth insulator have a thickness smaller than the second insulator and the fifth insulator, respectively.

(2) One embodiment of the present invention is a semiconductor device including a first insulator, a second insulator provided over the first insulator, a first conductor provided over the second insulator, a third insulator provided over the first conductor, a first oxide provided over the third insulator, a second oxide provided over the first oxide, a second conductor and a third conductor provided over the second oxide with a space therebetween, a third oxide provided over the second oxide, the second conductor, and the third conductor and in contact with a top surface of the second oxide, a side surface of the second oxide, a side surface of the first oxide, and a top surface of the third insulator, a fourth insulator provided over the third oxide, a fourth conductor provided over the fourth insulator so that at least part of the fourth conductor overlaps with a region between the second conductor and the third conductor, a fifth insulator provided in contact with the side surface of the second oxide and the top surface of the third insulator so as to cover the first to third oxides, the second to fourth conductors, and the fourth insulator, and a sixth insulator provided over the fifth insulator. The first, second, fifth, and sixth insulators are less likely to transmit hydrogen, water, and oxygen than the third and fourth insulators. The first insulator and the sixth insulator have a thickness smaller than the second insulator and the fifth insulator, respectively.

In the embodiment (2), the semiconductor device preferably further includes a seventh insulator provided in contact with a top surface of the fourth conductor. The seventh insulator is preferably less likely to transmit oxygen than the third and fourth insulators. Moreover, an end portion of the third oxide and an end portion of the seventh insulator may be substantially aligned. Furthermore, the end portion of the third oxide, an end portion of the fourth oxide, and the end portion of the seventh insulator may be substantially aligned.

The semiconductor device of the embodiment (2) further includes an eighth insulator provided over the sixth insulator, a ninth insulator provided over the eighth insulator, and a tenth insulator provided over the ninth insulator. The third, fifth, sixth, and eighth insulators have an opening reaching the second insulator and the ninth insulator is in contact with a top surface of the second insulator through the opening. The opening is provided so as to surround an external side of the second oxide. The ninth insulator and the tenth insulator are less likely to transmit hydrogen, water, and oxygen than the eighth insulator. The tenth insulator has a thinner thickness than the ninth insulator.

In the embodiment (2), the first to third oxides preferably contain In, M (M is Al, Ga, Y, or Sn), and Zn. Moreover, the third and fourth insulators preferably contain oxygen and silicon. Furthermore, the first, second, fifth, and sixth insulators preferably contain oxygen and aluminum.

(3) One embodiment of the present invention is a manufacturing method of a semiconductor device including the following steps: forming a first insulator, a second insulator over the first insulator, a first conductor over the second insulator, a third insulator over the first conductor, a first oxide over the third insulator, a second oxide over the first oxide, a second conductor and a third conductor over the second oxide with a space therebetween, a third oxide over the second oxide, the second conductor, and the third conductor and in contact with a top surface of the second oxide, a side surface of the second oxide, a side surface of the first oxide, and a top surface of the third insulator, a fourth insulator over the third oxide, a fourth conductor over the fourth insulator so that at least part of the fourth conductor overlaps with a region between the second conductor and the third conductor, a fifth insulator over the fourth conductor and the third oxide, and a fourth oxide by wet etching of the third oxide using the fifth insulator as a mask; performing first heat treatment in a first chamber of a deposition apparatus comprising a plurality of chambers; forming a sixth insulator by a sputtering method while heating a substrate in a second chamber of the deposition apparatus; performing second heat treatment under a nitrogen atmosphere; and forming a seventh insulator over the sixth insulator by an atomic layer deposition method.

In the embodiment (3), it is preferable that part of the third oxide be removed in forming the fifth insulator and a residue of the third oxide remaining on the side surface of the second oxide be removed by the wet etching. Moreover, the first heat treatment is preferably performed under an oxygen atmosphere. Furthermore, it is preferable that an eighth insulator be formed over the seventh insulator, an opening be formed in the third, sixth, and seventh insulators to reach the second insulator, third heat treatment be performed in the first chamber of the deposition apparatus including the plurality of chambers, a ninth insulator be formed by a sputtering method while the substrate is being heated in the second chamber of the deposition apparatus, fourth heat treatment be performed under a nitrogen atmosphere, and a tenth insulator be formed over the ninth insulator by an atomic layer deposition method.

According to one embodiment of the present invention, a semiconductor device having favorable reliability can be provided. Alternatively, according to one embodiment of the present invention, a semiconductor device including an oxide semiconductor in which the concentration of impurities can be reduced can be provided. Alternatively, according to one embodiment of the present invention, a semiconductor device including an oxide semiconductor in which oxygen vacancies are reduced can be provided.

Alternatively, according to one embodiment of the present invention, a semiconductor device having favorable electrical characteristics can be provided. Alternatively, according to one embodiment of the present invention, a semiconductor device with low power consumption can be provided. Alternatively, according to one embodiment of the present invention, a semiconductor device that can be miniaturized or highly integrated can be provided. Alternatively, according to one embodiment of the present invention, a semiconductor device that can be manufactured with high producibility can be provided.

Note that the descriptions of these effects do not disturb the existence of other effects. In one embodiment of the present invention, there is no need to have all the effects. Other effects will be apparent from and can be derived from the description of the specification, the drawings, the claims, and the like.

BRIEF DESCRIPTION OF THE DRAWINGS

In the accompanying drawings:

FIGS. 1A to 1E are a top view and cross-sectional views of a semiconductor device of one embodiment of the present invention;

FIGS. 4A to 4E illustrate a method for manufacturing a transistor of one embodiment of the present invention;

FIGS. 5A to 5E illustrate a method for manufacturing a transistor of one embodiment of the present invention;

FIGS. 6A to 6E illustrate a method for manufacturing a transistor of one embodiment of the present invention;

FIGS. 7A to 7E illustrate a method for manufacturing a transistor of one embodiment of the present invention;

FIGS. 8A to 8E illustrate a method for manufacturing a transistor of one embodiment of the present invention;

FIGS. 9A to 9E illustrate a method for manufacturing a transistor of one embodiment of the present invention;

FIGS. 10A to 10E illustrate a method for manufacturing a transistor of one embodiment of the present invention;

FIGS. 11A to 11E illustrate a method for manufacturing a transistor of one embodiment of the present invention;

FIGS. 13A to 13E illustrate a method for manufacturing a transistor of one embodiment of the present invention;

FIGS. 14A to 14E illustrate a method for manufacturing a transistor of one embodiment of the present invention;

FIGS. 15A to 15E illustrate a method for manufacturing a transistor of one embodiment of the present invention;

FIGS. 16A to 16E illustrate a method for manufacturing a transistor of one embodiment of the present invention;

FIGS. 17A to 17E illustrate a method for manufacturing a transistor of one embodiment of the present invention;

FIGS. 18A to 18F illustrate a method for manufacturing a transistor of one embodiment of the present invention;

FIGS. 19A to 19E illustrate a method for manufacturing a transistor of one embodiment of the present invention;

FIGS. 20A to 20E illustrate a method for manufacturing a transistor of one embodiment of the present invention;

FIGS. 21A to 21E illustrate a method for manufacturing a transistor of one embodiment of the present invention;

FIGS. 22A to 22E illustrate a method for manufacturing a transistor of one embodiment of the present invention;

FIGS. 23A to 23E are a top view and cross-sectional views of a semiconductor device of one embodiment of the present invention;

BEST MODE FOR CARRYING OUT THE INVENTION

Figure 2:
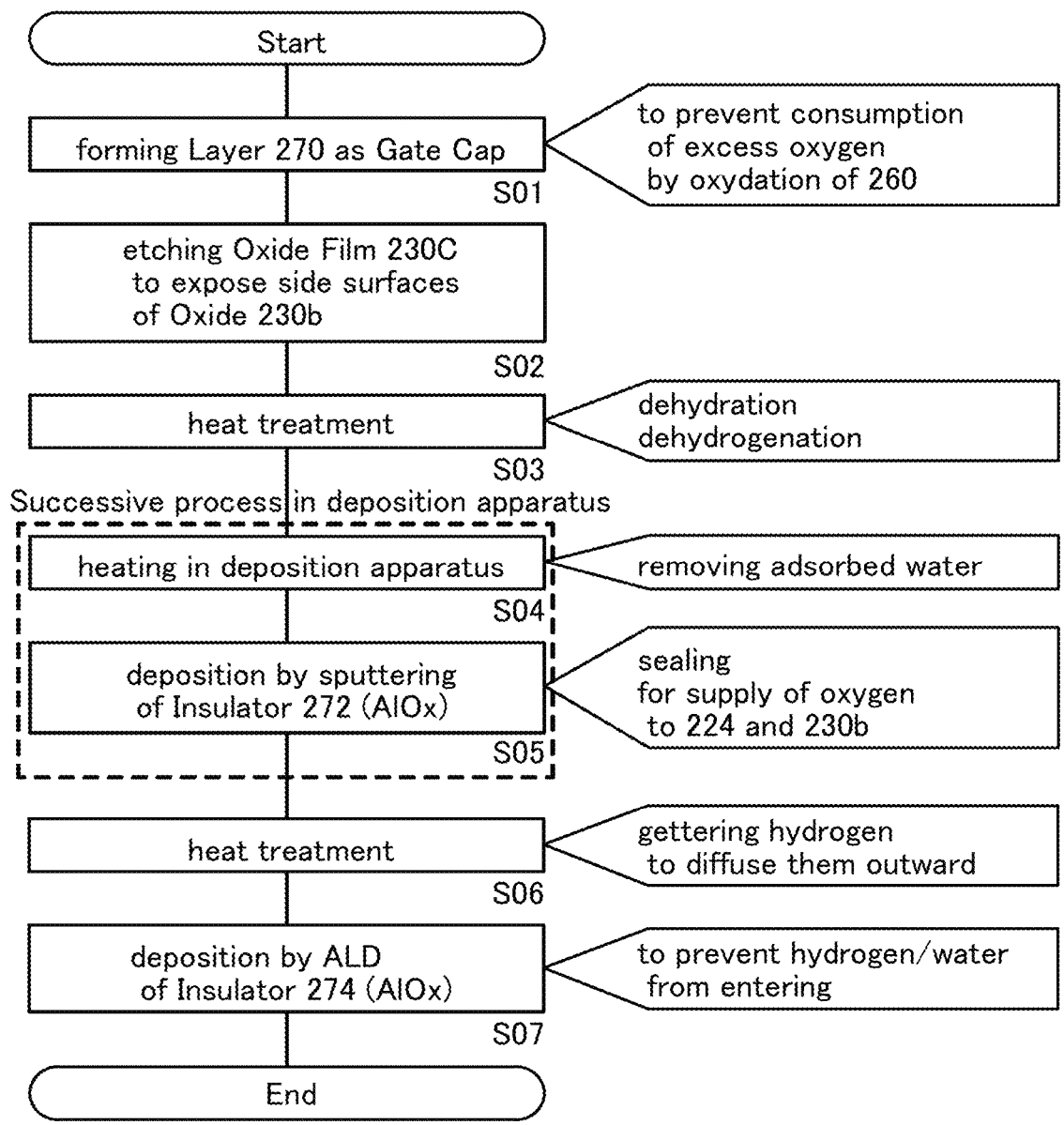
FIG. 2 is a flow chart showing a method for manufacturing a semiconductor device of one embodiment of the present invention.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated in some cases.

The position, size, range, and the like of each component illustrated in the drawings and the like are not accurately represented in some cases to facilitate understanding of the invention. Therefore, the disclosed invention is not necessarily limited to the position, size, range, and the like disclosed in the drawings and the like. For example, in the actual manufacturing process, a layer, a resist mask, or the like might be unintentionally reduced in size by treatment such as etching, which is not illustrated in some cases for easy understanding.

Especially in a top view (also referred to as a "plan view"), a perspective view, or the like, some components might not be illustrated for easy understanding of the invention. In addition, some hidden lines and the like might not be shown.

Ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. A term with an ordinal number in this specification and the like might be provided with a different ordinal number in a claim. A term with an ordinal number in this specification and the like might not be provided with an ordinal number in a claim and the like.

In addition, in this specification and the like, a term such as an "electrode" or a "wiring" does not limit the function of a component. For example, an "electrode" is used as part of a "wiring" in some cases, and vice versa. Further, the term "electrode" or "wiring" can also mean a combination of a plurality of "electrodes" and "wirings" formed in an integrated manner.

Note that the term "over" or "under" in this specification and the like does not necessarily mean that a component is placed "directly above and in contact with" or "directly below and in contact with" another component. For example, the expression "electrode B over insulating layer A" does not necessarily mean that the electrode B is on and in direct contact with the insulating layer A and can mean the case where another component is provided between the insulating layer A and the electrode B.

Furthermore, functions of a source and a drain might be switched depending on operation conditions, e.g., when a transistor having a different polarity is employed or the direction of current flow is changed in circuit operation. Therefore, it is difficult to define which is the source (or the drain). Thus, the terms "source" and "drain" can be used to denote the drain and the source, respectively, in this specification.

Note that the channel length refers to, for example, a distance between a source (source region or source electrode) and a drain (drain region or drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value, in a region where a channel is formed.

The channel width refers to, for example, the length of a portion where a source and a drain face each other in a region where a semiconductor (or a portion where a current flows in a semiconductor when a transistor is on) and a gate electrode overlap with each other or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value, in a region where a channel is formed.

Note that depending on transistor structures, a channel width in a region where a channel is actually formed (hereinafter, referred to as an "effective channel width") is different from a channel width shown in a top view of a transistor (hereinafter, referred to as an "apparent channel width") in some cases. For example, in a transistor having a gate electrode covering side surfaces of a semiconductor, an effective channel width is greater than an apparent channel width, and its influence cannot be ignored in some cases. For example, in a miniaturized transistor having a gate electrode covering side surfaces of a semiconductor, the proportion of a channel formation region formed in the side surfaces of the semiconductor is increased in some cases. In that case, an effective channel width is greater than an apparent channel width.

In such a case, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, an apparent channel width is referred to as a "surrounded channel width (SCW)" in some cases. Furthermore, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

Note that impurities in a semiconductor refer to, for example, elements other than the main components of the semiconductor. For example, an element with a concentration of lower than 0.1 atomic % can be regarded as an impurity. When an impurity is contained, the density of states (DOS) in a semiconductor may be increased, the carrier mobility may be decreased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; there are hydrogen, lithium, sodium, silicon, boron, phosphorus, carbon, and nitrogen, for example. In the case of an oxide semiconductor, water also serves as an impurity in some cases. In the case of an oxide semiconductor, oxygen vacancies may be formed by entry of impurities. In the case where the semiconductor is silicon, examples of an impurity which changes characteristics of the semiconductor include oxygen, Group 1 elements except hydrogen, Group 2 elements, Group 13 elements, and Group 15 elements.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" or "orthogonal" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification and the like, the terms "identical", "the same", "equal", "uniform", and the like (including synonyms thereof) used in describing calculation values and actual measurement values allow for a margin of error of ±20% unless otherwise specified.

In this specification and the like, in the case where an etching step (removal step) is performed after a resist mask is formed in a photolithography method, the resist mask is removed after the etching step, unless otherwise specified.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases. In addition, in this embodiment and the like, the term "insulator" can be replaced with the term "insulating film" or "insulating layer". Moreover, the term "conductor" can be replaced with the term "conductive film" or "conductive layer". Furthermore, the term "semiconductor" can be replaced with the term "semiconductor film" or "semiconductor layer". Furthermore, the term "oxide" can be replaced with the term "oxide film".

Furthermore, unless otherwise specified, a transistor described in this specification and the like is an enhancement-type (normally-off-type) field-effect transistor. Unless otherwise specified, a transistor described in this specification and the like refers to an n-channel transistor. Thus, unless otherwise specified, the threshold voltage (also referred to as "$V_{th}$") is higher than 0 V.

Embodiment 1

In this embodiment, a semiconductor device including a transistor having favorable reliability and a method for manufacturing the semiconductor device will be described with reference to FIGS. 1A to 1E through FIGS. 23A to 23E. A transistor provided in a semiconductor device of this embodiment includes an oxide semiconductor in an active layer. The reliability of the transistor provided in the semiconductor device can be improved by reducing the concentration of impurities such as water or hydrogen in the oxide semiconductor and reducing oxygen vacancies by supplying excess oxygen.

<Structure Example of Semiconductor Device 1000>

FIGS. 1A, 1B, 1C, 1D, and 1E are a top view and cross-sectional views of a semiconductor device 1000. The semiconductor device 1000 includes a transistor 200 and a transistor 400. The transistors 200 and 400 formed over a substrate (not illustrated) have different structures. For example, the transistor 400 may have a smaller drain current than the transistor 200 when a back gate voltage and a top gate voltage are each 0 V (the drain current at that time is hereinafter referred to as $I_{CUT}$). The transistor 400 is a switching element capable of controlling the potential of a back gate of the transistor 200. Therefore, a charge at a node connected to the back gate of the transistor 200 can be prevented from being lost by making the node have a desired potential and then turning off the transistor 400.

FIG. 1A is a top view of the semiconductor device 1000. FIG. 1B is a cross-sectional view of the transistor 200 and the transistor 400 in the channel length direction, which is taken along dashed-dotted line L1-L2 in FIG. 1A. FIG. 1C is a cross-sectional view of the transistor 200 in the channel width direction, which is taken along dashed-dotted line W1-W2 in FIG. 1A. FIG. 1D is a cross-sectional view of the transistor 200 in the channel width direction, which is taken along dashed-dotted line W3-W4 in FIG. 1A. FIG. 1E is a cross-sectional view of the transistor 400 in the channel width direction, which is taken along dashed-dotted line W5-W6 in FIG. 1A.

Hereinafter, the structure of each of the transistors 200 and 400 will be described with reference to FIGS. 1A to 1E. Note that detailed description of the materials of each of the transistors 200 and 400 will be made in <Materials>.

[Transistor 200]

As illustrated in FIGS. 1A to 1D, the transistor 200 includes an insulator 212 provided over an insulator 210, an insulator 214 provided over the insulator 212, a conductor 205 (a conductor 205a, a conductor 205b, and a conductor 205c) provided over the insulator 214, an insulator 220, an insulator 222, and an insulator 224 provided over the conductor 205, an oxide 230 (an oxide 230a, an oxide 230b, and an oxide 230c) provided over the insulator 224, a conductor 240 (a conductor 240a and a conductor 240b) provided over the oxide 230b, a layer 245 (a layer 245a and a layer 245b) provided over the conductor 240, an insulator 250 provided over the oxide 230c, a conductor 260 (a conductor 260a, a conductor 260b, and a conductor 260c) provided over the insulator 250, a layer 270 provided over the conductor 260c, an insulator 272 provided over the layer 270, and an insulator 274 provided over the insulator 272.

The insulators 212 and 214 are preferably formed using an insulating material which is less likely to transmit impurities such as water or hydrogen, and for example, are preferably formed using aluminum oxide or the like. Accordingly, diffusion of impurities such as water or hydrogen from a layer under the insulator 210 into a layer over the insulators 212 and 214 can be inhibited. Note that it is preferable that at least one of impurities such as a hydrogen atom, a hydrogen molecule, a water molecule, an oxygen atom, an oxygen molecule, a nitrogen atom, a nitrogen molecule, a nitrogen oxide molecule (e.g., $N_2O$, NO, and $NO_2$), and a copper atom be less likely to penetrate the insulators 212 and 214. Furthermore, hereinafter, the same applies to the description of an insulating material which is less likely to transmit impurities.

The insulator 212 is preferably formed using an atomic layer deposition (ALD) method, for example. Accordingly, the insulator 212 can have favorable coverage, and formation of cracks, pin holes, and the like in the insulator 212 can be prevented. In addition, the insulator 214 is preferably formed using a sputtering method, for example. Accordingly, the insulator 214 can be formed at a higher deposition rate than the insulator 212 and can have a large thickness with higher productivity than the insulator 212. Such a stack of the insulators 212 and 214 can have a higher barrier property against impurities such as water or hydrogen. Note that the insulator 212 may be provided under the insulator 214. Furthermore, when the insulator 214 has a sufficient barrier property against impurities, the insulator 212 is not necessarily provided.

Furthermore, for the insulators 212 and 214, an insulating material which is less likely to transmit oxygen is preferably used. With this material, oxygen contained in the insulator 224 or the like can be inhibited from diffusing into lower layers. Thus, oxygen can be supplied to the oxide 230b effectively.

An opening penetrating the insulator 210, the insulator 212, and the insulator 214 is formed. In addition, a plurality of openings are formed in an insulator 216. At least one of the openings is formed to overlap with the position of the opening formed in the insulators 210, 212, and 214. The diameter of the opening formed in the insulator 216 is larger than that of the opening formed in the insulators 210, 212, and 214. In addition, the other openings in the insulator 216 reach a top surface of the insulator 214.

The conductor 205a is formed in contact with an inner wall of the opening in the insulator 216, and the conductor 205b is formed on the inner side. In addition, the conductor 205c is provided over the conductors 205a and 205b. Here, top surfaces of the conductors 205a and 205b can be at substantially the same level as a top surface of the insulator 216.

Moreover, a conductor 207 may be provided in the same layer as the conductor 205. The conductor 207 is provided in the openings formed in the insulator 210, the insulator 212, the insulator 214, and the insulator 216. Part of the conductor 207 formed in the same layer as the insulator 216 functions as a wiring and part of the conductor 207 formed in the same layer as the insulator 210, the insulator 212, and the insulator 214 functions as a plug. As the conductor 207, a conductor 207a is formed in contact with the inner wall of the opening and a conductor 207b is formed inside the opening with the conductor 207a provided therein, and a conductor 207c is formed over the conductors 207a and 207b. Here, top surfaces of the conductors 207a and 207b can be at substantially the same level as the top surface of the insulator 216. The conductor 207 can allow a wiring, a circuit element, a semiconductor element, or the like positioned under the insulator 210 to be connected. Moreover, when a similar wiring and a similar plug are provided over the conductor 207, the conductor 207 can be connected to a wiring, a circuit element, a semiconductor element, or the like positioned in an upper layer.

The conductors 205a and 207a are preferably formed using a conductive material which is less likely to transmit impurities such as water or hydrogen, and for example, are preferably formed using tantalum, tantalum nitride, ruthenium, ruthenium oxide, or the like, and may be a single layer or a stack. Accordingly, diffusion of impurities such as water or hydrogen from a layer under the insulator 210 into an upper layer through the conductor 205a or 207a can be inhibited. Note that it is preferable that at least one of impurities such as a hydrogen atom, a hydrogen molecule, a water molecule, an oxygen atom, an oxygen molecule, a nitrogen atom, a nitrogen molecule, a nitrogen oxide molecule (e.g., $N_2O$, NO, and $NO_2$), and a copper atom be less likely to penetrate the conductors 205a and 207a. Furthermore, hereinafter, the same applies to the description of a conductive material which is less likely to transmit impurities.

The conductors 205c and 207c are preferably formed using a conductive material which is less likely to absorb oxygen. By using such a material, oxygen contained in the insulator 224 or the like can be inhibited from being absorbed by the conductor 205b or 207b.

When the conductors 205b and 207b are formed using a metal such as copper which easily diffuses into silicon oxide, diffusion of impurities such as copper into a layer over the insulator 220 can be prevented by using an insulating material such as silicon nitride or silicon nitride oxide which is less likely to transmit copper for the insulator 220. At this time, the conductors 205a and 207a are also preferably formed using a conductive material which is less likely to transmit copper so as to prevent diffusion of impurities into the outside of the conductors 205a and 207a.

The insulator 222 is preferably formed using an insulating material which is less likely to transmit oxygen and impurities such as water or hydrogen, and for example, is preferably formed using hafnium oxide or the like. Accordingly, diffusion of impurities such as water or hydrogen from a layer under the insulator 210 into a layer over the insulators 212 and 214 can be inhibited. Furthermore, oxygen contained in the insulator 224 or the like can be inhibited from diffusing into lower layers.

The insulator 224 is preferably formed using an insulator from which oxygen is released by heating. Specifically, it is preferable to use an insulator with the following characteristics: the amount of oxygen that is released from the insulator in thermal desorption spectroscopy (TDS) and converted into oxygen atoms is $1.0 \times 10^{18}$ atoms/cm$^3$ or more, preferably $3.0 \times 10^{20}$ atoms/cm$^3$ or more. Note that oxygen released by heating is also referred to as excess oxygen. When the insulator 224 formed using such an insulator is formed in contact with the oxide 230, oxygen can be supplied to the oxide 230b effectively.

Furthermore, the concentration of impurities such as water, hydrogen, or nitrogen oxide in the insulator 224 is preferably lowered. The amount of hydrogen released from the insulator 224 that is converted into hydrogen molecules per area of the insulator 224 is less than or equal to $2 \times 10^{15}$ molecules/cm$^2$, preferably less than or equal to $1 \times 10^{15}$ molecules/cm$^2$, further preferably less than or equal to $5 \times 10^{14}$ molecules/cm$^2$ in TDS analysis in the range of 50° C. to 500° C., for example.

The oxide 230a is preferably formed using an oxide formed under an oxygen atmosphere, for example. Thus, the shape of the oxide 230a can be stable. Note that the components of the oxides 230a to 230c are described in detail later.

In order to give stable electrical characteristics and favorable reliability to the transistor 200, it is preferable that the concentration of impurities and oxygen vacancies in the oxide be reduced so that the oxide 230b is highly purified and intrinsic or substantially highly purified and intrinsic. The highly purified and intrinsic or substantially highly purified and intrinsic oxide has a low density of defect states and accordingly has a low density of trap states in some cases.

Charge trapped by the trap states in the oxide takes a long time to be released and may behave like fixed charge. Thus, a transistor whose channel region is formed in an oxide having a high density of trap states has unstable electrical characteristics and low reliability in some cases.

In order to obtain stable electrical characteristics and high reliability of the transistor, it is effective to reduce oxygen vacancies and the concentration of impurities in the oxide. In addition, in order to reduce the concentration of impurities in the oxide, the concentration of impurities in a film that is adjacent to the oxide is preferably reduced.

For the oxide 230b, an oxide having an electron affinity higher than that of each of the oxides 230a and 230c is used. For example, as the oxide 230b, an oxide having a higher electron affinity than the oxides 230a and 230c by 0.07 eV or more and 1.3 eV or less, preferably 0.1 eV or more and 0.7 eV or less, further preferably 0.15 eV or more and 0.4 eV or less is used. Note that the electron affinity refers to an energy difference between the vacuum level and the conduction band minimum.

The oxide 230b includes a first region, a second region, and a third region. In the top view, the third region is positioned between the first region and the second region. The transistor 200 includes the conductor 240a and the conductor 240b over the first region and the second region of the oxide 230b, respectively. One of the conductors 240a and 240b can function as one of a source conductor and a drain conductor and the other can function as the other of the source conductor and the drain conductor. Thus, one of the first region and the second region of the oxide 230b can function as a source region and the other can function as a drain region. The third region of the oxide 230b can function as a channel formation region.

Here, side surfaces in contact with the oxide 230c of the conductors 240a and 240b each preferably have a taper angle. The angle formed between the side surface in contact with the oxide 230c of the conductor 240a or 240b and the bottom surface thereof is preferably 45° or greater and 75° or less. When the conductors 240a and 240b are formed to have such a structure, the oxide 230c can be formed with good coverage also in step portions formed by the conductor 240. Accordingly, for example, disconnection of the oxide 230c, which causes the oxide 230b to be in contact with the insulator 250 or the like, can be prevented.

Moreover, the layer 245a and the layer 245b are formed over the conductor 240a and the conductor 240b, respectively. Here, for the layers 245a and 245b, a material which is less likely to transmit oxygen is preferably used, and aluminum oxide or the like can be used, for example. Thus, surrounding excess oxygen can be prevented from being consumed for oxidation of the conductors 240a and 240b.

The oxide 230c is formed over the layer 245a, the layer 245b, the conductor 240a, the conductor 240b, and the oxide 230b. Here, the oxide 230c is in contact with a top surface of the oxide 230b, side surfaces of the oxide 230b in the channel width direction, and side surfaces of the oxide 230a in the channel width direction. The oxide 230c may have a function of supplying oxygen to the oxide 230b. In addition, impurities such as water or hydrogen from the insulator 250 can be prevented from directly entering the oxide 230b by forming the insulator 250 over the oxide 230c. Furthermore, the oxide 230c is preferably formed using an oxide formed under an oxygen atmosphere, for example; thus, the shape of the oxide 230c can be stable.

The insulator 250 can function as a gate insulating layer. Like the insulator 224, the insulator 250 is preferably formed using an insulator from which oxygen is released by heating. When the insulator 250 formed using such an insulator is formed in contact with the oxide 230, oxygen can be supplied to the oxide 230b effectively. Furthermore, like the insulator 224, the concentration of impurities such as water or hydrogen in the insulator 250 is preferably lowered.

The conductor 260a, the conductor 260b, and the conductor 260c are formed over the insulator 250, the conductor 260a, and the conductor 260b, respectively. The insulator 250 and the conductor 260 each have a portion overlapping with the third region. In addition, end portions of the insulator 250, the conductor 260a, the conductor 260b, and the conductor 260c are substantially aligned.

One of the conductor 205 and the conductor 260 can function as a gate electrode and the other can function as a back gate electrode. The gate electrode and the back gate electrode are provided with the channel formation region in the semiconductor positioned therebetween. The potential of the back gate electrode may be the same as that of the gate electrode or may be a ground potential or a predetermined potential. By changing a potential of the back gate electrode independently of the potential of the gate electrode, the threshold voltage of the transistor can be changed.

The conductor 260a is preferably an oxide having conductivity. For example, an In—Ga—Zn-based oxide having high conductivity and having an atomic ratio of [In]:[Ga]:[Zn]=4:2:3 to 4.1 or in the neighborhood thereof, which can be used as the oxide 230, is preferably used.

The conductor 260b is preferably a conductor that can add impurities such as nitrogen to the conductor 260a to improve the conductivity of the conductor 260a. For example, titanium nitride or the like is preferably used for the conductor 260b.

Moreover, the layer 270 is formed over the conductor 260. Here, for the layer 270, a material which has low permeability for oxygen is preferably used, and aluminum oxide or the like can be used, for example. Thus, surrounding excess oxygen can be prevented from being consumed for oxidation of the conductor 260. That is, the layer 270 functions as a gate cap for protecting the gate. The layer 270 and the oxide 230c extend beyond end portions of the conductor 260 and have regions where the layer 270 and the oxide 230c overlap with each other in the extending portions, and end portions of the layer 270 and the oxide 230c are substantially aligned.

The insulator 272 is provided to cover the oxide 230, the conductor 240, the layer 245, the insulator 250, the conductor 260, and the layer 270. In addition, the insulator 272 is provided in contact with side surfaces of the oxide 230b and the top surface of the insulator 224. Moreover, the insulator 274 is provided over the insulator 272.

Here, for the insulator 272, an oxide insulator that is formed by a sputtering method is preferably used, and for example, aluminum oxide is preferably used. With the insulator 272 formed using such an oxide insulator formed by a sputtering method, oxygen can be added to surfaces of the insulator 224 and the oxide 230b that are in contact with the insulator 272, so that the insulator 224 and the oxide 230b can be in an oxygen excess state.

The insulator 272 preferably has a property of gettering hydrogen in the insulator 224 and the oxide 230 when being heated, and for example, is preferably formed using aluminum oxide. As a result, the concentration of impurities such as water or hydrogen in the insulator 224 and the oxide 230b can be reduced.

The insulators 272 and 274 are preferably formed using an insulating material which has low permeability for impurities such as water or hydrogen, and for example, are preferably formed using aluminum oxide or the like. With the insulator 272 including the insulating material, impurities such as water or hydrogen can be inhibited from diffusing from a layer over the insulator 274 into a layer below the insulator 272.

Furthermore, for the insulator 274, an oxide insulator that is formed by an ALD method is preferably used, and for example, aluminum oxide is preferably used. The insulator 274 formed by an ALD method has favorable coverage, and is a film in which formation of cracks, pinholes, or the like are suppressed. Although the insulators 272 and 274 are provided over an uneven structure, the insulator 274 formed by an ALD method can cover the transistor 200 without occurrence of disconnection, formation of cracks and pinholes, or the like. Thus, even when disconnection or the like occurs in the insulator 272, the insulator 272 can be covered with the insulator 274; therefore, the barrier property against impurities such as water or hydrogen of a stacked film of the insulators 272 and 274 can be improved noticeably.

In the case where the insulator 272 is formed by a sputtering method and the insulator 274 is formed by an ALD method, when the thickness of a portion over a top surface of the conductor 260c is referred to as a first thickness and the thickness of a portion over the side surfaces of the oxides 230a and 230b and the conductor 240 is referred to as a second thickness, the ratio of the first thickness to the second thickness in the insulator 272 might be different from that in the insulator 274. In the insulator 272, the first thickness and the second thickness can be approximately the same thickness. In contrast, in the insulator 274, the first thickness tends to be greater than the second thickness; for example, the first thickness is approximately twice as large as the second thickness in some cases.

Furthermore, for the insulators 272 and 274, an insulating material which is less likely to transmit oxygen is preferably used. Accordingly, oxygen contained in the insulator 224, the insulator 250, or the like can be inhibited from diffusing upward.

As described above, when the transistor 200 is positioned between the insulators 274 and 272 and the insulators 214 and 212, a large amount of oxygen can be contained in the insulator 224, the oxide 230, and the insulator 250 without diffusing outward. Furthermore, impurities such as water or hydrogen can be prevented from entering from an upper layer over the insulator 274 and a lower layer below the insulator 212, and thus the concentration of impurities in the insulator 224, the oxide 230, and the insulator 250 can be lowered.

In this manner, oxygen vacancies in the oxide 230b functioning as an active layer of the transistor 200 are reduced, and the concentration of impurities such as water or hydrogen is reduced; accordingly, the electrical characteristics of the transistor 200 are made stable, and the reliability can be improved.

An insulator 280 is provided over the insulator 274. Like the insulator 224 or the like, the concentration of impurities such as water or hydrogen in the insulator 280 is preferably lowered.

Moreover, an insulator 282 is provided over the insulator 280 and an insulator 284 is provided over the insulator 282. As well as the insulators 272 and 274, the insulators 282 and 284 are preferably formed using an insulating material which is less likely to transmit oxygen and impurities such as water or hydrogen, and for example, are preferably formed using aluminum oxide.

Like the insulator 272, the insulator 282 preferably has a property of gettering hydrogen in the insulator 280 when being heated, and for example, is preferably formed using aluminum oxide. Providing the insulator 282 having such a property can lower the concentration of impurities such as water or hydrogen in the insulator 280.

Furthermore, like the insulator 274, for the insulator 284, an oxide insulator formed by an ALD method is preferably used, and for example, aluminum oxide is preferably used. With the insulator 284 including the insulating material, impurities such as water or hydrogen can be inhibited from diffusing from a layer over the insulator 284 into a layer below the insulator 282.

In the insulators 216, 220, 222, 224, 272, 274, and 280, an opening 480 is formed to reach the insulator 214. The insulator 282 is formed also on an inner wall of the opening 480 and in contact with the top surface of the insulator 214. Note that although only part of the opening 480 extending in the W1-W2 direction is illustrated in FIG. 1A, the opening 480 is formed to surround the transistors 200 and 400 and to surround at least the external side of the oxide 230. Moreover, it is preferable that the shape of the opening 480 seen from above be closed and a region inside the opening 480 and a region outside the opening 480 are divided. In the opening 480, the top surface of the insulator 214 and a bottom surface of the insulator 282 be in contact with each other; that is, a region surrounded by the opening 480 is a region surrounded by the insulators 214 and 282.

With such a structure, the transistor 200 can be surrounded and sealed with the insulators 282 and 284 in not only a perpendicular direction but also a lateral direction of the substrate. Accordingly, impurities such as water or hydrogen can be prevented from diffusing from the outside of the insulator 284 into the transistors 200 and 400. Moreover, the insulator 284 is formed without disconnection or the like even in the opening 480 when formed by an ALD method. Accordingly, even when disconnection or the like occurs in the insulator 282, it can be covered with the insulator 284; therefore, the barrier property of a stacked film of the insulators 282 and 284 against impurities can be improved.

In addition, the opening 480 is preferably formed inside dicing lines or scribe lines along which the semiconductor device 1000 is cut out. In this way, even when the semiconductor device 1000 is cut out, side surfaces of the insulator 280, the insulator 224, the insulator 216, and the like remain sealed with the insulators 282 and 284; therefore, impurities such as water or hydrogen can be prevented from diffusing from the insulators into the transistors 200 and 400. Note that a plurality of regions surrounded by the opening 480 may be provided inside the dicing lines or the scribe lines, and a plurality of semiconductor devices may be sealed with the insulators 282 and 284 separately.

[Transistor 400]

As illustrated in FIGS. 1A, 1B, and 1E, the transistor 400 includes the insulator 212 provided over the insulator 210, the insulator 214 provided over the insulator 212, a conductor 403 (a conductor 403a, a conductor 403b, and a conductor 403c), a conductor 405 (a conductor 405a, a conductor 405b, and a conductor 405c), and a conductor 407 (a conductor 407a, a conductor 407b, and a conductor 407c) which are provided over the insulator 214, the insulators 220, 222, and 224 provided over the conductors 403, 405, and 407, an oxide 430 provided over the insulator 224 and the conductors 405c and 407c, an insulator 450 provided over the oxide 430, a conductor 460 (a conductor 460a, a conductor 460b, and a conductor 460c) provided over the insulator 450, a layer 470 provided over the conductor 460c, the insulator 272 provided over the layer 470, and the insulator 274 provided over the insulator 272. Hereinafter, description of the components already made for the transistor 200 is omitted.

The conductors 403, 405, and 407 are provided in the openings in the insulator 216. The conductors 403, 405, and 407 preferably have the same structure as that of the conductor 205. The conductor 403a is formed in contact with an inner wall of the opening in the insulator 216, and the conductor 403b is formed on the inner side. In addition, the conductor 403c is provided over the conductors 403a and 403b. The conductors 405 and 407 also have the same structure as that of the conductor 403. One of the conductor 405 and the conductor 407 can function as one of a source conductor and a drain conductor, and the other can function as the other of the source conductor and the drain conductor.

The oxide 430 preferably has the same structure as that of the oxide 230c. The oxide 430 includes a first region, a second region, and a third region. In the top view, the third region is positioned between the first region and the second region. The transistor 400 includes the conductors 405c and the conductor 407c under the first region and under the second region of the oxide 430, respectively. Thus, one of the first region and the second region of the oxide 430 can function as a source region and the other can function as a drain region. The third region of the oxide 430 can function as a channel formation region.

Note that although a channel is formed in the oxide 230b in the transistor 200, a channel is formed in the oxide 430 in the transistor 400. The oxides 230b and 430 are preferably formed using semiconductor materials having different electrical characteristics. When using semiconductor materials having different electrical characteristics, electrical characteristics of the transistor 200 and the transistor 400 can be different from each other.

Moreover, for example, when the oxide 430 is formed of a semiconductor having lower electron affinity than that of the oxide 230b, the threshold voltage of the transistor 400 can be higher than that of the transistor 200. Specifically, when each of the oxide 430 and the oxide 230b is an In-M-Zn oxide (an oxide containing In, an element M, and Zn) and when the oxide 430 has an atomic ratio of $x_1:y_1:z_1$ and the oxide 230b is has an atomic ratio of $x_2:y_2:z_2$, the oxide 430 and the oxide 230b in which $y_1/x_1$ is larger than $y_2/x_2$ may be used. The atomic ratio of a target that is used for forming the oxide 230b is preferably In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, In:M:Zn=4:2:4.1, In:M:Zn=4:2:3, In:M:Zn=5:1:7, or the like. In addition, the atomic ratio of a target that is used for forming the oxide 430 is preferably In:M:Zn=1:2:4, In:M:Zn=1:3:2, In:M:Zn=1:3:4, In:M:Zn=1:3:6, In:M:Zn=1:3:8, In:M:Zn=1:4:3, In:M:Zn=1:4:4, In:M:Zn=1:4:5, In:M:Zn=1:4:6, In:M:Zn=1:6:3, In:M:Zn=1:6:4, In:M:Zn=1:6:5, In:M:Zn=1:6:6, In:M:Zn=1:6:7, In:M:Zn=1:6:8, In:M:Zn=1:6:9, In:M:Zn=1:10:1, or the like. However, not limited to this, the atomic ratios of the oxide 430 and the oxide 230b may be determined as appropriate within the range satisfying the above condition. With such In-M-Zn oxides, the transistor 400 can have higher $V_{th}$ than the transistor 200.

In addition, in the transistor 400, a channel formation region in the oxide 430 is in direct contact with the insulators 224 and 450, so that the transistor 400 is likely to be affected by interface scattering and the trap states. Thus, the transistor 400 can have lower field-effect mobility and carrier density. Furthermore, the transistor 400 can have higher $V_{th}$ than the transistor 200.

The oxide 430 preferably contains much excess oxygen and is preferably formed using an oxide formed under an oxygen atmosphere, for example. By using the oxide 430 formed using such an oxide for an active layer, the threshold voltage of the transistor 400 can be higher than 0 V, the off-state current can be reduced, and $I_{cut}$ can be noticeably reduced.

The insulator 450 preferably has the same structure as that of the insulator 250 and can function as a gate insulating layer. When the insulator 450 formed using such an insulator is formed in contact with the oxide 430, oxygen can be supplied to the oxide 430 effectively. Furthermore, the concentration of impurities such as water or hydrogen in the insulator 450 is preferably lowered as in the insulator 224.

The conductor 460 preferably has the same structure as that of the conductor 260. The conductors 460a, the conductor 460b, and the conductor 460c are provided over the insulator 450, the conductor 460a, and the conductor 460b, respectively. The insulator 450 and the conductor 460 each have a portion overlapping with the third region. In addition, end portions of the insulator 450, the conductor 460a, the conductor 460b, and the conductor 460c are substantially aligned. One of the conductor 403 and the conductor 460 can function as a gate electrode and the other can function as a back gate electrode.

The layer 470 preferably has the same structure as that of the layer 270. The layer 470 is formed over the conductor 460. Therefore, surrounding excess oxygen can be prevented from being used for oxidation of the conductor 460. The layer 470 and the oxide 430 extend beyond end portions of the conductor 460 and have regions where the layer 470 and the oxide 430 overlap with each other in the extending portions, and end portions of the layer 470 and the oxide 430 are substantially aligned.

Like the transistor 200, when the transistor 400 is positioned between the insulators 274 and 272 and the insulators 214 and 212, a large amount of oxygen can be contained in the insulator 224, the oxide 430, and the insulator 450 without diffusing outward. Furthermore, impurities such as water or hydrogen can be prevented from entering from an upper layer over the insulator 274 and a lower layer below the insulator 212, and thus the concentration of impurities in the insulator 224, the oxide 430, and the insulator 450 can be lowered.

In this manner, oxygen vacancies in the oxide 430 functioning as an active layer of the transistor 400 are reduced, and the concentration of impurities such as water or hydrogen is reduced; accordingly, the threshold voltage of the transistor 400 can be higher than 0 V, the off-state current can be reduced, and $I_{cut}$ can be noticeably reduced. Moreover, the electrical characteristics of the transistor 400 are made stable, and the reliability can be improved.

With the structure in which the transistor 400 is used as a switching element so that the potential of the back gate of the transistor 200 can be retained, the off state of the transistor 200 can be maintained for a long time.

<Materials>
[Insulator]

The insulators 210, 216, 220, 224, 250, 450 and 280 may be formed, for example, with a single layer or a stack of layers of an insulating material containing boron, carbon, nitrogen, oxygen, fluorine, magnesium, aluminum, silicon, phosphorus, argon, gallium, germanium, yttrium, zirconium, lanthanum, neodymium, hafnium, or tantalum. The insulators 210, 216, 220, 224, 250, 450 and 280 may be formed, for example, with a single layer or a stack of layers of one or more materials selected from silicon oxide, silicon oxynitride, silicon nitride oxide, silicon nitride, aluminum nitride, aluminum oxide, aluminum nitride oxide, aluminum oxynitride, magnesium oxide, gallium oxide, germanium oxide, yttrium oxide, zirconium oxide, lanthanum oxide, neodymium oxide, hafnium oxide, tantalum oxide, aluminum silicate, and the like. Alternatively, a material in which two or more materials selected from an oxide material, a nitride material, an oxynitride material, and a nitride oxide material are mixed may be used.

Note that in this specification, a nitride oxide refers to a compound that includes more nitrogen than oxygen. An oxynitride refers to a compound that includes more oxygen than nitrogen. The content of each element can be measured by, for example, Rutherford backscattering spectrometry (RBS) or the like.

The insulators 212, 214, 222, 272, 274, 282, and 284 are preferably formed using an insulating material which is less likely to transmit impurities such as water or hydrogen than the insulators 224, 250, 450, and 280. Examples of such an insulating material which is less likely to transmit impurities include aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, tantalum oxide, and silicon nitride. A single layer or a stack of any of these materials may be used.

When an insulating material which is less likely to transmit impurities is used for the insulators 212, 214, and 222, impurity diffusion from the substrate side into the transistor can be inhibited, and the reliability of the transistor can be improved. When an insulating material which is less likely to transmit impurities is used for the insulators 272, 274, 282, and 284, impurity diffusion from layers above the insulator 280 into the transistor can be inhibited, and the reliability of the transistor can be improved.

A plurality of insulating layers formed using any of the above-described materials may be stacked as each of the insulators 212, 214, 272, 282, and 284. One of the insulator 212 and the insulator 214 may be omitted. Moreover, one of the insulator 282 and the insulator 284 may be omitted.

An insulating material which is less likely to transmit impurities herein refers to a material having a high oxidation resistance and a function of inhibiting the diffusion of oxygen and impurities typified by hydrogen or water.

For example, the diffusion length of oxygen or hydrogen in aluminum oxide per hour under an atmosphere at 350° C. or 400° C. is much less than that in silicon oxide. Thus, it can be said that aluminum oxide is less likely to transmit impurities.

As an example of an insulating material which is less likely to transmit impurities, silicon nitride formed by a CVD method can be used. Here, diffusion of hydrogen into a semiconductor element including an oxide semiconductor, such as the transistor 200, degrades the characteristics of the semiconductor element in some cases. Therefore, the transistor 200 is preferably sealed with a film that inhibits hydrogen diffusion. Specifically, the film that inhibits hydrogen diffusion is a film from which hydrogen is less likely to be released.

The released amount of hydrogen can be measured by TDS, for example. The amount of hydrogen released from the insulator 212 that is converted into hydrogen molecules per unit area of the insulator 212 is less than or equal to $2 \times 10^{15}$ molecules/cm$^2$, preferably less than or equal to $1\times10^{15}$ molecules/cm$^2$, more preferably less than or equal to $5\times10^{14}$ molecules/cm$^2$ in TDS analysis in the range from 50° C. to 500° C., for example.

Moreover, in particular, the dielectric constant of the insulators 216, 224, and 280 is preferably low. For example, the relative dielectric constant of the insulators 216, 224, and 280 is preferably lower than 3, further preferably lower than 2.4, still further preferably lower than 1.8. In the case where a material with a low dielectric constant is used as an interlayer film, the parasitic capacitance between wirings can be reduced. Furthermore, the insulators 216, 224, and 280 are preferably formed using an insulating material which is less likely to transmit impurities.

When an oxide semiconductor is used for the oxide 230, the hydrogen concentration in the insulator is preferably lowered in order to prevent an increase in the hydrogen concentration in the oxide 230. Specifically, the hydrogen concentration in the insulator, which is measured by secondary ion mass spectrometry (SIMS), is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. It is particularly preferable to lower the hydrogen concentration of the insulators 216, 224 250, 450, and 280. It is preferable to lower the hydrogen concentration of at least the insulators 224, 250, and 450 which are in contact with the oxide 230 or the oxide 430.

Furthermore, the nitrogen concentration in the insulator is preferably low in order to prevent an increase in the nitrogen concentration in the oxide 230. Specifically, the nitrogen concentration in the insulator, which is measured by SIMS, is lower than or equal to $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

It is preferable that a region of the insulator 224 which is in contact with at least the oxide 230 and a region of the insulator 250 which is in contact with at least the oxide 230 have few defects and typically have as few signals observed by electron spin resonance (ESR) spectroscopy as possible. Examples of the signals include a signal due to an E' center observed at a g-factor of 2.001. Note that the E' center is due to the dangling bond of silicon. In the case where a silicon oxide layer or a silicon oxynitride layer is used as the insulators 224 and 250, a silicon oxide layer or a silicon oxynitride layer whose spin density due to the E' center is lower than or equal to $3\times10^{17}$ spins/cm$^3$, preferably lower than or equal to $5\times10^{16}$ spins/cm$^3$ may be used.

In addition to the above-described signal, a signal due to nitrogen dioxide (NO$_2$) might be observed. The signal is divided into three signals according to the N nuclear spin; a first signal, a second signal, and a third signal. The first signal is observed at a g-factor of greater than or equal to 2.037 and less than or equal to 2.039. The second signal is observed at a g-factor of greater than or equal to 2.001 and less than or equal to 2.003. The third signal is observed at a g-factor of greater than or equal to 1.964 and less than or equal to 1.966.

It is suitable to use an insulating layer whose spin density due to nitrogen dioxide (NO$_2$) is higher than or equal to $1\times10^{17}$ spins/cm$^3$ and lower than $1\times10^{18}$ spins/cm$^3$ as the insulators 224 and 250, for example.

Note that nitrogen oxide (NO$_x$) such as nitrogen dioxide (NO$_2$) forms a state in the insulating layer. The level is positioned in the energy gap of the oxide semiconductor. Thus, when nitrogen oxide (NO$_x$) diffuses to the interface between the insulating layer and the oxide semiconductor, an electron can potentially be trapped by the level on the insulating layer side. As a result, the trapped electrons remain in the vicinity of the interface between the insulating layer and the oxide semiconductor; thus, the threshold voltage of the transistor is shifted in the positive direction. Therefore, a shift in the threshold voltage of the transistor can be reduced when a film with a low nitrogen oxide content is used as the insulators 224 and 250.

As an insulating layer that releases little nitrogen oxide (NO$_x$), for example, a silicon oxynitride layer can be used. The silicon oxynitride layer is a film of which the amount of released ammonia is larger than the amount of released nitrogen oxide (NO$_x$) in TDS; the typical amount of released ammonia is greater than or equal to $1\times10^{18}$/cm$^3$ and less than or equal to $5\times10^{19}$/cm$^3$. Note that the released amount of ammonia is the total amount of ammonia released in heat treatment in a range from 50° C. to 650° C. or a range from 50° C. to 550° C. in TDS.

Since nitrogen oxide (NO$_x$) reacts with ammonia and oxygen in heat treatment, the use of an insulating film that releases a large amount of ammonia reduces nitrogen oxide (NO$_x$).

At least one of the insulators 216, 224, 250, and 450 is preferably formed using an insulating layer from which oxygen is released by heating. Specifically, it is preferable to use an insulator with the following characteristics: the amount of oxygen that is released from the insulator in TDS and converted into oxygen atoms is $1.0\times10^{18}$ atoms/cm$^3$ or more, preferably $3.0\times10^{20}$ atoms/cm$^3$ or more.

The insulating layer containing excess oxygen can also be formed by performing treatment for adding oxygen to an insulating layer. The treatment for adding oxygen can be performed by heat treatment under an oxygen atmosphere, an ion implantation method, an ion doping method, a plasma immersion ion implantation method, plasma treatment, or the like. The plasma treatment containing oxygen is preferably performed using an apparatus including a power source for generating high-density plasma using microwaves, for example. Alternatively, a power source for applying a radio frequency (RF) to a substrate side may be provided. The use of high-density plasma enables high-density oxygen radicals to be produced, and application of the RF voltage to the substrate side allows oxygen radicals generated by the high-density plasma to be efficiently introduced into the applied film. Alternatively, after plasma treatment using an inert gas with the apparatus, plasma treatment using oxygen in order to compensate released oxygen may be performed. As a gas for adding oxygen, an oxygen gas of $^{16}$O$_2$, $^{18}$O$_2$, or the like, a nitrous oxide gas, an ozone gas, or the like can be used. In this specification, the treatment for adding oxygen is also referred to as "oxygen doping treatment".

In addition, by oxygen doping treatment, the crystallinity of the semiconductor can be improved, and impurities such as water or hydrogen can be removed, in some cases. That is, "oxygen doping treatment" can also be referred to as "impurity removal treatment". In particular, when plasma treatment using oxygen is performed as oxygen doping treatment under a reduced pressure, the bond of hydrogen and the bond of water in the insulator to be processed or the oxide to be processed are cut; therefore, hydrogen and water are easily released. Therefore, heating treatment is preferably performed in or after the plasma treatment. Moreover, when the heating treatment is performed twice before and after the plasma treatment, the concentration of impurities in the applied film can be reduced.

There is no particular limitation on the method for forming the insulator; depending on a material thereof, any of the following methods may be used: a sputtering method, an SOG method, spin coating, dipping, spray coating, a droplet discharging method (e.g., an ink-jet method), a printing method (e.g., screen printing or offset printing), or the like.

Any of the above insulating layers may be used as the layers 245a, 245b, and 270. In the case where each of the layers 245a, 245b, and 270 is an insulating layer, an insulating layer which is less likely to release oxygen and/or which is less likely to absorb oxygen is preferably used.

[Oxide]

As the oxides 230 and 430, a single crystal oxide semiconductor, a c-axis-aligned crystalline oxide semiconductor (CAAC-OS), a polycrystalline oxide semiconductor, a microcrystalline oxide semiconductor, an amorphous oxide semiconductor, or the like can be used alone or in combination. Here, a CAAC-OS refers to a crystal structure having c-axis alignment and distortion in which pellets (nanocrystals) are connected in the a-b plane direction. The oxides 230a, 230b, 230c, and 430 may be formed using semiconductors having different crystal states or different semiconductor materials.

Note that the oxide 230 used for the transistor 200 has the above-described three layer structure in this embodiment; however, one embodiment of the present invention is not limited thereto. For example, a two-layer structure without one of the oxide 230a and the oxide 230c may be employed. Alternatively, a single layer structure using any one of the oxide 230a, the oxide 230b, and the oxide 230c may be employed. Alternatively, a four-layer structure in which any one of the above-described semiconductors is provided below or over the oxide 230a or below or over the oxide 230c may be employed. Alternatively, an n-layer structure (n is an integer of 5 or more) may be employed in which any one of the semiconductors described as examples of the oxide 230a, the oxide 230b, and the oxide 230c is provided in two or more of the following positions: over the oxide 230a, under the oxide 230a, over the oxide 230c, and under the oxide 230c.

Moreover, the band gap of an oxide semiconductor is greater than or equal to 2 eV; thus, when each of the oxides 230 and 430 in which oxygen vacancies and the concentration of impurities are reduced as described above is used as an oxide semiconductor, a transistor with an extremely low off-state current can be achieved. Specifically, the off-state current per micrometer in channel width at room temperature (typically 25° C.) and at a source-drain voltage of 3.5 V can be lower than $1\times10^{-20}$ A, lower than $1\times10^{-22}$ A, or lower than $1\times10^{-24}$ A. That is, the on/off ratio of the transistor can be greater than or equal to 20 digits and less than or equal to 150 digits. A transistor using an oxide semiconductor in the oxide 230 has high withstand voltage between its source and drain. Thus, a transistor with favorable reliability can be provided. In addition, a transistor with high output voltage and high withstand voltage can be provided. Moreover, a semiconductor device or the like with favorable reliability can be provided. Furthermore, a semiconductor device with high output voltage and high withstand voltage can be provided.

An oxide semiconductor used as the oxides 230 and 430 preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where an oxide semiconductor contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

First, preferred ranges of the atomic ratio of indium, the element M, and zinc contained in an oxide semiconductor according to the present invention are described with reference to FIGS. 27A to 27C. Note that the ratio of oxygen atoms is not illustrated in FIGS. 27A to 27C. Terms of the atomic ratio of indium, the element M, and zinc in the oxide semiconductor are denoted by [In], [M], and [Zn].

Figure 27A:
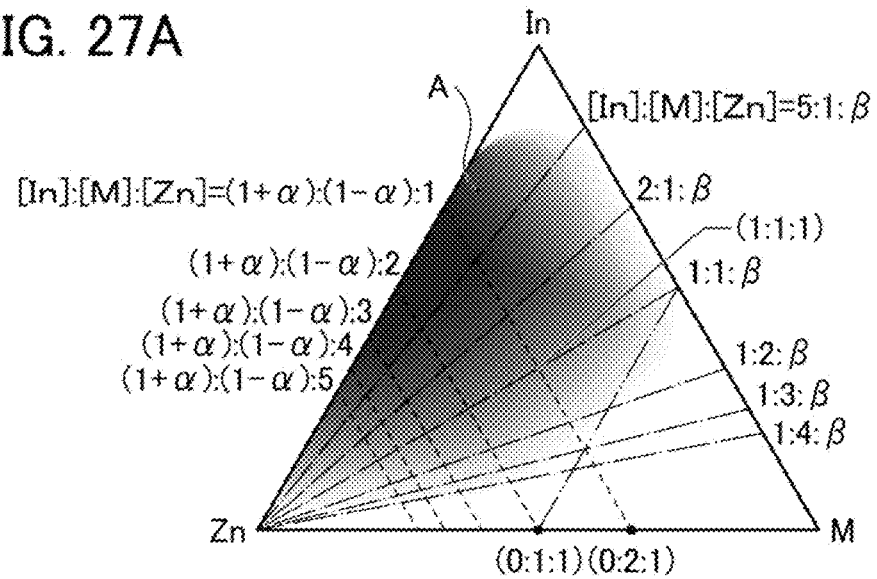
FIGS. 27A to 27C each illustrate an atomic ratio range of an oxide semiconductor of one embodiment of the present invention.
Figure 27B:
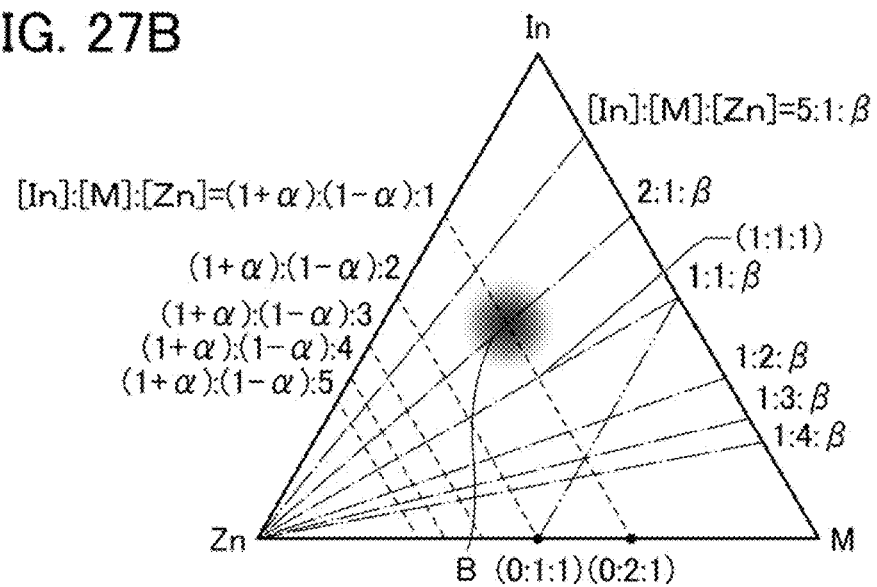
Figure 27C:
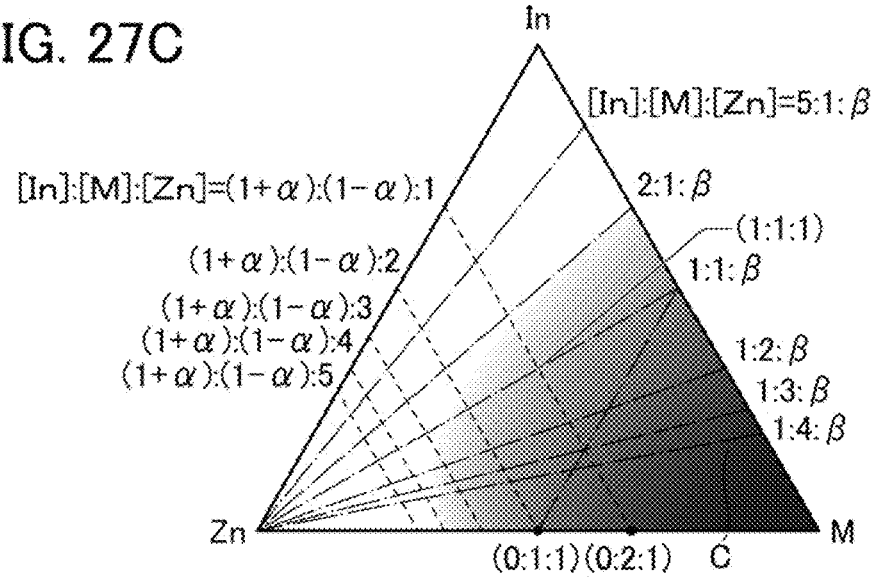

In FIGS. 27A to 27C, broken lines indicate a line where the atomic ratio [In]:[M]:[Zn] is $(1+\alpha):(1-\alpha):1$, where $-1\leq\alpha\leq1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

In addition, dash-dotted lines indicate a line where the atomic ratio [In]:[M]:[Zn] is $5:1:\beta$ ($\beta\geq0$), a line where the atomic ratio [In]:[M]:[Zn] is $2:1:\beta$, a line where the atomic ratio [In]:[M]:[Zn] is $1:1:\beta$, a line where the atomic ratio [In]:[M]:[Zn] is $1:2:\beta$, a line where the atomic ratio [In]:[M]:[Zn] is $1:3:\beta$, and a line where the atomic ratio [In]:[M]:[Zn] is $1:4:\beta$.

The oxide semiconductor shown in FIGS. 27A to 27C with an atomic ratio of [In]:[M]:[Zn]=0:2:1 or an atomic ratio which is in the neighborhood is likely to have a spinel crystal structure.

FIGS. 27A and 27B illustrate examples of the preferred ranges of the atomic ratio of indium, the element M, and zinc contained in an oxide semiconductor in one embodiment of the present invention.

Note that, for example, in the case where the oxide semiconductor is formed with a sputtering apparatus, a film having an atomic ratio deviated from the atomic ratio of a target is formed. In particular, [Zn] in the film might be smaller than [Zn] in the target depending on the substrate temperature in deposition.

InMZnO tends to have a layered crystal structure (also referred to as a stacked-layer structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M of the (M,Zn) layer is replaced by indium, the layer can also be referred to as an (In, M, Zn) layer.

A plurality of phases (e.g., two phases or three phases) exist in the oxide semiconductor in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide semiconductor, a grain boundary might be formed between different crystal structures.

Meanwhile, the oxide semiconductor containing indium in a higher ratio can have high carrier mobility (electron mobility). This is because in an oxide semiconductor containing indium, the element M, and zinc, the s orbital of heavy metal mainly contributes to carrier transfer, and when the indium ratio in the oxide semiconductor is increased, overlaps of the s orbitals of indium atoms are increased; therefore, an oxide semiconductor having a high ratio of indium has higher carrier mobility than an oxide semiconductor having a low ratio of indium.

In contrast, when the indium ratio and the zinc ratio in an oxide semiconductor become lower, carrier mobility becomes lower. Thus, with an atomic ratio of [In]:[M]:[Zn] =0:1:0 and the vicinity thereof (e.g., a region C in FIG. 27C), insulation performance becomes better.

Accordingly, an oxide semiconductor in one embodiment of the present invention preferably has an atomic ratio represented by a region A in FIG. 27A. With the atomic ratio, a layered structure with high carrier mobility and a few grain boundaries is easily obtained.

A region B in FIG. 27B represents an atomic ratio of [In]:[M]:[Zn]=4:2:3 to 4:2:4.1 and the vicinity thereof. The vicinity includes an atomic ratio of [In]:[M]:[Zn]=5:3:4, for example. An oxide semiconductor with an atomic ratio represented by the region B is an excellent oxide semiconductor that has particularly high crystallinity and high carrier mobility.

Note that the property of an oxide semiconductor is not uniquely determined by an atomic ratio. Even with the same atomic ratio, the property of an oxide semiconductor might be different depending on a formation condition. Therefore, the illustrated regions each represent an atomic ratio with which an oxide semiconductor tends to have specific characteristics, and boundaries of the regions A to C are not clear.

Next, the case where the oxide semiconductor is used for a transistor is described.

When the oxide semiconductor is used for a transistor, carrier scattering or the like at a grain boundary can be reduced; thus, the transistor can have high field-effect mobility. In addition, the transistor can have high reliability.

An oxide semiconductor with low carrier density is preferably used for the transistor. For example, an oxide semiconductor whose carrier density is lower than $8\times10^{11}/cm^3$, preferably lower than $1\times10^{11}/cm^3$, more preferably lower than $1\times10^{10}/cm^3$, and greater than or equal to $1\times10^{-9}/cm^3$ is used.

A highly purified and intrinsic or substantially highly purified and intrinsic oxide semiconductor has few carrier generation sources and thus can have a low carrier density. The highly purified and intrinsic or substantially highly purified and intrinsic oxide semiconductor has a low density of defect states and accordingly has a low density of trap states in some cases.

Charge trapped by the trap states in the oxide semiconductor takes a long time to be released and may behave like fixed charge. Thus, a transistor whose channel region is formed in an oxide semiconductor having a high density of trap states has unstable electrical characteristics and low reliability in some cases.

In order to obtain stable electrical characteristics of the transistor, it is effective to reduce the concentration of impurities in the oxide semiconductor. In addition, in order to reduce the concentration of impurities in the oxide semiconductor, the concentration of impurities in a film that is adjacent to the oxide semiconductor is preferably reduced. Examples of impurities include hydrogen, nitrogen, alkali metal, alkaline earth metal, iron, nickel, and silicon.

Here, the influence of impurities in the oxide semiconductor is described.

When silicon or carbon that is one of Group 14 elements is contained in the oxide semiconductor, defect states are formed. Thus, the concentration of silicon or carbon in the oxide semiconductor (measured by SIMS) is controlled to be lower than or equal to $2\times10^{18}$ atoms/cm$^3$, preferably lower than or equal to $2\times10^{17}$ atoms/cm$^3$ in the oxide semiconductor or in the vicinity of an interface with the oxide semiconductor.

When the oxide semiconductor contains alkali metal or alkaline earth metal, defect states are formed and carriers are generated, in some cases. Thus, a transistor including an oxide semiconductor that contains alkali metal or alkaline earth metal is likely to be normally-on. Therefore, it is preferable to reduce the concentration of alkali metal or alkaline earth metal in the oxide semiconductor. Specifically, the concentration of alkali metal or alkaline earth metal in the oxide semiconductor measured by SIMS is controlled to be lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase of carrier density. Thus, a transistor whose semiconductor includes an oxide semiconductor that contains nitrogen is likely to be normally-on. For this reason, nitrogen in the oxide semiconductor is preferably reduced as much as possible; the concentration of nitrogen in the oxide semiconductor measured by SIMS is, for example, controlled to be lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

Hydrogen contained in an oxide semiconductor reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally-on. Accordingly, it is preferable that hydrogen in the oxide semiconductor be reduced as much as possible. Specifically, the concentration of hydrogen in the oxide semiconductor measured by SIMS is controlled to be lower than $1\times10^{20}$ atoms/cm$^3$, preferably lower than $1\times10^{19}$ atoms/cm$^3$, more preferably lower than $5\times10^{18}$ atoms/cm$^3$, still more preferably lower than $1\times10^{18}$ atoms/cm$^3$.

When an oxide with sufficiently reduced impurity concentration and sufficiently reduced oxygen vacancies is used for a channel formation region in a transistor, the transistor can have stable electrical characteristics and favorable reliability.

In this specification and the like, a transistor in which an oxide semiconductor is used for a semiconductor where a channel is formed is also referred to as an "OS transistor". In this specification and the like, a transistor in which silicon having crystallinity is used for a semiconductor where a channel is formed is also referred to as a "crystalline Si transistor".

The crystalline Si transistor tends to obtain relatively high mobility as compared to the OS transistor. On the other hand, the crystalline Si transistor has difficulty in obtaining extremely small off-state current unlike the OS transistor. Thus, it is important that the semiconductor material used for the semiconductor be selected depending on the purpose and the usage. For example, depending on the purpose and the usage, the OS transistor and the crystalline Si transistor may be used in combination.

An indium gallium oxide has a small electron affinity and an excellent oxygen-blocking property. Therefore, the oxide 230c preferably includes an indium gallium oxide. The gallium atomic ratio [Ga/(In+Ga)] is, for example, higher than or equal to 70%, preferably higher than or equal to 80%, more preferably higher than or equal to 90%.

Note that the oxide 230a and 230c may be gallium oxide. For example, when gallium oxide is used for the oxide 230c, a leakage current generated between the conductor 205 and the oxide 230 can be reduced. In other words, the off-state current of the transistor 200 can be reduced.

In that case, when a gate voltage is applied, a channel is formed in the oxide 230b having the highest electron affinity in the oxides 230a, 230b, and 230c.

In order to give stable electrical characteristics and favorable reliability to the transistor including an oxide semiconductor, it is preferable that impurities and oxygen vacancies in the oxide semiconductor be reduced to highly purify the oxide semiconductor so that at least the oxide 230b can be regarded as an intrinsic or substantially intrinsic oxide semiconductor. Furthermore, it is preferable that at least a channel formation region of the oxide 230b be regarded as an intrinsic or substantially intrinsic semiconductor.

The layers 245a, 245b, 270, and 470 may be formed using a material and a method which are similar to those of the oxide 230 or the oxide 430. In the case where the layers 245a, 245b, 270, and 470 are formed using an oxide semiconductor, an oxide semiconductor which is less likely to release oxygen and/or which is less likely to absorb oxygen is preferably used.

[Conductor]

As a conductive material for forming the conductors 205, 207, 403, 405, 407, 240, 260, and 460, a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like can be used. Alternatively, a semiconductor having a high electric conductivity typified by polycrystalline silicon including an impurity element such as phosphorus, or silicide such as nickel silicide may be used.

A conductive material containing the above metal element and oxygen may be used. A conductive material containing the above metal element and nitrogen may be used. For example, a conductive material containing nitrogen such as titanium nitride or tantalum nitride may be used. Indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide to which silicon is added, may be used. Alternatively, indium gallium zinc oxide containing nitrogen may be used.

A stack of a plurality of conductive layers formed with the above materials may be used. For example, a layered structure formed using a combination of a material including any of the metal elements listed above and a conductive material including oxygen may be used. Alternatively, a layered structure formed using a combination of a material including any of the metal elements listed above and a conductive material including nitrogen may be used. Alternatively, a layered structure formed using a combination of a material including any of the metal elements listed above, a conductive material including oxygen, and a conductive material including nitrogen may be used.

The conductors 205b, 207b, 403b, 405b, and 407b may be formed using, for example, a conductive material such as tungsten or polysilicon. The conductors 205a, 207a, 403a, 405a, and 407a in contact with the insulators 212 and 214 can have a single-layer structure or a stacked-layer structure including, for example, a barrier layer (a diffusion prevention layer) formed using titanium, titanium nitride, tantalum nitride, or the like.

When an insulating material which is less likely to transmit impurities is used for the insulators 212 and 214, and a conductive material which is less likely to transmit impurities is used for the conductors 205a, 207a, 403a, 405a, and 407a in contact with the insulators 212 and 214, diffusion of impurities into the transistors 200 and 400 can be further inhibited. Thus, the reliabilities of the transistors 200 and 400 can be further increased.

Any of the above conductive materials may be used as the layers 245a, 245b, 270, and 470. In the case where the layers 245a, 245b, 270, and 470 are formed using a conductive material, a conductive material which is less likely to release oxygen and/or which is less likely to absorb oxygen is preferably used.

[Substrate]

There is no particular limitation on a material used as a substrate as long as the material has heat resistance high enough to withstand at least heat treatment performed later. For example, a single crystal semiconductor substrate or a polycrystalline semiconductor substrate made of silicon, silicon carbide, or the like or a compound semiconductor substrate made of silicon germanium or the like can be used as the substrate. Alternatively, an SOI substrate, a semiconductor substrate on which a semiconductor element such as a strained transistor or a FIN-type transistor is provided, or the like can also be used. Alternatively, gallium arsenide, aluminum gallium arsenide, indium gallium arsenide, gallium nitride, indium phosphide, silicon germanium, or the like that can be used for a high-electron-mobility transistor (HEMT) may be used. That is, the substrate is not limited to a simple supporting substrate, and may be a substrate where a device such as a transistor is formed. In this case, at least one of the gate, the source, and the drain of the transistor 200 or the transistor 400 may be electrically connected to the above-described device.

Further alternatively, as the substrate, a glass substrate of barium borosilicate glass, aluminoborosilicate glass, or the like, a ceramic substrate, a quartz substrate, a sapphire substrate, or the like can be used. Note that a flexible substrate may also be used as the substrate. In the case where a flexible substrate is used, a transistor, a capacitor, or the like may be directly formed over the flexible substrate; or the transistor, the capacitor, or the like may be formed over a manufacturing substrate and then separated from the manufacturing substrate and transferred onto the flexible substrate. To separate and transfer the transistor, the capacitor, or the like from the manufacturing substrate to the flexible substrate, a separation layer may be provided between the manufacturing substrate and the transistor, the capacitor, or the like.

For the flexible substrate, for example, metal, an alloy, resin, glass, or fiber thereof can be used. The flexible substrate used as the substrate preferably has a lower coefficient of linear expansion because deformation due to an environment is suppressed. The flexible substrate used as the substrate is formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. Examples of the resin include polyester, polyolefin, polyamide (e.g., nylon or aramid), polyimide, polycarbonate, and acrylic. In particular, aramid is preferably used for the flexible substrate because of its low coefficient of linear expansion.

<Example of Method for Manufacturing Semiconductor Device 1000>

Figure 3:
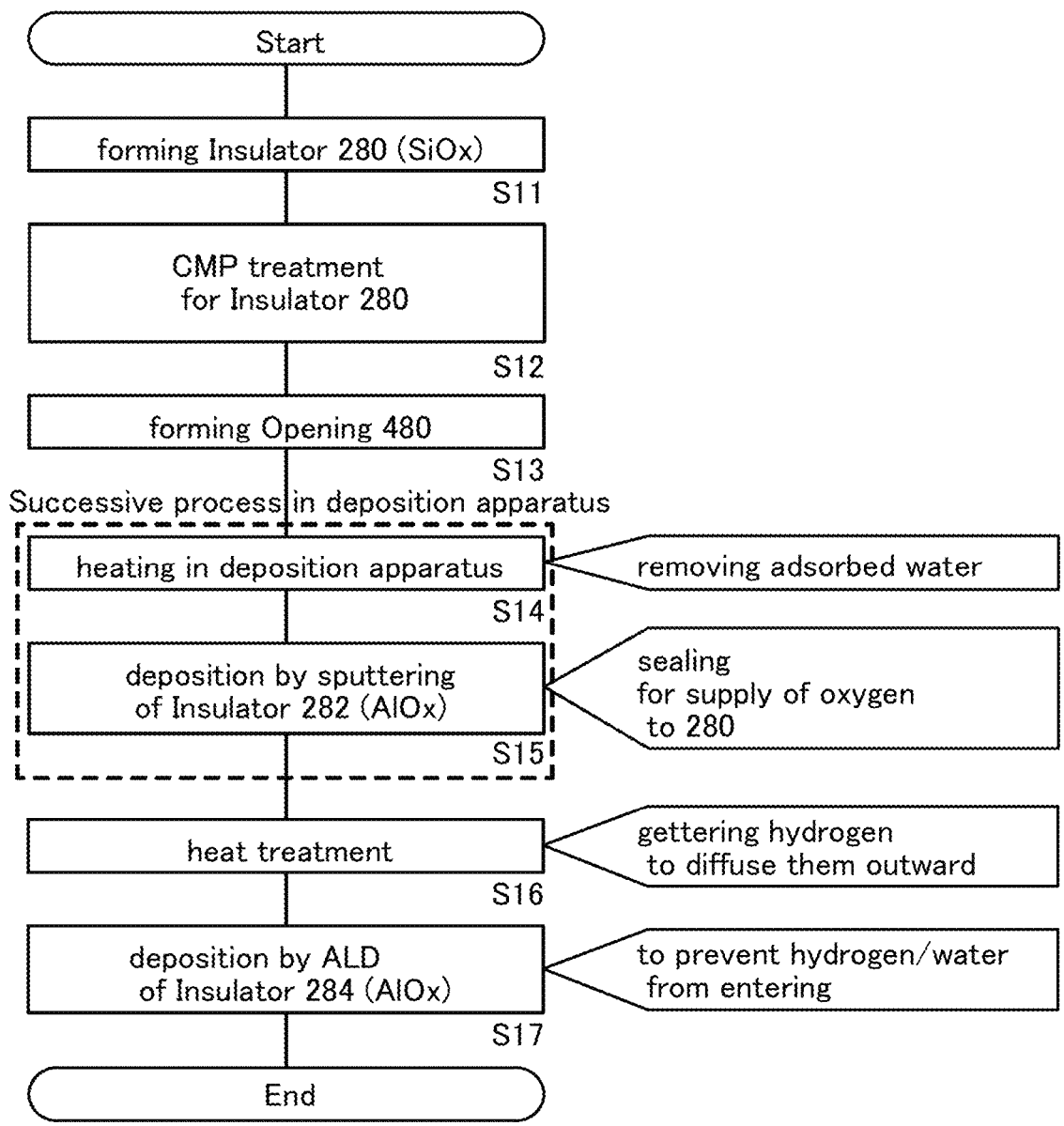
FIG. 3 is a flow chart showing a method for manufacturing a semiconductor device of one embodiment of the present invention.
Figure 12C:
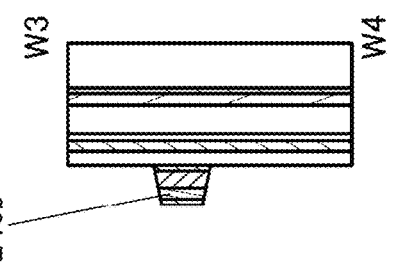
FIGS. 12A to 12E illustrate a method for manufacturing a transistor of one embodiment of the present invention.
Figure 12D:
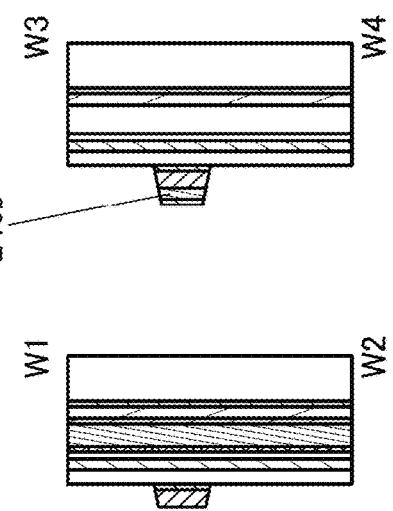
Figure 12E:
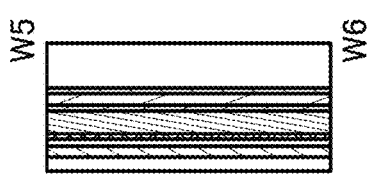
Figure 12A:
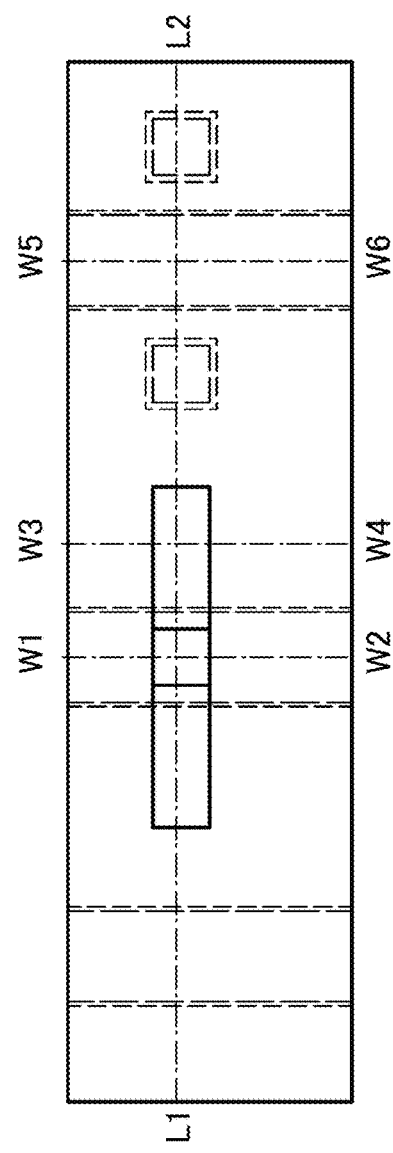
Figure 12B:
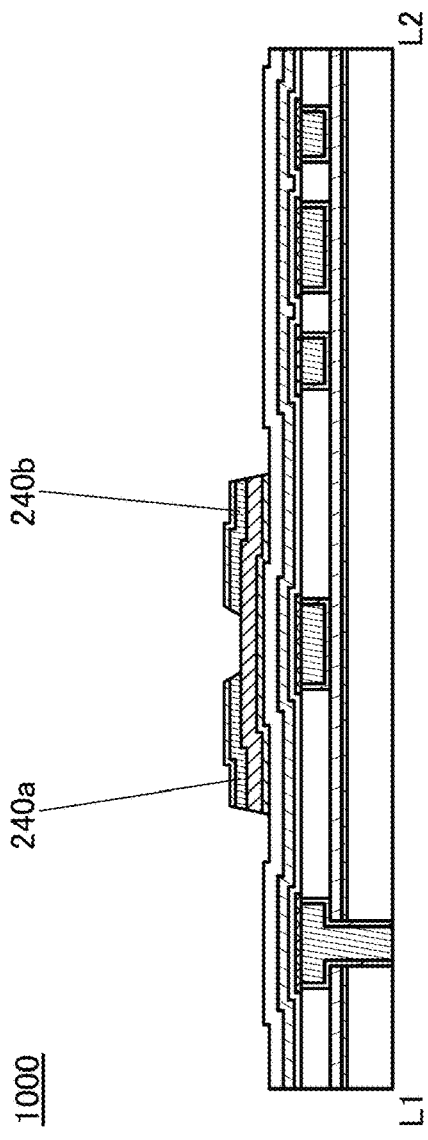

An example of a method for manufacturing the semiconductor device 1000 will be described with reference to FIG. 2, FIG. 3, FIGS. 4A to 4E, FIGS. 5A to 5E, FIGS. 6A to 6E, FIGS. 7A to 7E, FIGS. 8A to 8E, FIGS. 9A to 9E, FIGS. 10A to 10E, FIGS. 11A to 11E, FIGS. 12A to 12E, FIGS. 13A to 13E, FIGS. 14A to 14E, FIGS. 15A to 15E, FIGS. 16A to 16E, FIGS. 17A to 17E, FIGS. 18A to 18F, FIGS. 19A to 19E, FIGS. 20A to 20E, FIGS. 21A to 21E, and FIGS. 22A to 22E. FIG. 2 and FIG. 3 each are a flow chart showing part of manufacturing process of the semiconductor device 1000. FIG. 2 is a flow chart showing manufacturing process of the insulators 272 and 274, and FIG. 3 is a flow chart showing manufacturing process of the insulators 280, 282, and 284.

In addition, FIGS. 4A, 5A, 6A, 7A, 8A, 9A, 10A, 11A, 12A, 13A, 14A, 15A, 16A, 17A, 18A, 19A, 20A, 21A, and 22A correspond to FIG. 1A, FIGS. 4B, 5B, 6B, 7B, 8B, 9B, 10B, 11B, 12B, 13B, 14B, 15B, 16B, 17B, 18B, 19B, 20B, 21B, and 22B correspond to FIG. 1B, FIGS. 4C, 5C, 6C, 7C, 8C, 9C, 10C, 11C, 12C, 13C, 14C, 15C, 16C, 17C, 18C, 19C, 20C, 21C, and 22C correspond to FIG. 1C, FIGS. 4D, 5D, 6D, 7D, 8D, 9D, 10D, 11D, 12D, 13D, 14D, 15D, 16D, 17D, 18D, 19D, 20D, 21D, and 22D correspond to FIG. 1D, and FIGS. 4E, 5E, 6E, 7E, 8E, 9E, 10E, 11E, 12E, 13E, 14E, 15E, 16E, 17E, 18E, 19E, 20E, 21E, and 22E correspond to FIG. 1E. Each of FIGS. 4A, 5A, 6A, 7A, 8A, 9A, 10A, 11A, 12A, 13A, 14A, 15A, 16A, 17A, 18A, 19A, 20A, 21A, and 22A is a plan view of the semiconductor device 1000. Each of FIGS. 4B, 5B, 6B, 7B, 8B, 9B, 10B, 11B, 12B, 13B, 14B, 15B, 16B, 17B, 18B, 19B, 20B, 21B, and 22B corresponding to a dashed-dotted line L1-L2 in each of FIGS. 4A, 5A, 6A, 7A, 8A, 9A, 10A, 11A, 12A, 13A, 14A, 15A, 16A, 17A, 18A, 19A, 20A, 21A, and 22A is a cross-sectional view of the transistor 200 and the transistor 400 in the channel length direction. Each of FIGS. 4C, 5C, 6C, 7C, 8C, 9C, 10C, 11C, 12C, 13C, 14C, 15C, 16C, 17C, 18C, 19C, 20C, 21C, and 22C corresponding to a dashed-dotted line W1-W2 in each of FIGS. 4A, 5A, 6A, 7A, 8A, 9A, 10A, 11A, 12A, 13A, 14A, 15A, 16A, 17A, 18A, 19A, 20A, 21A, and 22A is a cross-sectional view of the transistor 200 in the channel width direction. Each of FIGS. 4D, 5D, 6D, 7D, 8D, 9D, 10D, 11D, 12D, 13D, 14D, 15D, 16D, 17D, 18D, 19D, 20D, 21D, and 22D corresponding to a dashed-dotted line W3-W4 in each of FIGS. 4A, 5A, 6A, 7A, 8A, 9A, 10A, 11A, 12A, 13A, 14A, 15A, 16A, 17A, 18A, 19A, 20A, 21A, and 22A is a cross-sectional view of the transistor 200 in the channel width direction. Each of FIGS. 4E, 5E, 6E, 7E, 8E, 9E, 10E, 11E, 12E, 13E, 14E, 15E, 16E, 17E, 18E, 19E, 20E, 21E, and 22E corresponding to a dashed-dotted line W5-W6 in each of FIGS. 4A, 5A, 6A, 7A, 8A, 9A, 10A, 11A, 12A, 13A, 14A, 15A, 16A, 17A, 18A, 19A, 20A, 21A, and 22A is a cross-sectional view of the transistor 400 in the channel width direction.

Hereinafter, an insulating material for forming the insulators, a conductive material for forming the conductors, or a semiconductor material for forming the semiconductors can be formed by a sputtering method, a spin coating method, a chemical vapor deposition (CVD) method (including a thermal CVD method, a metal organic chemical vapor deposition (MOCVD) method, a plasma enhanced CVD (PECVD) method, a high density plasma CVD method, a low pressure CVD (LPCVD) method, an atmospheric pressure CVD (APCVD) method, and the like), an atomic layer deposition (ALD) method, a molecular beam epitaxy (MBE) method, or a pulsed laser deposition (PLD) method as appropriate.

By using the PECVD method, a high-quality film can be formed at a relatively low temperature. By using a deposition method that does not use plasma for deposition, such as the MOCVD method, the ALD method, or the thermal CVD method, a film can be formed with few defects because damage is not easily caused on a surface on which the film is formed.

In the case where a film is formed by an ALD method, a gas that does not contain chlorine is preferably used as a material gas.

First, over a substrate (not illustrated), the insulator 210, the insulator 212, the insulator 214, and the insulator 216 are formed in this order. In this embodiment, a single crystal silicon substrate (including a p-type semiconductor substrate or an n-type semiconductor substrate) is used as the substrate (see FIGS. 4A to 4E).

In this embodiment, aluminum oxide is formed by an ALD method as the insulator 212. A dense insulating layer including reduced defects such as cracks or pinholes or having a uniform thickness can be formed by an ALD method.

In this embodiment, an aluminum oxide is formed by a sputtering method as the insulator 214. As described above, the insulator 216 is preferably an insulator containing excess oxygen. After the formation of the insulator 216, oxygen doping treatment may be performed.

Next, a resist mask is formed over the insulator 216 and openings corresponding to the conductor 205, the conductor 405, the conductor 403, and the conductor 407 are formed in the insulator 216. Moreover, an opening corresponding to the conductor 207 is formed in the insulators 210, 212, 214, and 216. The resist mask can be formed by a photolithography method, a printing method, an inkjet method, or the like as appropriate. Formation of the resist mask by a printing method, an inkjet method, or the like needs no photomask; thus, manufacturing cost can be reduced.

The formation of the resist mask by a photolithography method can be performed in such a manner that a photosensitive resist is irradiated with light through a photomask and part of the resist which has been exposed to light (or has not been exposed to light) is removed using a developing solution. Examples of light with which the photosensitive resist is irradiated include KrF excimer laser light, ArF excimer laser light, extreme ultraviolet (EUV) light, and the like. Alternatively, a liquid immersion technique may be employed in which light exposure is performed with a part between a substrate and a projection lens filled with liquid (e.g., water). An electron beam or an ion beam may be used instead of the above-mentioned light. Note that a photomask is not necessary in the case of using an electron beam or an ion beam. Note that a dry etching method such as ashing or a wet etching method using a dedicated stripper or the like can be used for removal of the resist mask. Both the dry etching method and the wet etching method may be used.

When the openings are formed, part of the insulator 214 is also etched in some cases. The insulators 210, 212, 214, and 216 can be removed by a dry etching method, a wet etching method, or the like. Both the dry etching method and the wet etching method may be used. The resist mask is removed after the formation of the openings.

Next, conductive films to be the conductors 207a, 205a, 403a, 405a, and 407a and to be the conductors 207b, 205b, 403b, 405b, and 407b are formed over the insulators 214 and 216. In this embodiment, a stacked layer of tantalum nitride and titanium nitride is formed by a sputtering method as the conductive film to be the conductors 207a, 205a, 403a, 405a, and 407a. In addition, tungsten is formed by a sputtering method as the conductive film to be the conductors 207b, 205b, 403b, 405b, and 407b.

Next, chemical mechanical polishing treatment (also referred to as "CMP treatment") is performed to form the conductors 207a, 207b, 205a, 205b, 403a, 403b, 405a, 405b, 407a, and 407b (see FIGS. 5A to 5E). By CMP treatment, part of the conductive films is removed. At this time, part of a surface of the insulator 216 is also removed in some cases. By the CMP treatment, unevenness of a sample surface can be reduced, and coverage with an insulating layer or a conductive layer to be formed later can be increased.

The conductors 207, 205, 405, 403, and 407 can be formed at the same time by a dual damascene process.

Next, a conductive film to be the conductors 207c, 205c, 403c, 405c, and 407c is formed over the insulator 216 and the conductors 207a, 205a, 403a, 405a, 407a, 207b, 205b, 403b, 405b, and 407b. In this embodiment, tantalum nitride is formed by a sputtering method as the conductive film to be the conductors 207c, 205c, 403c, 405c, and 407c.

The conductors 207c, 205c, 403c, 405c, and 407c are formed using a resist mask (see FIGS. 6A to 6E). In this manner, the conductors 207, 205, 403, 405, and 407 are formed.

The insulator 220, the insulator 222, and the insulator 224 are formed in this order over the insulator 216 and the conductors 207, 205, 403, 405, and 407 (see FIGS. 7A to 7E). In this embodiment, hafnium oxide is formed as the insulator 220 by an ALD method and silicon oxide is formed as the insulator 224 by a CVD method.

Here, the concentration of impurities such as water or hydrogen in the insulator 224 is preferably lowered. Thus, impurities such as water or hydrogen are preferably diffused outward by heat treatment in an inert gas atmosphere containing nitrogen, a rare gas, or the like. The details of the heat treatment will be described below. The insulator 224 is preferably an insulating layer containing excess oxygen. Thus, oxygen doping treatment may be performed after the formation of the insulator 224.

Next, an oxide film 230A, an oxide film 230B, a conductive film 240A, a film 245A, and a conductive film 247A are formed in this order (see FIGS. 8A to 8E).

When an oxide semiconductor is used as the oxides 230 and 430, oxide films to be the oxides 230 and 430 are preferably formed by a sputtering method; thus, each of the oxides 230 and 430 can have a higher density. A rare gas (typically argon), oxygen, or a mixed gas of a rare gas and oxygen may be used as a sputtering gas. Alternatively, deposition may be performed with heating the substrate.

In addition, increasing the purity of a sputtering gas is also necessary. For example, an oxygen gas or a rare gas used as a sputtering gas is a gas that is highly purified to have a dew point of −60° C. or lower, preferably −100° C. or lower. By using the sputtering gas that is highly purified, entry of moisture or the like into the oxides 230 and 430 can be prevented as much as possible.

In the case where the oxides 230 and 430 are formed by a sputtering method, it is preferable that moisture in a deposition chamber of a sputtering apparatus be removed as much as possible. For example, with an adsorption vacuum evacuation pump such as cryopump, the deposition chamber is preferably evacuated to be a high vacuum state (to a degree of about $5\times10^{-7}$ Pa to $1\times10^{-4}$ Pa). In particular, the partial pressure of gas molecules corresponding to $H_2O$ (gas molecules corresponding to m/z=18) in the deposition chamber in the standby mode of the sputtering apparatus is preferably lower than or equal to $1\times10^{-4}$ Pa, more preferably lower than or equal to $5\times10^{-5}$ Pa.

In this embodiment, the oxide film 230A is formed by a sputtering method. Oxygen or a mixed gas of oxygen and a rare gas is used as the sputtering gas. When the ratio of oxygen in the sputtering gas is increased, the amount of excess oxygen in the oxide film to be formed can be increased.

At the formation of the oxide film 230B, part of oxygen contained in the sputtering gas is supplied to the insulators 224, 222, and 216 in some cases. As the amount of oxygen contained in the sputtering gas increases, the amount of oxygen supplied to the insulators 224, 222, and 216 increases. Thus, excess-oxygen regions can be formed in the insulators 224, 222, and 216. Moreover, part of oxygen supplied to the insulators 224, 222, and 216 reacts with hydrogen left in the insulators 224, 222, and 216 to produce water and the water is released from the insulators 224, 222, and 216 by later heat treatment. Thus, the hydrogen concentration in the insulators 224, 222 and 216 can be reduced.

The ratio of oxygen in the sputtering gas is preferably 70% or more, more preferably 80% or more, still more preferably 100%. When oxide containing excess oxygen is used for the oxide film 230A, oxygen can be supplied to the oxide 230b by later heat treatment.

Next, the oxide film 230B is formed by a sputtering method. At this time, when the ratio of oxygen in the sputtering gas is higher than or equal to 1% and lower than or equal to 30%, preferably higher than or equal to 5% and lower than or equal to 20%, an oxygen-deficient oxide semiconductor is formed. A transistor including an oxygen-deficient oxide semiconductor can have relatively high field-effect mobility.

Note that when an oxygen-deficient oxide semiconductor is used as the oxide film 230B, an oxide film containing excess oxygen is preferably used as the oxide film 230A. After the formation of the oxide film 230B, oxygen doping treatment may be performed.

After the formation of the oxide films 230A and 230B, heat treatment is preferably performed. The detail of the conditions for the heat treatment will be described below. In this embodiment, the heat treatment is performed at 400° C. in an oxygen gas atmosphere for one hour. Accordingly, oxygen is introduced into the oxide films 230A and 230B. More preferably, heat treatment is performed at 400° C. in a nitrogen gas atmosphere for one hour before the heat treatment performed in an oxygen gas atmosphere. By performing the heat treatment in a nitrogen gas atmosphere first, impurities such as water or hydrogen contained in the oxide films 230A and 230B are released, so that the concentration of impurities in the oxide films 230A and 230B can be reduced.

Then, the conductive film 240A is formed. In this embodiment, tantalum nitride is formed by a sputtering method as the conductive film 240A. Tantalum nitride has high oxidation resistance and thus is preferably used in the case where heat treatment is performed in a later step.

Note that when the conductive film 240A is in contact with the oxide film 230B, an impurity element can be introduced into a top surface of the oxide film 230B. Introduction of the impurity element into the oxide film 230B can change a threshold voltage of the transistor 200. The impurity element may be introduced by an ion implantation method, an ion doping method, a plasma immersion ion implantation method, plasma treatment using a gas containing the impurity element, or the like before the conductive film 240A is formed. Alternatively, the impurity element may be introduced by an ion implantation method or the like after the conductive film 240A is formed.

Next, the film 245A is formed. In this embodiment, an aluminum oxide film is formed by an ALD method as the film 245A. A dense film including reduced defects such as cracks or pinholes or having a uniform thickness can be formed by an ALD method.

The conductive film 247A serves as a hard mask for forming the conductor 240a and the conductor 240b in a later step. In this embodiment, tantalum nitride is used as the conductive film 247A.

Then, the film 245A and the conductive film 247A are processed by a photolithography method, whereby a film 245B and a conductive film 247B are formed (see FIGS. 9A to 9E). An opening is formed in the film 245B and the conductive film 247B.

Note that when the opening is formed, the side surfaces on the opening sides of the film 245B and the conductive film 247B each preferably have a taper angle with respect to the top surface of the conductive film 240A. Note that the angle is 30° or more and 90° or less, preferably 45° or more and 80° or less. The formation of the opening is preferably performed using the minimum feature size. That is, the film 245B has the opening whose width is the minimum feature size.

Then, a resist mask 290 is formed over the film 245B and the conductive film 247B by a photolithography method (see FIGS. 10A to 10E).

With the use of the resist mask 290 as a mask, parts of the conductive film 240A, the film 245B, and the conductive film 247B are selectively removed; thus, the conductive film 240A, the film 245B, and the conductive film 247B are processed into an island shape. At this time, the conductive film 240A is processed into a conductive film 240B, the film 245B is processed into the layer 245a and the layer 245b, and the conductive film 247B is processed into a conductor 247a and a conductor 247b. Note that when the film 245B is opened in the minimum dimension, the distance between the layer 245a and the layer 245b is the minimum feature size.

Subsequently, parts of the oxide films 230A and 230B are selectively removed using the conductive film 240B as a mask (see FIGS. 11A to 11E). At this time, part of the insulator 224 might be also removed. Then, the resist mask is removed; thus, a stacked-layer structure of the island-shaped oxides 230a and 230b, the island-shaped conductive film 240B, the island-shaped layers 245a and 245b, and the island-shaped conductors 247a and 247b can be formed.

Note that the removal of the oxide films 230A and 230B, the conductive film 240A, and the film 245A can be performed by a dry etching method, a wet etching method, or the like. Both the dry etching method and the wet etching method may be used.

Then, part of the conductive film 240B is selectively removed by a dry etching method using the layers 245a and 245b and the conductors 247a and 247b as masks. By the etching step, the conductive film 240B is divided into the conductor 240a and the conductor 240b (see FIGS. 12A to 12E).

As a gas for the dry etching, for example, any of a $C_4F_6$ gas, a $C_2F_6$ gas, a $C_4F_8$ gas, a $CF_4$ gas, a $SF_6$ gas, a $CHF_3$ gas, and the like can be used alone or in combination. Alternatively, an oxygen gas, a helium gas, an argon gas, a hydrogen gas, or the like can be added to any of the above gases as appropriate. In particular, a gas with which an organic substance can be generated by plasma is preferably used. For example, it is preferable to use a $C_4F_6$ gas, a $C_4F_8$ gas, or a $CHF_3$ gas by adding a helium gas, an argon gas, a hydrogen gas, or the like as appropriate.

Here, the conductors 247a and 247b function as hard masks, and the conductors 247a and 247b are also removed as etching progresses.

Using a gas with which an organic substance can be generated, the conductive film 240B is etched while an organic substance is attached to the side surfaces of the layers 245a and 245b and the conductors 247a and 247b, whereby side surfaces in contact with the conductors 240a, 240b, and the oxide 230c in this order, can be tapered.

The conductors 240a and 240b function as a source electrode and a drain electrode of the transistor; thus, a length between the conductors 240a and 240b facing each other can be referred to as a channel length of the transistor. That is, when the film 245B is opened in the minimum dimension, the distance between the layers 245a and 245b is the minimum feature size; therefore, the gate line width and the channel length can be smaller than the minimum feature size.

The angle of the side surface of the opening in the film 245B can be controlled depending on the ratio of the etching rate of the conductive film 240B to the deposition rate of the organic substance attached to the side surfaces of the layers 245a and 245b. For example, if the ratio of the etching rate to the deposition rate of the organic substance is 1, the angle is 45°.

The ratio of the etching rate and the deposition rate of the organic substance is determined by setting etching conditions as appropriate depending on the gas to be used in the etching. For example, the ratio of the etching rate and the deposition rate of the organic substance can be controlled by using a mixed gas of a $C_4F_8$ gas and an argon gas and controlling the high-frequency power and the etching pressure of the etching apparatus.

When the conductors 240a and 240b are formed by a dry etching method, impurities such as remaining components of an etching gas might be attached to an exposed part of the oxide 230b. For example, when a chlorine-based gas is used as an etching gas, chlorine and the like are attached in some cases. Furthermore, when a hydrocarbon-based gas is used as an etching gas, carbon, hydrogen, and the like are attached in some cases. The impurities attached to the exposed surface of the oxide 230b are preferably reduced. The impurity elements can be reduced by cleaning treatment using hydrofluoric acid, cleaning treatment using ozone, cleaning treatment using ultra violet rays, or the like. Note that different types of cleaning treatment may be combined.

Plasma treatment using an oxidizing gas may be performed. For example, plasma treatment using a nitrous oxide gas is performed. By the plasma treatment, the concentration of fluorine in the oxide 230b can be lowered. Moreover, the plasma treatment is effective in removing an organic substance on the surface of the sample.

Oxygen doping treatment may be performed on the exposed oxide 230b. Furthermore, heat treatment described later may be performed.

When processing is performed using the layers 245a and 245b as masks, an etching gas having relatively high etching selectivity of the conductive film 240B to the insulator 224 can be used. Therefore, even when the thickness of the insulator 224 is small, over-etching of the wiring layer positioned below the insulator can be prevented. In addition, when the thickness of the insulator 224 is small, a voltage is effectively applied from the conductor 205; therefore, the transistor with low power consumption can be provided.

Next, heat treatment is preferably performed to further reduce impurities such as water or hydrogen contained in the oxides 230a and 230b and to purify the oxides 230a and 230b.

Plasma treatment using an oxidizing gas may be performed before the heat treatment. For example, plasma treatment using a nitrous oxide gas is performed. By the plasma treatment, the fluorine concentration in the exposed insulating layer can be lowered. Moreover, the plasma treatment is effective in removing an organic substance on the surface of a sample.

For example, the heat treatment is performed under an inert gas atmosphere of nitrogen, a rare gas, or the like, an oxidizing gas atmosphere, or an ultra-dry air atmosphere (the moisture amount is 20 ppm (−55° C. by conversion into a dew point) or less, preferably 1 ppm or less, more preferably 10 ppb or less, in the case where the measurement is performed by a dew point meter in a cavity ring down laser spectroscopy (CRDS) system). Note that the oxidizing gas atmosphere refers to an atmosphere containing an oxidizing gas such as oxygen, ozone, or nitrogen oxide at 10 ppm or higher. The inert gas atmosphere refers to an atmosphere containing the oxidizing gas at lower than 10 ppm and is filled with nitrogen or a rare gas. The pressure during the heat treatment is not particularly limited; however, the heat treatment is preferably performed under a reduced pressure.

By the heat treatment, at the same time as the release of the impurities, oxygen contained in the insulator 224 is diffused into the oxides 230a and 230b and oxygen vacancies therein can be reduced. Note that the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate for desorbed oxygen. The heat treatment may be performed at any time after the oxides 230a and 230b are formed.

The heat treatment may be performed at a temperature higher than or equal to 250° C. and lower than or equal to 650° C., preferably higher than or equal to 300° C. and lower than or equal to 500° C. The treatment time is shorter than or equal to 24 hours. Heat treatment for over 24 hours is not preferable because the productivity is reduced. Note that in the case where a metal which is likely to diffuse when heated, such as Cu, is used for the conductor, the heating temperature may be set to lower than or equal to 410° C., preferably lower than or equal to 400° C.

In this embodiment, after heat treatment is performed at 400° C. in a nitrogen gas atmosphere for one hour, heat treatment is performed at 400° C. in an oxygen gas atmosphere for one hour. By performing the heat treatment in a nitrogen gas atmosphere first, impurities such as water or hydrogen contained in the oxides 230a and 230b are released, so that the concentration of impurities in the oxides 230a and 230b is reduced. Then, by performing the heat treatment in an oxygen gas atmosphere next, oxygen is introduced into the oxides 230a and 230b.

Since part of an upper surface of the conductive film 240B is covered with the layers 245a and 245b at the heat treatment, oxidation caused from the upper surface can be prevented.

Next, openings are formed in the insulators 220, 222, and 224 by a photolithography method. Note that the openings are formed over the conductors 405c and 407c (see FIGS. 13A to 13E).

Next, an oxide film 230C to be the oxides 230c and 430 are formed. In this embodiment, an oxide containing much excess oxygen is used for the oxide film 230C, as for the oxide film 230A. When an oxide containing excess oxygen is used for the oxide film 230C, oxygen can be supplied to the oxide 230b by later heat treatment.

At the formation of the oxide film 230C, like the oxide 230a, part of oxygen contained in the sputtering gas is supplied to the insulators 224, 222 and 216 to form an excess-oxygen region in some cases. Moreover, part of oxygen supplied to the insulators 224, 222 and 216 reacts with hydrogen left in the insulators 224, 222 and 216 to produce water and the water is released from the insulators 224, 222 and 216 by later heat treatment. Thus, the hydrogen concentration in the insulators 224, 222 and 216 can be reduced.

Note that after the oxide film 230C is formed, either or both of oxygen doping treatment and heat treatment may be performed. By the heat treatment, oxygen contained in the oxides 230a and 230c can be supplied to the oxide 230b. When oxygen is supplied to the oxide 230b, oxygen vacancies in the oxide 230b can be reduced. Thus, when an oxygen-deficient oxide semiconductor is used as the oxide 230b, an oxide containing excess oxygen is preferably used as the oxide 230c.

Part of the oxide film 230C is in contact with a channel formation region of the oxide 230b. In addition, top and side surfaces of the channel formation region of the oxide 230b are covered with the oxide film 230C. In such a manner, the oxide 230b can be surrounded by the oxide 230a and the oxide film 230C. By surrounding the oxide 230b by the oxide 230a and the oxide film 230C, diffusion of impurities into the oxide 230b which is to be caused in a later step can be inhibited.

Next, an insulating film 250A is formed over the oxide film 230C (see FIGS. 14A to 14E). In this embodiment, silicon oxynitride is formed by a CVD method as the insulating film 250A. The insulating film 250A is preferably an insulating layer containing excess oxygen. The insulating film 250A may be subjected to oxygen doping treatment. Moreover, heat treatment may be performed after the formation of the insulating film 250A.

Then, a conductive film 260A, a conductive film 260B, and a conductive film 260C are formed in this order (see FIGS. 15A to 15E). In this embodiment, a metal oxide formed by a sputtering method is used as the conductive film 260A, titanium nitride is used as the conductive film 260B, and tungsten is used as the conductive film 260C. The conductive film 260A formed by a sputtering method can add oxygen to the insulator 250, and the insulator 250 can be in an oxygen excess state. Thus, oxygen can be supplied from the insulator 250 to the oxide 230b effectively.

Next, parts of the insulating film 250A and the conductive films 260A to 260C are selectively removed by a photolithography method, so that the insulator 250, the insulator 450, the conductor 260a, the conductor 260b, the conductor 260c, the conductor 460a, the conductor 460b, and the conductor 460c are formed (see FIGS. 16A to 16E).

Next, a film to be processed into the layer 270 and the layer 470 in a later step is formed. The film functions as a gate cap, and in this embodiment, is formed using aluminum oxide formed by an ALD method.

The subsequent steps correspond to flow charts of FIG. 2 and FIG. 3. The steps in FIG. 2 and the steps in FIG. 3 mainly relate to the formation of the insulators 272 and 274 and the formation of the insulators 282 and 284, respectively. As described above, in order to provide stable electric characteristics and favorable reliability for the transistors 200 and 400, it is important to supply oxygen contained in the insulators 212, 214, 272, 274, 282, and 284 to the oxides 230 and 430 without diffusing the oxygen outward and to prevent impurities such as water or hydrogen from entering the transistors 200 and 400 from the outside. The flow charts of FIG. 2 and FIG. 3 show the steps on the left sides and the effects of the steps on the behaviors of impurities such as water or hydrogen and oxygen on the right sides.

Then, parts of the film functioning as a gate cap are selectively removed by a photolithography method, so that the layers 270 and 470 are formed. This step corresponds to Step S01 in the flow chart of FIG. 2. By forming the layer 270 over the conductor 260 in this manner, surrounding excess oxygen can be prevented from being used for oxidation of the conductor 260.

The layers 270 and 470 can be etched by a dry etching method, a wet etching method, or the like. In this embodiment, the layers 270 and 470 are formed by a dry etching method. At this time, although part of the oxide film 230C can be removed in some cases, a residue of the oxide film 230C is likely to be formed on the side surfaces of the oxides 230a and 230b or the like.

Next, the oxide film 230C is etched using the layers 270 and 470 as masks (see FIGS. 17A to 17E). This step corresponds to Step S02 in the flow chart of FIG. 2. The etching treatment in this step is performed by a wet etching or the like and a wet etching using phosphoric acid is performed in this embodiment. By this treatment, the island-shaped oxide 230c and the island-shaped oxide 430 are formed. Even when part of the oxide film 230C remains as a residue, the residue is removed, and accordingly the side surfaces of the oxide 230b can be exposed.

Next, heat treatment is preferably performed. This step corresponds to Step S03 in the flow chart of FIG. 2. The above description can be referred to for the heat treatment. In this embodiment, after heat treatment is performed at 400° C. in a nitrogen gas atmosphere for one hour, heat treatment is performed at 400° C. in an oxygen gas atmosphere for one hour. By performing the heat treatment in a nitrogen gas atmosphere first, impurities such as water or hydrogen contained in the oxide 230 are released, so that the concentration of impurities in the oxide 230 is reduced. Then, by performing the heat treatment in an oxygen gas atmosphere next, oxygen is introduced into the oxide 230.

Subsequently, the substrate is carried into a deposition apparatus including a plurality of chambers, and heat treatment is performed in the chamber of the deposition apparatus. This step corresponds to Step S04 in the flow chart of FIG. 2. The heating atmosphere or the like of this heat treatment can be referred to for the conditions of the above heat treatment. For example, this heat treatment is preferably performed under an oxygen atmosphere and the pressure in the chamber is higher than or equal to $1.0 \times 10^{-8}$ Pa and lower than or equal to 1000 Pa, preferably higher than or equal to $1.0 \times 10^{-8}$ Pa and lower than or equal to 100 Pa, further preferably higher than or equal to $1.0 \times 10^{-8}$ Pa and lower than or equal to 10 Pa, still further preferably higher than or equal to $1.0 \times 10^{-8}$ Pa and lower than or equal to 1 Pa. The heating temperature may be higher than or equal to 100° C. and lower than or equal to 500° C., preferably higher than or equal to 200° C. and lower than or equal to 450° C. Alternatively, in the case where a metal which is likely to diffuse when heated such as Cu is used for the conductor, the heating temperature may be set to lower than or equal to 410° C., preferably lower than or equal to 400° C. Note that the heating temperature is preferably higher than the substrate temperature in the formation of the insulator 272 described later.

In this embodiment, the heat treatment is performed under an oxygen atmosphere for about 5 minutes at the substrate temperature of 400° C. By this treatment, moisture such as adsorbed water can be removed before the insulator 272 is formed. Under an oxygen atmosphere in particular, the heat treatment can be performed without forming an oxygen vacancy in the oxide 230.

Then, the insulator 272 is formed by a sputtering method in a different chamber of the above deposition apparatus from the chamber in which the heat treatment is performed (see FIGS. 18A to 18E). This step corresponds to Step S05 in the flow chart of FIG. 2. The formation of the insulator 272 is successively performed following the heat treatment in Step S04 without exposure to the outside air. In this embodiment, the thickness of the insulator 272 is 5 nm or greater and 100 nm or less, preferably 5 nm or greater and 20 nm or less, further preferably 5 nm or greater and 10 nm or less, approximately.

The insulator 272 is preferably formed under an atmosphere containing oxygen by a sputtering method. In this embodiment, as the insulator 272, an aluminum oxide film is formed in an atmosphere containing oxygen by a sputtering method. Accordingly, oxygen can be added to surfaces in contact with the insulator 272 (the side surfaces of the oxides 230a and 230b, the top surface of the insulator 224, and the like) and the periphery, so that the insulator 272 can be in an oxygen excess state. Although the oxygen is added as an oxygen radical here, for example, the state of the oxygen at the time of being added is not limited thereto. The oxygen may be added as an oxygen atom, an oxygen ion, or the like. Heat treatment in a later step or the like can diffuse oxygen so that oxygen can be supplied to the oxide 230b effectively.

The insulator 272 is preferably formed with heating the substrate. The substrate heating may be performed at a temperature higher than or equal to 250° C. and lower than or equal to 650° C., preferably higher than or equal to 350° C. and lower than or equal to 450° C. Alternatively, in the case where a metal which is likely to diffuse when heated such as Cu is used for the conductor, the temperature may be set to lower than or equal to 410° C., preferably lower than or equal to 400° C.

Even when impurities such as water or hydrogen are removed by the heat treatment in Step S04, if the substrate is exposed to outside air before the formation of the insulator 272, impurities such as water or hydrogen may enter the oxide 230 or the like again. However, as described in this embodiment, when the formation of the insulator 272 is successively performed without exposure to the air in the same deposition apparatus, following the heat treatment in Step S04, thereby the transistors 200 and 400 can be covered with the insulator 272 without entry of impurities such as water or hydrogen. Moreover, the insulator 272 can contain a larger amount of oxygen when oxygen is added to a site formed by the release of impurities such as water or hydrogen by the heat treatment in Step S04. In the case where heat treatment and the following deposition are performed in different chambers of a multi-chamber deposition apparatus, the insulator 272 can be formed without being influenced by impurities such as water or hydrogen released in the heat treatment.

Next, heat treatment is preferably performed. This step corresponds to Step S06 in the flow chart of FIG. 2. The above description can be referred to for the heat treatment.

In this embodiment, the heat treatment is performed at 400° C. in a nitrogen gas atmosphere for one hour.

By this heat treatment, oxygen added in Step S05 and the like and contained in the insulators 224, 250, and the like of the transistor 200 can be diffused. Therefore, oxygen vacancies in the oxides 230*a* to 230*c* can be reduced. Also in the transistor 400, oxygen contained in the insulators 224, 450, and the like can be diffused and supplied to the oxide 430, particularly to a channel formation region of the oxide 430. Here, the insulators 212, 214, 222, and 272 can prevent oxygen from diffusing over and under the transistors 200 and 400, and thus oxygen can be supplied to the oxides 230*b* and 430 effectively.

FIG. 18F is a schematic view illustrating states of hydrogen and water in the vicinity of the side surface of the oxide 230*b* (hereinafter, referred to as a region 299) when the heat treatment is performed. By the heat treatment, hydrogen contained in the insulator 224, the oxides 230*a* and 230*b*, and the like is gettered in the insulator 272 and diffused outward from the upper side of the insulator 272 as water. In this manner, the concentration of impurities such as hydrogen in the insulator 272 and the oxides 230*a* and 230*b* can be further reduced.

The insulator 272 is preferably formed using an insulating material which is less likely to transmit impurities such as water or hydrogen, and in this embodiment, is formed using aluminum oxide. Moreover, when the insulator 272 is formed by a sputtering method, the insulator 272 can be formed at a higher deposition rate than the insulator 274 and a stacked film of the insulators 272 and 274 can have a large thickness with high productivity. In this manner, a barrier property against impurities such as water or hydrogen can be improved with high productivity.

Note that the heat treatment in Step S06 may be performed after the formation of the insulator 274 in Step S07. In addition, in the case where the formation of the insulator 274 is performed with heating the substrate in Step 05, the heat treatment in Step S06 may be omitted.

Then, the insulator 274 is formed over the insulator 272 by an ALD method (see FIGS. 19A to 19E). This step corresponds to Step S07 in the flow chart of FIG. 2. In this embodiment, the thickness of the insulator 274 is 5 nm or greater and 20 nm or less, preferably 5 nm or greater and 10 nm or less, further preferably 5 nm or greater and 7 nm or less, approximately.

The insulator 274 is preferably formed using an insulating material which is less likely to transmit impurities such as water or hydrogen, and for example, is preferably formed using aluminum oxide or the like. When the insulator 274 is formed by an ALD method, formation of cracks, pinholes, or the like can be suppressed, and the insulator 274 can be formed with good coverage. Although the insulators 272 and 274 are formed over an uneven structure, by forming the insulator 274 by an ALD method, disconnection, cracks, pinholes, or the like are not formed, and the transistors 200 and 400 can be covered with the insulator 274. Thus, the barrier property against impurities such as water or hydrogen can be improved noticeably.

As described above, when the transistors 200 and 400 are positioned between the insulators 274 and 272 and the insulators 214 and 212, a large amount of oxygen can be contained in the insulator 224, the oxide 230, and the insulator 250 without diffusing outward. Furthermore, impurities such as water or hydrogen can be prevented from entering from an upper layer over the insulator 274 and a lower layer below the insulator 212, and thus the concentration of impurities in the insulator 224, the oxide 230, and the insulator 250 can be lowered.

In this manner, oxygen vacancies in the oxide 230*b* functioning as an active layer of the transistor 200 are reduced, and the concentration of impurities such as water or hydrogen is reduced; accordingly, the electrical characteristics of the transistor 200 are made stable, and the reliability can be improved.

Then, the insulator 280 is formed over the insulator 274. This step corresponds to Step S11 in the flow chart of FIG. 3. In this embodiment, a silicon nitride film formed by a plasma CVD method is used as the insulator 280.

Next, CMP treatment is performed to reduce unevenness of a surface of the insulator 280 (see FIGS. 20A to 20E). This step corresponds to Step S12 in the flow chart of FIG. 3.

Then, in the insulators 216, 220, 222, 224, 272, 274, and 280, the opening 480 is formed to reach the insulator 214 (see FIGS. 21A to 21E). This step corresponds to Step S13 in the flow chart of FIG. 3. Note that although part of the opening 480 extending in the W1-W2 direction is illustrated in FIG. 22A, the opening 480 is formed to surround the transistors 200 and 400.

Here, the opening 480 is preferably formed inside dicing lines or scribe lines along which the semiconductor device 1000 is cut out. In this way, even when the semiconductor device 1000 is cut out, the side surfaces of the insulator 280, the insulator 224, the insulator 216, and the like remain sealed with the insulators 282 and 284 which are formed in a later step; therefore, impurities such as water or hydrogen can be prevented from diffusing from the insulators into the transistors 200 and 400. Note that a plurality of regions surrounded by the opening 480 may be provided inside the dicing lines or the scribe lines, and a plurality of semiconductor devices may be sealed with the insulators 282 and 284 separately.

Subsequently, like Step S04, the substrate is carried into the deposition apparatus including a plurality of chambers, and heat treatment is performed in the chamber of the deposition apparatus. This step corresponds to Step S14 in the flow chart of FIG. 3. By this treatment, moisture such as adsorbed water can be removed before the insulator 282 is formed.

Then, like Step S05, the insulator 282 is formed by a sputtering method in a different chamber of the above deposition apparatus from the chamber in which the heat treatment is performed. This step corresponds to Step S15 in the flow chart of FIG. 3. The formation of the insulator 282 is successively performed following the heat treatment in Step S14 without exposure to the outside air.

The insulator 282 is formed in contact with the top surface of the insulator 214 in the opening 480. Thus, the transistors 200 and 400 can be surrounded and sealed with the insulator 282 in not only a perpendicular direction but also a lateral direction of the substrate. Accordingly, impurities such as water or hydrogen can be prevented from diffusing from the outside of the insulator 282 into the transistors 200 and 400.

As described in this embodiment, when the formation of the insulator 282 is successively performed following the heat treatment in Step S14 in the same deposition apparatus without exposure to the outside air, the transistors 200 and 400 can be covered with the insulator 282 without entry of impurities such as water or hydrogen. Moreover, the insulator 282 can contain a larger amount of oxygen by adding oxygen to a site formed by the release of impurities such as water or hydrogen in the heat treatment in Step S14. In the case where heat treatment and the formation of the insulator 282 are performed in different chambers of a multi-chamber deposition apparatus, the insulator 282 can be formed without being influenced by impurities such as water or hydrogen released in the heat treatment.

Next, like Step S06, heat treatment is preferably performed. This step corresponds to Step S16 in the flow chart of FIG. 3. Like Step S06, by the heat treatment, hydrogen contained in the insulator 280 and the like can be gettered in the insulator 282 and diffused outward from the upper side of the insulator 282 as water. In this manner, the concentration of impurities such as hydrogen contained in the insulator 280 can be reduced. Note that the heat treatment in Step S16 may be performed after the formation of the insulator 284 in Step S17. In addition, in the case where formation is performed with heating the substrate in Step S15, the heat treatment in Step S16 can be omitted.

Then, the insulator 284 is formed over the insulator 282 by an ALD method (see FIGS. 22A to 22E). This step corresponds to Step S17 in the flow chart of FIG. 3.

The insulator 284 is preferably formed using an insulating material which is less likely to transmit impurities such as water or hydrogen, and for example, is preferably formed using aluminum oxide or the like. When the insulator 284 is formed by an ALD method, formation of cracks, pinholes, or the like can be suppressed, and the insulator 284 can be formed with good coverage. The insulator 284 can be formed without disconnection even in the opening 480 when formed by an ALD method; thus, the barrier property against impurities can be further improved.

Through the above steps, the transistor 200, the transistor 400, and the semiconductor device 1000 are formed. By the above-described manufacturing method, the transistors 200 and 400 having different structures can be provided over the same substrate through substantially the same process. Moreover, according to the above-described manufacturing method, the transistor 400 is not necessarily manufactured after the transistor 200 is manufactured, for example; thus, the producibility of the semiconductor device can be increased.

In the transistor 200, a channel is formed in the oxide 230b, which is in contact with the oxides 230a and 230c. In the transistor 400, a channel is formed in the oxide 430, which is in contact with the insulators 224 and 450. Thus, the transistor 400 is likely to be affected by interface scattering compared with the transistor 200. The electron affinity of the oxide 430 in this embodiment is lower than that of the oxide 230b. Thus, the transistor 400 can have higher $V_{th}$ than the transistor 200 and small $I_{cut}$.

Modification Example

The structure of the semiconductor device in this embodiment is not limited to the structure in FIGS. 1A to 1E. For example, a structure in FIGS. 23A to 23E may be employed.

The semiconductor device 1000 in FIGS. 23A to 23E is different from the semiconductor device 1000 in FIGS. 1A to 1E in that the opening 480 is formed in the insulators 216, 220, 222, and 224 and the insulator 272 is in contact with a top surface of the insulator 214. Thus, the transistors 200 and 400 are contained in the insulators 212, 214, 272, and 274. In this case, even when the insulators 282 and 284 are not provided, entry of impurities such as water or hydrogen from the side surfaces of the insulators 216 and 224 can be prevented.

Moreover, the semiconductor device 1000 in FIGS. 23A to 23E is different from the semiconductor device 1000 in FIGS. 1A to 1E in that the layer 270, the insulator 250, and the oxide 230c extend beyond the end portions of the conductor 260 and overlap with each other in the extending portions, and end portions of the layer 270, the insulator 250, and the oxide 230c are substantially aligned. In this structure, the insulator 272 and side surfaces of the insulator 250 are in contact with each other. Therefore, the insulator 272 can supply oxygen to the insulator 250. Furthermore, impurities such as hydrogen contained in the insulator 250 can be gettered in the insulator 272 and diffused outward.

As described above, one embodiment of the present invention can provide a semiconductor device having favorable reliability. Alternatively, according to one embodiment of the present invention, a semiconductor device including an oxide semiconductor in which the concentration of impurities is reduced can be provided. Alternatively, according to one embodiment of the present invention, a semiconductor device including an oxide semiconductor in which oxygen vacancies are reduced can be provided.

This embodiment can be implemented in an appropriate combination with any of the structures described in the other embodiments, example, and the like.

Embodiment 2

In this embodiment, embodiments of semiconductor devices will be described with reference to FIG. 24, FIG. 25, and FIG. 26.

[Memory Device]

Figure 24:
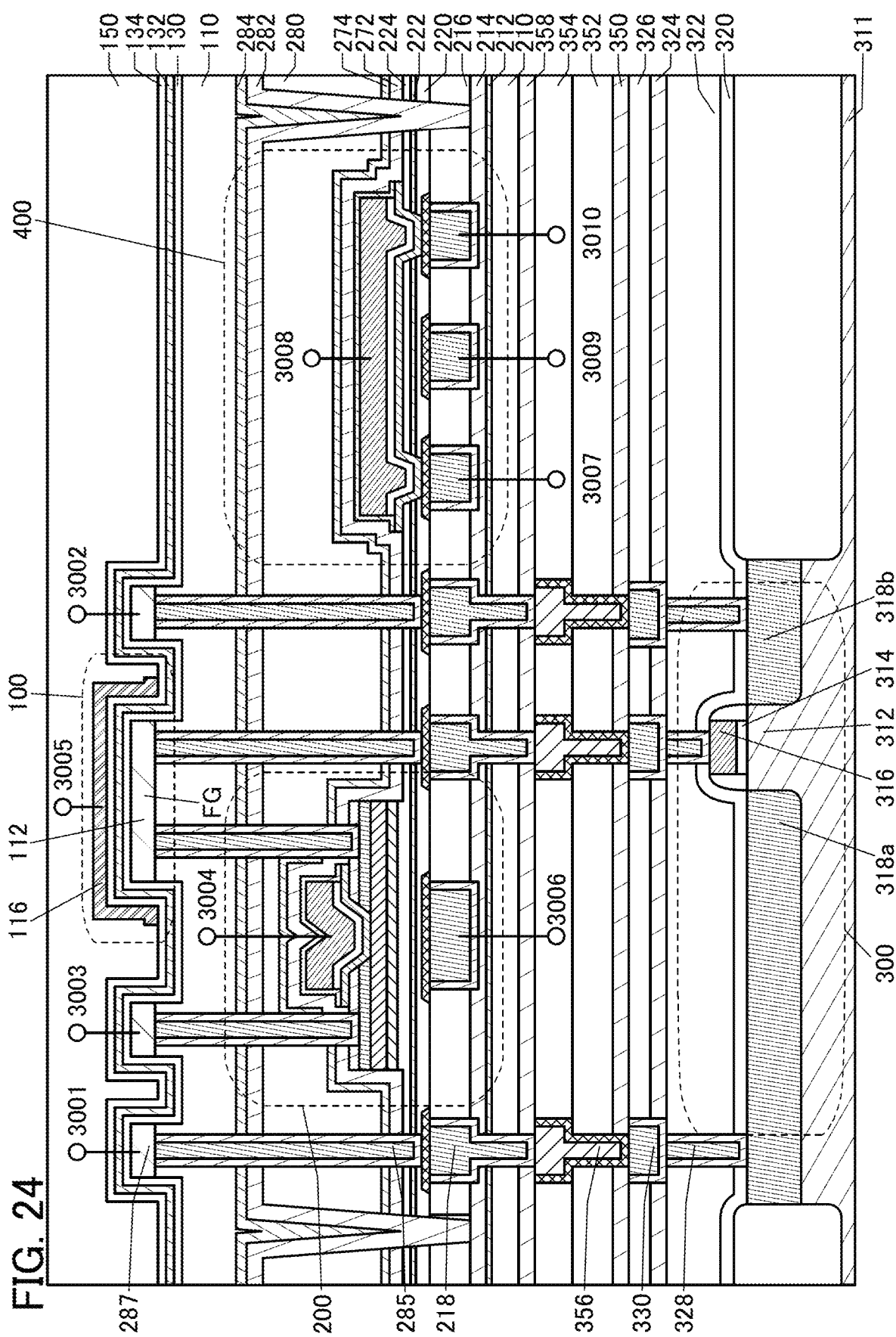
FIG. 24 is a cross-sectional view of a semiconductor device of one embodiment of the present invention.
Figure 25:
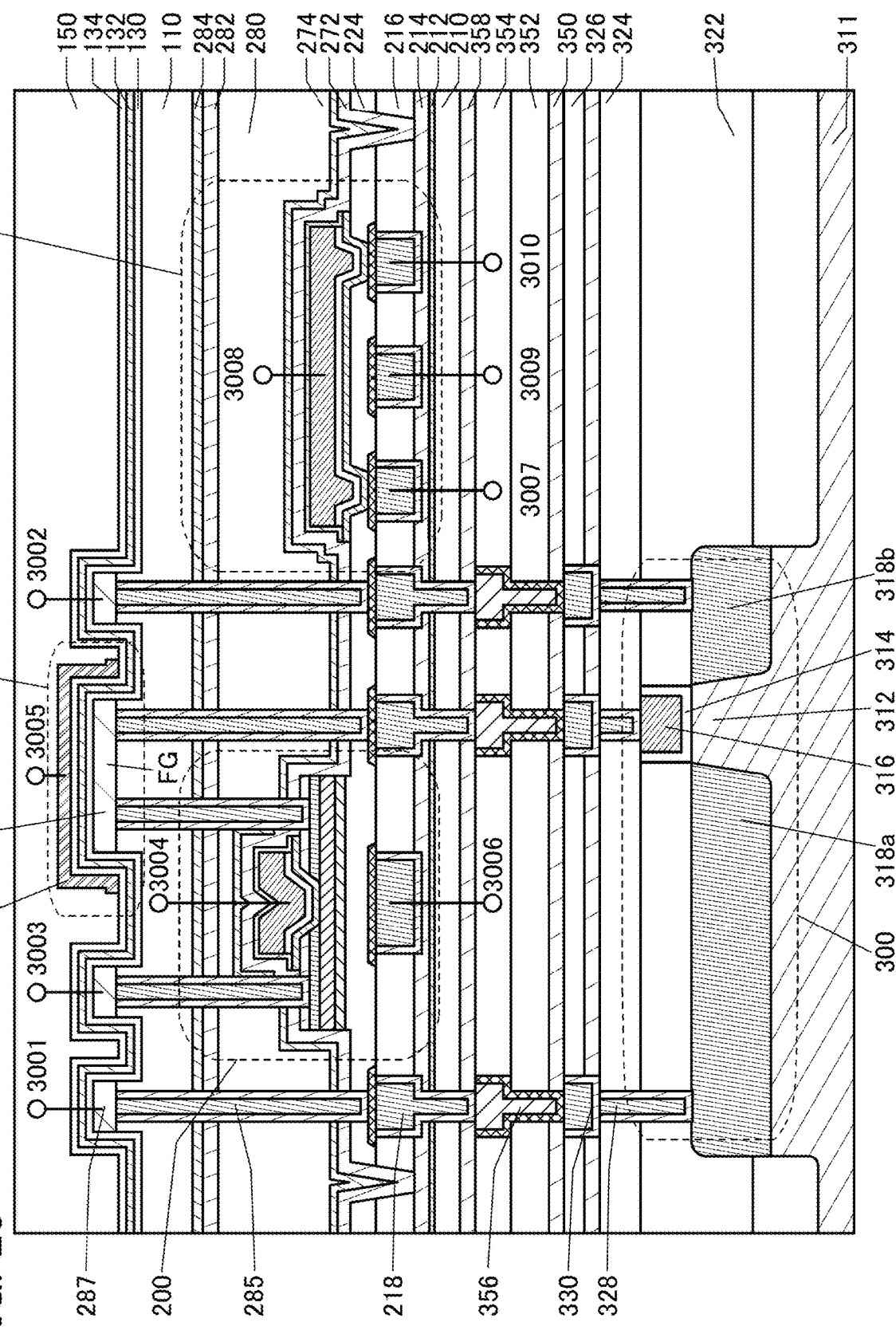
FIG. 25 is a cross-sectional view of a semiconductor device of one embodiment of the present invention.
Figure 26:
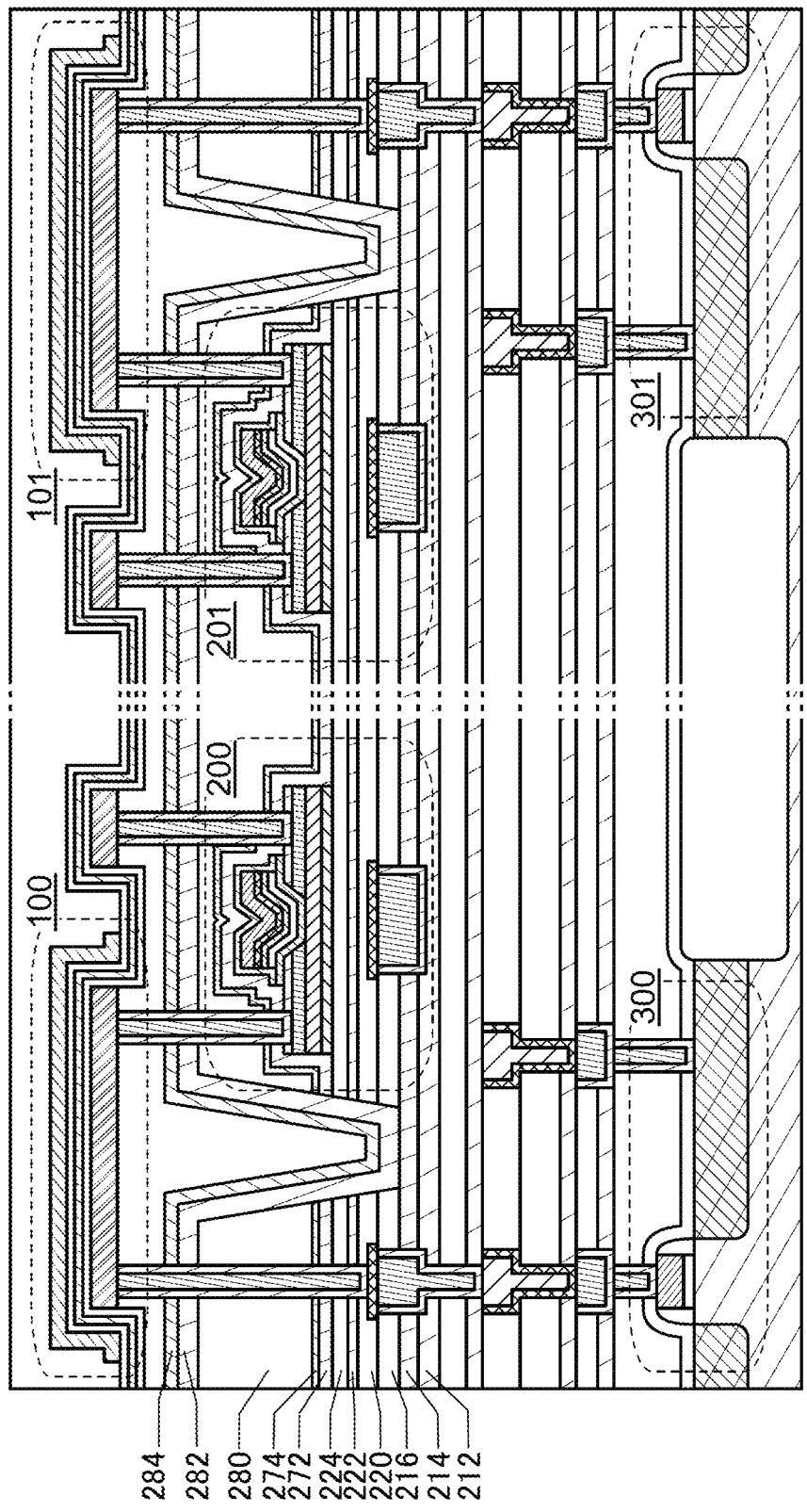
FIG. 26 is a cross-sectional view of a semiconductor device of one embodiment of the present invention.

FIGS. 24 to 26 each illustrate an example of a memory device using the semiconductor device of one embodiment of the present invention.

The memory devices in FIG. 24 and FIG. 25 each include the transistor 400, a transistor 300, the transistor 200, and a capacitor 100. The transistors 200 and 400 are similar to those described in the Embodiment 1.

The transistor 200 is a transistor in which a channel is formed in a semiconductor layer including an oxide semiconductor. Since the off-state current of the transistor 200 is small, by using the transistor 200 in a memory device, stored data can be retained for a long time. In other words, such a memory device does not require refresh operation or has an extremely low frequency of the refresh operation, which leads to a sufficient reduction in power consumption of the memory device.

Moreover, supplying a negative potential to a back gate of the transistor 200 can further reduce the off-state current of the transistor 200. In that case, with a structure capable of maintaining the back gate voltage of the transistor 200, stored data can be retained for a long time without power supply.

The back gate voltage of the transistor 200 is controlled by the transistor 400. For example, a top gate and a back gate of the transistor 400 are diode-connected to a source thereof, and the source of the transistor 400 and the back gate of the transistor 200 are connected to each other. When the negative potential of the back gate of the transistor 200 is held in the structure, the top gate-source voltage and the back gate-source voltage of the transistor 400 are each 0 V. As described in the above embodiment, the $I_{cut}$ of the transistor 400 is extremely small. Thus, the structure allows the negative potential of the back gate of the transistor 200 to be held for a long time without power supply to the transistor 200 and the transistor 400. Accordingly, the memory device including the transistor 200 and the transistor 400 can retain stored data for a long time.

In FIG. 24 and FIG. 25, a wiring 3001 is electrically connected to a source of the transistor 300, and a wiring 3002 is electrically connected to a drain of the transistor 300. A wiring 3003 is electrically connected to one of a source and a drain of the transistor 200, a wiring 3004 is electrically connected to a gate of the transistor 200, and a wiring 3006 is electrically connected to the back gate of transistor 200. A gate of the transistor 300 and the other of the source and the drain of the transistor 200 are electrically connected to one electrode of the capacitor 100. A wiring 3005 is electrically connected to the other electrode of the capacitor 100. A wiring 3007 is electrically connected to the source of the transistor 400, a wiring 3008 is electrically connected to the gate of the transistor 400, a wiring 3009 is electrically connected to the back gate of the transistor 400, and a wiring 3010 is electrically connected to the drain of the transistor 400. The wiring 3006, the wiring 3007, the wiring 3008, and the wiring 3009 are electrically connected to each other.

<Memory Device Configuration 1>

The memory devices in FIG. 24 and FIG. 25 have a feature that the potential of the gate of the transistor 300 can be held, and thus enables writing, retaining, and reading of data as follows.

Writing and retaining of data will be described. First, the potential of the wiring 3004 is set to a potential at which the transistor 200 is on, so that the transistor 200 is turned on. Accordingly, the potential of the wiring 3003 is supplied to a node FG where the gate of the transistor 300 and the one electrode of the capacitor 100 are electrically connected to each other. That is, predetermined charge is supplied to the gate of the transistor 300 (writing). Here, one of two kinds of charge that provide different potential levels (hereinafter, referred to as low-level charge and high-level charge) is supplied. After that, the potential of the wiring 3004 is set to a potential at which the transistor 200 is off, so that the transistor 200 is turned off. Thus, the charge is retained in the node FG (retaining).

Since the off-state current of the transistor 200 is small, the charge of the node FG is retained for a long time.

Next, reading of data will be described. An appropriate potential (reading potential) is supplied to the wiring 3005 while a predetermined potential (constant potential) is supplied to the wiring 3001, whereby the potential of the wiring 3002 varies depending on the amount of charge retained in the node FG. This is because in the case of using an n-channel transistor as the transistor 300, an apparent threshold voltage $V_{th\_H}$ at the time when the high-level charge is given to the gate of the transistor 300 is lower than an apparent threshold voltage $V_{th\_L}$ at the time when the low-level charge is given to the gate of the transistor 300. Here, an apparent threshold voltage refers to the potential of the wiring 3005 which is needed to turn on the transistor 300. Thus, the potential of the wiring 3005 is set to a potential $V_0$ which is between $V_{th\_H}$ and $V_{th\_L}$, whereby charge supplied to the node FG can be determined. For example, in the case where the high-level charge is supplied to the node FG in writing, the transistor 300 is turned on when the potential of the wiring 3005 becomes $V_0$ ($>V_{th\_H}$). In the case where the low-level charge is supplied to the node FG in writing, the transistor 300 still remains off even when the potential of the wiring 3005 becomes $V_0$ ($<V_{th\_L}$). Thus, the data retained in the node FG can be read by determining the potential of the wiring 3002.

By arranging the memory devices illustrated in FIG. 24 and FIG. 25 in a matrix, a memory cell array can be formed.

Note that in the case where memory cells are arrayed, it is necessary that data of a desired memory cell be read in read operation. For example, in the case of a NOR-type memory cell array, only data of a desired memory cell can be read by turning off the transistors 300 of memory cells from which data is not read. In this case, a potential at which the transistor 300 is turned off regardless of the charge supplied to the node FG, that is, a potential lower than $V_{th\_H}$ is supplied to the wiring 3005 connected to the memory cells from which data is not read. Alternatively, in the case of a NAND-type memory cell array, for example, only data of a desired memory cell can be read by turning on the transistors 300 of memory cells from which data is not read. In this case, a potential at which the transistor 300 is turned on regardless of the charge supplied to the node FG, that is, a potential higher than $V_{th\_L}$ is supplied to the wiring 3005 connected to the memory cells from which data is not read.

<Memory Device Configuration 2>

The memory devices illustrated in FIG. 24 and FIG. 25 do not necessarily include the transistor 300. Also in that case, data can be written and retained in a manner similar to that of the memory device described above.

For example, data reading in the memory device without the transistor 300 will be described. When the transistor 200 is turned on, the wiring 3003 which is in a floating state and the capacitor 100 are brought into conduction, and the charge is redistributed between the wiring 3003 and the capacitor 100. As a result, the potential of the wiring 3003 is changed. The amount of change in the potential of the wiring 3003 varies depending on the potential of the one electrode of the capacitor 100 (or the charge accumulated in the capacitor 100).

For example, the potential of the wiring 3003 after the charge redistribution is $(C_B \times V_{B0} + C \times V)/(C_B + C)$, where V is the potential of the one electrode of the capacitor 100, C is the capacitance of the capacitor 100, $C_B$ is the capacitance component of the wiring 3003, and $V_{B0}$ is the potential of the wiring 3003 before the charge redistribution. Thus, it can be found that, assuming that the memory cell is in either of two states in which the potential of the one electrode of the capacitor 100 is $V_1$ and $V_0$ ($V_1 > V_0$), the potential of the wiring 3003 when the potential $V_1$ is retained ($=(C_B \times V_{B0} + C \times V_1)/(C_B + C)$) is higher than the potential of the wiring 3003 when the potential $V_0$ is retained ($=(C_B \times V_{B0} + C \times V_0)/(C_B + C)$).

Then, by comparing the potential of the wiring 3003 with a predetermined potential, data can be read.

In the case of employing the configuration, a transistor using silicon may be used for a driver circuit for driving a memory cell, and a transistor using an oxide semiconductor may be stacked as the transistor 200 over the driver circuit.

When including a transistor using an oxide semiconductor and having a small off-state current, the memory device described above can retain stored data for a long time. In other words, power consumption of the memory device can be reduced because refresh operation becomes unnecessary or the frequency of refresh operation can be extremely low. Moreover, stored data can be retained for a long time even when power is not supplied (note that a potential is preferably fixed).

In the memory device, a high voltage is not needed for data writing and deterioration of elements is unlikely to occur. Unlike in a conventional nonvolatile memory, for example, it is not necessary to inject and extract electrons into and from a floating gate; thus, a problem such as deterioration of an insulator is not caused. That is, unlike a conventional nonvolatile memory, the memory device of one embodiment of the present invention does not have a limit on the number of times data can be rewritten and the reliability thereof is drastically improved. Furthermore, data is written depending on the on/off state of the transistor, whereby high-speed operation can be achieved.

<Memory Device Structure 1>

FIG. 24 illustrates an example of the memory device of one embodiment of the present invention. The memory device includes the transistor 400, the transistor 300, the transistor 200, and the capacitor 100. The transistor 200 is provided over the transistor 300, and the capacitor 100 is provided over the transistor 300 and the transistor 200.

The transistor 300 is provided over a substrate 311 and includes a conductor 316, an insulator 314, a semiconductor region 312 that is part of the substrate 311, and low-resistance regions 318a and 318b functioning as source and drain regions.

The transistor 300 is either a p-channel transistor or an n-channel transistor.

It is preferable that a region of the semiconductor region 312 where a channel is formed, a region in the vicinity thereof, the low-resistance regions 318a and 318b functioning as source and drain regions, and the like include a semiconductor such as a silicon-based semiconductor, more preferably single crystal silicon. Alternatively, a material including germanium (Ge), silicon germanium (SiGe), gallium arsenide (GaAs), gallium aluminum arsenide (GaAlAs), or the like may be included. Silicon whose effective mass is controlled by applying stress to the crystal lattice and thereby changing the lattice spacing may be included. Alternatively, the transistor 300 may be a high-electron-mobility transistor (HEMT) with GaAs and GaAlAs or the like.

The low-resistance regions 318a and 318b include an element which imparts n-type conductivity, such as arsenic or phosphorus, or an element which imparts p-type conductivity, such as boron, in addition to a semiconductor material used for the semiconductor region 312.

The conductor 316 functioning as a gate electrode can be formed using a semiconductor material such as silicon including an element which imparts n-type conductivity, such as arsenic and phosphorus, or an element which imparts p-type conductivity, such as boron, or a conductive material such as a metal material and an alloy material or a metal oxide material.

Note that the work function of a conductor is determined by a material of the conductor, whereby the threshold voltage can be adjusted. Specifically, it is preferable to use titanium nitride, tantalum nitride, or the like as the conductor. Furthermore, in order to ensure the conductivity and embeddability of the conductor, it is preferable to use a laminated layer of metal materials such as tungsten and aluminum as the conductor. In particular, tungsten is preferable in terms of heat resistance.

Note that the transistors 300 illustrated in FIG. 24 and FIG. 25 are just examples and are not limited to the structures illustrated therein; an appropriate transistor may be used in accordance with a circuit configuration or a driving method. Note that when the memory device has the structure described in <Memory Device Configuration 2>, the transistor 300 is not necessarily provided.

An insulator 320, an insulator 322, an insulator 324, and an insulator 326 are stacked in this order so as to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 322 may function as a planarization film for eliminating a level difference caused by the transistor 300 or the like underlying the insulator 322. The top surface of the insulator 322 may be planarized by planarization treatment using a CMP method or the like to increase the level of planarity.

The insulator 324 is preferably formed using a film with a barrier property that prevents hydrogen and impurities from diffusing from the substrate 311, the transistor 300, or the like into regions where the transistor 200 and the transistor 400 are provided. A barrier property refers to a function of inhibiting the diffusion of impurities typified by hydrogen and water. For example, the diffusion length of hydrogen in the film with a barrier property at 350° C. or at 400° C. is less than or equal to 50 nm per hour, preferably less than or equal to 30 nm per hour, more preferably less than or equal to 20 nm per hour.

As an example of the film having a barrier property against hydrogen, silicon nitride formed by a CVD method can be given. The diffusion of hydrogen into a semiconductor element including an oxide semiconductor, such as the transistor 200, degrades the characteristics of the semiconductor element in some cases. Therefore, a film that inhibits the diffusion of hydrogen is preferably provided between the transistors 200 and 400 and the transistor 300. Specifically, the film that inhibits the diffusion of hydrogen is a film from which hydrogen is unlikely to be released.

The released amount of hydrogen can be measured by TDS, for example. The amount of hydrogen released from the insulator 324 that is converted into hydrogen molecules per unit area of the insulator 324 is less than or equal to $2 \times 10^{15}$ molecules/cm$^2$, preferably less than or equal to $1 \times 10^{15}$ molecules/cm$^2$, more preferably $5 \times 10^{14}$ molecules/cm$^2$ in TDS analysis in the range from 50° C. to 500° C., for example.

Note that the dielectric constant of the insulator 326 is preferably lower than that of the insulator 324. For example, the relative dielectric constant of the insulator 326 is preferably lower than 4, more preferably lower than 3. For example, the relative dielectric constant of the insulator 324 is preferably 0.7 times or less that of the insulator 326, more preferably 0.6 times or less that of the insulator 326. In the case where a material with a low dielectric constant is used for an interlayer film, the parasitic capacitance between wirings can be reduced.

A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 each function as a plug or a wiring. Note that a plurality of structures of conductors functioning as plugs or wirings are collectively denoted by the same reference numeral in some cases, as described later. Furthermore, in this specification and the like, a wiring and a plug electrically connected to the wiring may be a single component. That is, there are cases where part of a conductor functions as a wiring and part of a conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 24, an insulator 350, an insulator 352, and an insulator 354 are stacked in this order. Furthermore, a conductor 356 is formed in the insulator 350, the insulator 352, and the insulator 354. The conductor 356 functions as a plug or a wiring. Note that the conductor 356 can be formed using a material similar to that for the conductor 328 and the conductor 330.

Note that for example, the insulator 350 is preferably formed using an insulator having a barrier property against hydrogen, like the insulator 324. Furthermore, the conductor 356 preferably includes a conductor having a barrier property against hydrogen. The conductor having a barrier property against hydrogen is formed particularly in an opening portion of the insulator 350 having a barrier property against hydrogen. In such a structure, the transistor 300 can be separated from the transistors 200 and 400 by a barrier layer, so that the diffusion of hydrogen from the transistor 300 into the transistors 200 and 400 can be inhibited.

Note that as the conductor having a barrier property against hydrogen, tantalum nitride is preferably used, for example. By stacking tantalum nitride and tungsten, which has high conductivity, the diffusion of hydrogen from the transistor 300 can be inhibited while the conductivity of a wiring is ensured. In this case, a tantalum nitride layer having a barrier property against hydrogen is preferably in contact with the insulator 350 having a barrier property against hydrogen.

An insulator 358, an insulator 210, the insulator 212, the insulator 214, and the insulator 216 are stacked in this order over the insulator 354. A material having a barrier property against oxygen or hydrogen is preferably used for any of the insulator 358, the insulator 210, the insulator 212, the insulator 214, and the insulator 216.

The insulator 358, the insulator 212, and the insulator 214 are each preferably formed using, for example, a film having a barrier property that prevents hydrogen or impurities from diffusing from the substrate 311, a region where the transistor 300 is provided, or the like into the regions where the transistor 200 and the transistor 400 are provided. Therefore, the insulator 358, the insulator 212, and the insulator 214 can be formed using a material similar to that for the insulator 324.

As an example of the film having a barrier property against hydrogen, silicon nitride deposited by a CVD method can be given. The diffusion of hydrogen into a semiconductor element including an oxide semiconductor, such as the transistor 200, degrades the characteristics of the semiconductor element in some cases. Therefore, a film that inhibits the diffusion of hydrogen is preferably provided between the transistors 200 and 400 and the transistor 300. Specifically, the film that inhibits the diffusion of hydrogen is a film from which hydrogen is unlikely to be released.

For each of the insulator 212 and the insulator 214, for example, a metal oxide such as aluminum oxide, hafnium oxide, and tantalum oxide is preferably used as the film having a barrier property against hydrogen.

In particular, aluminum oxide has an excellent blocking effect that prevents the passage of oxygen and impurities such as water or hydrogen, which cause a change in electrical characteristics of the transistor. Accordingly, the use of aluminum oxide can prevent entry of impurities such as water or hydrogen into the transistors 200 and 400 in and after a manufacturing process of the transistor. In addition, release of oxygen from the oxide in the transistor 200 can be inhibited. Therefore, aluminum oxide is suitably used as a protective film for the transistors 200 and 400.

In addition, the insulator 210 and the insulator 216 can be formed using a material similar to that for the insulator 320. The use of a material with a relatively low dielectric constant for the insulators can reduce the parasitic capacitance between wirings. For example, a silicon oxide film, a silicon oxynitride film, and the like can be used as the insulator 216.

A conductor 218, conductors included in the transistor 200 and the transistor 400 (the conductor 205, the conductor 405, the conductor 403, and the conductor 407), and the like are embedded in the insulator 358, the insulator 210, the insulator 212, the insulator 214, and the insulator 216. Note that the conductor 218 functions as a plug or a wiring that is electrically connected to the capacitor 100 or the transistor 300. The conductor 218 can be formed using a material similar to that for the conductor 328 and the conductor 330.

In particular, the conductor 218 in a region in contact with the insulator 358, the insulator 212, and the insulator 214 is preferably a conductor having a barrier property against oxygen, hydrogen, and water. In such a structure, the transistor 300 and the transistor 200 can be completely separated by the layer having a barrier property against oxygen, hydrogen, and water, so that the diffusion of hydrogen from the transistor 300 into the transistors 200 and 400 can be inhibited.

The transistor 200 and the transistor 400 are provided over the insulator 216. Note that as the transistors 200 and 400, the transistors 200 and 400 described in Embodiment 1 are preferably used.

An insulator 110 is provided over the transistor 200 and the transistor 400. The insulator 110 can be formed using a material similar to that for the insulator 320. The use of a material with a relatively low dielectric constant for the insulator can reduce the parasitic capacitance between wirings. For example, a silicon oxide film, a silicon oxynitride film, and the like can be used as the insulator 110.

A conductor 285 and the like are embedded in the insulator 220, the insulator 222, the insulator 224, the insulator 272, the insulator 274, and the insulator 110.

Note that the conductor 285 functions as a plug or a wiring that is electrically connected to the capacitor 100, the transistor 200, or the transistor 300. The conductor 285 can be formed using a material similar to that for the conductor 328 and the conductor 330.

For example, in the case where the conductor 285 is formed to have a stacked-layer structure, it preferably includes a conductor that is unlikely to be oxidized (that has high oxidation resistance). It is particularly preferred that a conductor having high oxidation resistance be provided so as to be in contact with the insulator 224 including an excess oxygen region. Such a structure permits inhibition of absorption of excess oxygen from the insulator 224 by the conductor 285. Furthermore, the conductor 285 preferably includes a conductor having a barrier property against hydrogen. In particular, when a conductor having a barrier property against impurities such as hydrogen is provided in contact with the insulator 224 including an excess oxygen region, the diffusion of impurities in the conductor 285 and part of the conductor 285 and the diffusion of impurities from the outside through the conductor 285 can be inhibited.

A conductor 287, the capacitor 100, and the like are provided over the insulator 110 and the conductor 285. The capacitor 100 includes a conductor 112, an insulator 130, an insulator 132, an insulator 134, and a conductor 116. The conductor 112 and the conductor 116 function as the electrodes of the capacitor 100, and the insulator 130, the insulator 132, and the insulator 134 function as dielectrics of the capacitor 100.

Note that the conductor 287 functions as a plug or a wiring that is electrically connected to the capacitor 100, the transistor 200, or the transistor 300. The conductor 112 functions as the one electrode of the capacitor 100. The conductor 287 and the conductor 112 can be formed at the same time.

For the conductor 287 and the conductor 112, a metal film containing an element selected from molybdenum, titanium, tantalum, tungsten, aluminum, copper, chromium, neodymium, and scandium; a metal nitride film containing any of the above elements as its component (e.g., a tantalum nitride film, a titanium nitride film, a molybdenum nitride film, and a tungsten nitride film); and the like can be used. Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, and indium tin oxide to which silicon oxide is added can be used.

The insulator 130, the insulator 132, and the insulator 134 can each be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, and the like.

For example, the use of a high dielectric constant (high-k) material, such as aluminum oxide, for the insulator 132 can increase the capacitance per unit area of the capacitor 100. Furthermore, a material having high dielectric strength, such as silicon oxynitride, is preferably used for the insulator 130 and the insulator 134. When a ferroelectric is located between insulators with high dielectric strength, electrostatic breakdown of the capacitor 100 can be suppressed and the capacitor can have large capacitance.

The conductor 116 is provided so as to cover the top and side surfaces of the conductor 112 with the insulator 130, the insulator 132, and the insulator 134 therebetween. In the structure where the side surfaces of the conductor 112 are wrapped by the conductor 116 with the insulators therebetween, capacitance is also formed on the side surfaces of the conductor 112, resulting in an increase in the capacitance per unit projected area of the capacitor. Thus, the memory device can be reduced in area, highly integrated, and miniaturized.

Note that the conductor 116 can be formed using a conductive material such as a metal material, an alloy material, or a metal oxide material. It is preferable to use a high-melting-point material which has both heat resistance and conductivity, such as tungsten or molybdenum, and it is particularly preferable to use tungsten. In the case where the conductor 116 is formed concurrently with another component such as a conductor, Cu, Al, or the like, which is a low-resistance metal material, may be used.

An insulator 150 is provided over the conductor 116 and the insulator 134. The insulator 150 can be formed using a material similar to that for the insulator 320. The insulator 150 may function as a planarization film that covers roughness due to underlying layers.

The above is the description of the structure example. With the use of the structure, a change in electrical characteristics can be suppressed and reliability can be improved in a memory device including a transistor including an oxide semiconductor. Alternatively, a transistor including an oxide semiconductor with a large on-state current can be provided. A transistor including an oxide semiconductor with a small off-state current can be provided. Alternatively, a memory device with low power consumption can be provided.

Modification Example 1

FIG. 25 illustrates a modification example of the memory device. FIG. 25 is different from FIG. 24 in the structure of the transistor 300 and the shape or the like of the insulators 272 and 274.

In the transistor 300 illustrated in FIG. 25, the semiconductor region 312 (part of the substrate 311) in which a channel is formed includes a protruding portion. Furthermore, the conductor 316 is provided so as to cover the top and side surfaces of the semiconductor region 312 with the insulator 314 therebetween. Note that the conductor 316 may be formed using a material for adjusting the work function. The transistor 300 is also referred to as a FIN transistor because it utilizes a protruding portion of the semiconductor substrate. An insulator functioning as a mask for forming the protruding portion may be provided in contact with the top surface of the protruding portion. Although the case where the protruding portion is formed by processing part of the semiconductor substrate is described here, a semiconductor film having a protruding portion may be formed by processing an SOI substrate.

The use of a combination of the transistor 300 and the transistor 200 that have the structure enables a reduction in area, high integration, and miniaturization.

Moreover, as illustrated in FIG. 25, the insulator 220 and the insulator 222 are not necessarily provided. Such a structure can increase the producibility.

Furthermore, as illustrated in FIG. 25, a bottom surface of the insulator 272 and a top surface of the insulator 214 may be in contact with each other in openings formed in the insulator 216 and the insulator 224.

The above is the description of the modification example. With the use of the structure, a change in electrical characteristics can be suppressed and reliability can be improved in a memory device including a transistor including an oxide semiconductor. Furthermore, a transistor including an oxide semiconductor with a large on-state current can be provided. Furthermore, a transistor including an oxide semiconductor with a small off-state current can be provided. Furthermore, a memory device with low power consumption can be provided.

Modification Example 2

FIG. 26 illustrates a modification example of this embodiment. FIG. 26 is a cross-sectional view which shows part of a row in which the memory devices each of which is illustrated in FIG. 24 are arranged in a matrix.

In FIG. 26, the memory device which includes the transistor 300, the transistor 200, and the capacitor 100 and the memory device which includes a transistor 301, a transistor 201, and a capacitor 101 are arranged in the same row.

As illustrated in FIG. 26, a plurality of transistors (the transistors 200 and 201 in the figure) and the insulator 224 including an oxygen-excess region may be enclosed with a stacked-layer structure of the insulators 212 and 214 and a stacked-layer structure of the insulators 282 and 284. At that time, a structure in which the insulators 212 and 214 and the insulators 282 and 284 are stacked is preferably formed between the transistor 200 or 201 and a through electrode which connects the transistor 300 or 301 and the capacitor 100 or 101.

Note that an opening formed in the insulators 216, 220, 222, 224, 272, 274, and 280 can be formed at the same time as the opening 480 described in Embodiment 1.

Thus, oxygen released from the insulator 224 and the transistors 200 and 201 can be inhibited from diffusing into the layer where the capacitors 100 and 101 are formed or the layer where the transistor 300 and 301 are formed. Furthermore, impurities such as water or hydrogen can be inhibited from diffusing from a layer above the insulator 282 and a layer below the insulator 214 into the transistor 200 or 201.

That is, oxygen can be efficiently supplied from the excess-oxygen region of the insulator 224 to oxide where channels are formed in the transistors 200 and 201, so that oxygen vacancies can be reduced. Moreover, oxygen vacancies can be prevented from being formed by impurities in the oxide where a channel is formed in the transistor 200. Thus, the oxide where channels are formed in the transistors 200 and 201 can be an oxide semiconductor with a low density of defect states and stable characteristics. That is, a change in electrical characteristics of the transistors 200 and 201 can be prevented and the reliability can be improved.

At least part of this embodiment can be implemented in combination with any of the other embodiments described in this specification as appropriate.

EXAMPLE

In this example, the transistor 200 including the insulators 272 and 274 that is one embodiment of the present invention illustrated in FIGS. 1A to 1E was formed and subjected to an electrical characteristics test and a reliability test (Sample A and Sample B). In addition, a transistor not including the insulators 272 and 274 was formed for comparison (Sample C).

In the fabrication process of Samples A to C, a silicon oxide film was formed over a p-type silicon single crystal wafer to a thickness of 400 nm by a thermal oxidation method. In addition, a silicon nitride film was formed over the silicon oxide film to a thickness of 50 nm by a CVD method. Next, a first aluminum oxide film was formed over the silicon nitride film to a thickness of 10 nm by an ALD method and a second aluminum oxide film was formed over the first aluminum oxide film to a thickness of 40 nm by a sputtering method.

Next, a first silicon oxynitride film was formed over the second aluminum oxide film to a thickness of 160 nm by a CVD method and a first tungsten film was formed over the first silicon oxynitride film to a thickness of 35 nm by a sputtering method. Then, the first tungsten film was processed by a lithography method, and a hard mask including the first tungsten film was formed.

Subsequently, the silicon nitride film, the first aluminum oxide film, the second aluminum oxide film, and the first silicon oxynitride film were processed by a dual damascene method to form a contact hole and a groove to be a wiring. In the contact hole and the groove, a first tantalum nitride film was formed by a sputtering method and a first titanium nitride film and a second tungsten film were formed over the first tantalum nitride film by a CVD method. Then, the second tungsten film, the first titanium nitride film, and the first tantalum nitride film were polished by first CMP treatment until the top surface of the first silicon oxynitride film is exposed and the second tungsten film, the first titanium nitride film, and the first tantalum nitride film were embedded in the contact hole and the groove; accordingly, a plug electrode, a wiring layer, and a second gate electrode were formed.

Next, a second silicon oxynitride film, a hafnium oxide film, and a third silicon oxynitride film which function as a second gate insulating layer were formed in this order. The second silicon oxynitride film was formed to a thickness of 10 nm by a CVD method. The hafnium oxide film was formed to a thickness of 20 nm by an ALD method. The third silicon oxynitride film was formed to a thickness of 30 nm by a CVD method.

Next, as a first oxide (S1), an In—Ga—Zn oxide was formed to a thickness of 5 nm by a sputtering method. The S1 was formed under the following conditions: a target having an atomic ratio of In:Ga:Zn=1:3:4 was used, the oxygen gas flow rate was 45 sccm, the pressure was 0.7 Pa, and the substrate temperature was 200° C.

Then, as a second oxide (S2), an In—Ga—Zn oxide was formed to a thickness of 20 nm over the S1 by a sputtering method. The S2 was formed under the following conditions: a target having an atomic ratio of In:Ga:Zn=4:2:4.1 was used, the argon gas flow rate was 40 sccm, the oxygen gas flow rate was 5 sccm, the pressure was 0.7 Pa, and the substrate temperature was 130° C.

Then, first heat treatment was performed. As the first heat treatment, treatment was performed in an atmosphere containing nitrogen at 400° C. for one hour, and subsequently another treatment was performed under an oxygen atmosphere at 400° C. for one hour.

Next, a second tantalum nitride film was formed over the S2 to a thickness of 30 nm by a sputtering method. Then, a third aluminum oxide film was formed over the second tantalum nitride film to a thickness of 5 nm by an ALD method. Next, a third tungsten film was formed over the third aluminum oxide film to a thickness of 15 nm by a sputtering method.

Then, the third tungsten film and the third aluminum oxide film in a region where a channel is formed were etched by a lithography method. A dry etching method was used for the etching.

Next, by a lithography method, unnecessary parts of the third tungsten film, the third aluminum oxide film, the second tantalum nitride film, the S2, and the S1 were etched in this order. A dry etching method was used for the etching.

Then, the second tantalum nitride film in a region where a channel is formed was etched. A dry etching method was used for the etching.

Then, second heat treatment was performed. As the second heat treatment, treatment was performed in an atmosphere containing nitrogen at 400° C. for 30 minutes, and subsequently another treatment was performed under an oxygen atmosphere at 400° C. for 30 minutes.

Next, as a third oxide (S3), an In—Ga—Zn oxide was formed by a sputtering method. The S3 was formed under different conditions depending on Samples as follows.

For Sample A, the S3 was formed to a thickness of 5 nm under the following conditions: a target having an atomic ratio of In:Ga:Zn=1:1:1 was used, the oxygen gas flow rate was 45 sccm, the pressure was 0.7 Pa, and the substrate temperature was room temperature.

For Sample B, the S3 was formed to a thickness of 5 nm under the following conditions: a target having an atomic ratio of In:Ga:Zn=1:3:2 was used, the oxygen gas flow rate was 45 sccm, the pressure was 0.7 Pa, and the substrate temperature was 130° C.

For Sample C, the S3 was formed to a thickness of 5 nm under the following conditions: a target having an atomic ratio of In:Ga:Zn=1:3:2 was used, the oxygen gas flow rate was 45 sccm, the pressure was 0.7 Pa, and the substrate temperature was room temperature.

Then, a fourth silicon oxynitride film functioning as a first gate oxide film was formed to a thickness of 13 nm by a CVD method.

Then, third heat treatment was performed. The third heat treatment was performed in an atmosphere containing nitrogen at 400° C. for one hour.

Next, as a fourth oxide, an In—Ga—Zn oxide was formed to a thickness of 10 nm by a sputtering method. The fourth oxide was formed under the following conditions: a target having an atomic ratio of In:Ga:Zn=4:2:4.1 was used, the oxygen gas flow rate was 45 sccm, the pressure was 0.7 Pa, and the substrate temperature was 200° C.

Then, a second titanium nitride film is formed to a thickness of 5 nm over the fourth oxide by a sputtering method and a fourth tungsten film was formed to a thickness of 50 nm over the second titanium nitride film by a sputtering method. The second titanium nitride film and the fourth tungsten film were successively formed.

Then, fourth heat treatment was performed. The fourth heat treatment was performed in an atmosphere containing nitrogen at 400° C. for one hour.

Next, the fourth tungsten film, the second titanium nitride film, and the fourth oxide were etched in this order by a lithography method. A dry etching method was used for the etching of the fourth tungsten film and the second titanium nitride film, and a wet etching method was used for the fourth oxide.

Next, by a lithography method, parts of the fourth silicon oxynitride film and the S3 were etched in this order. A dry etching method was used for the etching of the fourth silicon oxynitride film and the S3.

Next, a fourth aluminum oxide film was formed to a thickness of 7 nm by an ALD method. The substrate temperature was 250° C.

Next, by a lithography method, part of the fourth aluminum oxide film was etched. The fourth aluminum oxide film was etched by a dry etching method.

Then, for Samples A and B, a fifth aluminum oxide film was formed to a thickness of 20 nm by a sputtering method under the following conditions: the argon gas flow rate was 25 sccm, the oxygen gas flow rate was 25 sccm, the pressure was 0.4 Pa, and the substrate temperature was 250° C.

Next, for Samples A and B, a sixth aluminum oxide film was formed to a thickness of 5 nm by an ALD method. The substrate temperature was 250° C.

The above fifth aluminum oxide film and sixth aluminum oxide film correspond to the insulator 272 and the insulator 274 in FIGS. 1A to 1E, respectively. Note that the fifth aluminum oxide film and the sixth aluminum oxide film were not formed for Sample C.

In this example, the fifth aluminum oxide film and the sixth aluminum oxide film are represented by SP-AlOx and ALD-AlOx, respectively, and a stack of the SP-AlOx and ALD-AlOx is represented by SP-AlOx\ALD-AlOx.

Next, a fifth silicon oxynitride film was formed to a thickness of 450 nm by a CVD method. Then, second CMP treatment was performed to polish the fifth silicon oxynitride film so that the surface of the fifth silicon oxynitride film was planarized.

Then, a seventh aluminum oxide film was formed over the fifth silicon oxide film to a thickness of 40 nm by a sputtering method under the following conditions: the argon gas flow rate was 25 sccm, the oxygen gas flow rate was 25 sccm, the pressure was 0.4 Pa, and the substrate temperature was 250° C.

Then, fifth heat treatment was performed. As the fifth heat treatment, treatment was performed in an atmosphere containing nitrogen at 400° C. for one hour, and subsequently another treatment was performed under an oxygen atmosphere at 400° C. for one hour.

Next, a sixth silicon oxynitride film was formed to a thickness of 150 nm by a CVD method.

Then, a contact hole reaching the second tungsten film, a contact hole reaching the fourth tungsten film, and a contact hole reaching the second tantalum nitride film were formed by a lithography method. Subsequently, a third tantalum nitride film was formed to a thickness of 40 nm by a sputtering method, a third titanium nitride film was formed to a thickness of 5 nm by a CVD method, and a fifth tungsten film was formed to a thickness of 250 nm by a CVD method.

Then, the fifth tungsten film, the third titanium nitride film, and the third tantalum nitride film were polished to reach the sixth silicon oxynitride film by third CMP treatment and plugs in which the fifth tungsten film, the third titanium nitride film, and the third tantalum nitride film are embedded were formed in the contact holes.

Then, a 20 nm-thick first titanium film, a 30 nm-thick fourth titanium nitride film, a 100 nm-thick aluminum film, a 5 nm-thick second titanium film, and a 45 nm-thick fifth titanium nitride film were successively formed by a sputtering method.

Next, the first titanium film, the fourth titanium nitride film, the aluminum film, the second titanium film, and the fifth titanium nitride film were processed by a lithography method to form a wiring layer.

Then, a photosensitive polyimide film was formed to a thickness of 1.6 μm by a coating method, and part of the photosensitive polyimide film that is to be a measurement terminal (measurement pad) was removed by a lithography method.

Lastly, the photosensitive polyimide film was subjected to heat treatment at 300° C. for one hour.

In this manner, Samples A to C were formed.

Figure 28A:
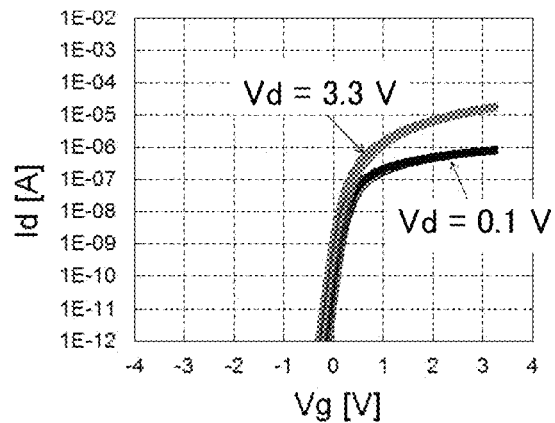
FIGS. 28A to 28C are graphs showing $I_d$-$V_g$ characteristics of an example.
Figure 28B:
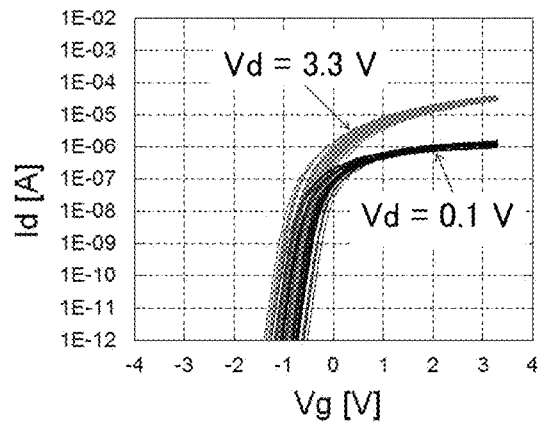
Figure 28C:
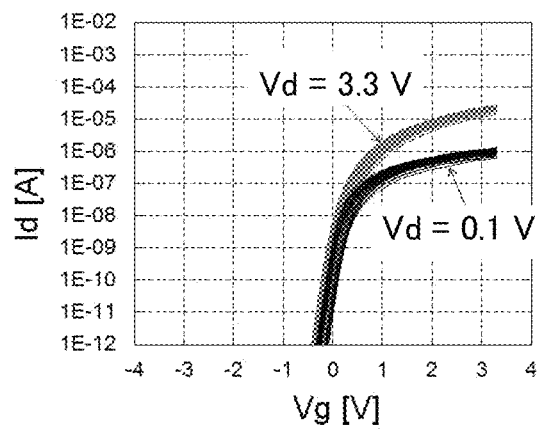

Next, electrical characteristics of Samples A to C were measured. Change in source-drain current (hereinafter, referred to as a drain current $I_d$) when a source-gate voltage (hereinafter, referred to as a gate voltage $V_g$) changed from −3.3 V to +3.3 V at a source-drain voltage (hereinafter, referred to as a drain voltage $V_d$) of 0.1 V or 3.3 V was measured. That is, $I_d$-$V_g$ characteristics were measured. Hereinafter, the gate voltage $V_g$ refers to the voltage of a first gate electrode (top gate electrode). In this measurement, the voltage of a second gate electrode (back gate electrode) was set to 0 V. Furthermore, in this measurement, the $I_d$-$V_g$ characteristics of 36 transistors in a plane of each sample were measured. FIGS. 28A, 28B, and 28C show the $I_d$-$V_g$ characteristics of Sample A, Sample B, and Sample C, respectively. Here, values and variations in $V_{sh}$ were compared among Samples.

Note that in $I_d$-$V_g$ characteristics, $V_{sh}$ is defined as a value of $V_g$ when $I_d$ is $1.0 \times 10^{-12}$ A. The $V_{sh}$ of Sample B was all lower and had larger variations in $V_{sh}$ of Sample B than those of Sample A and Sample C. That is, in Sample A and Sample C, the $V_{sh}$ was varied between approximately −0.3 V to approximately −0.1 V and, in Sample B, the $V_{sh}$ was varied between approximately −1.3 V to approximately −0.5 V.

Next, reliability tests were performed on Samples A to C. As the reliability test, +gate bias temperature (+GBT) stress tests were performed. The +GBT stress tests are one of the most important reliability test items in the reliability test of a transistor.

The +GBT stress tests were performed under the conditions where the sample temperature was 125° C., the gate potential was +3.63 V, the drain potential and the source potential each were 0 V, and stress was applied for 12 hours (43200 seconds) at a maximum. $I_d$-$V_g$ measurement was performed at 125° C. after 100 seconds, 300 seconds, 600 seconds, 1000 seconds, 1800 seconds, 3600 seconds (1 hour), 7200 seconds (2 hours), 10000 seconds, 18000 seconds (5 hours), 32400 seconds, and 43200 seconds (12 hours) from the beginning of the application of stress. Furthermore, in this measurement, the $I_d$-$V_g$ characteristics of one transistor in a plane of each sample were measured. Note that in this measurement, the potential of the second gate electrode was set to 0 V.

As an index of the amount of change in electrical characteristics of the transistor, $\Delta V_{sh}$ showing variations in the $V_{sh}$ with time was used. For example, if the $V_{sh}$ when the application of stress starts is −0.50 V and the $V_{sh}$ after the stress is applied for 100 seconds is −0.55V, the $\Delta V_{sh}$ after the stress is applied for 100 seconds is −0.05 V.

Figure 29A:
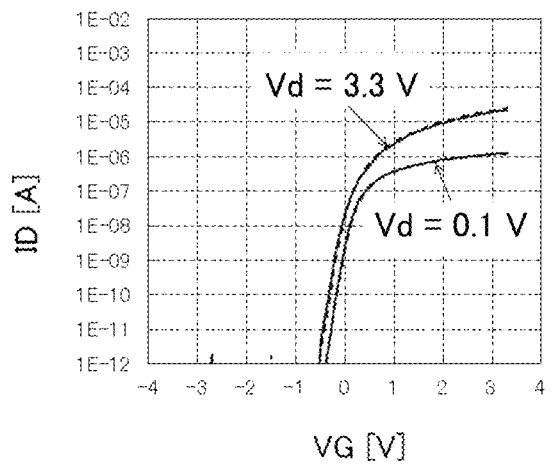
FIGS. 29A to 29C are graphs showing $I_d$-$V_g$ characteristics of an example before and after +GBT stress tests.
Figure 29B:
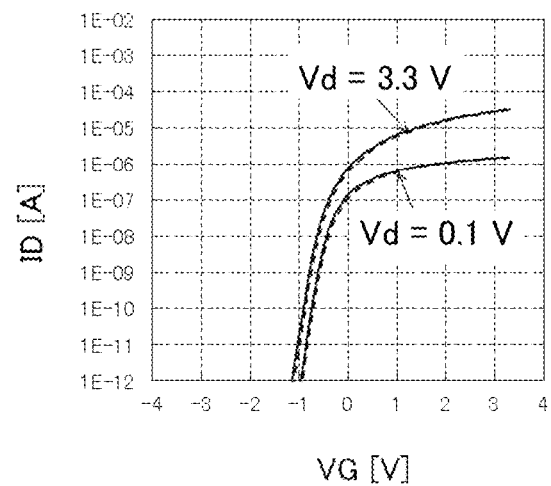
Figure 29C:
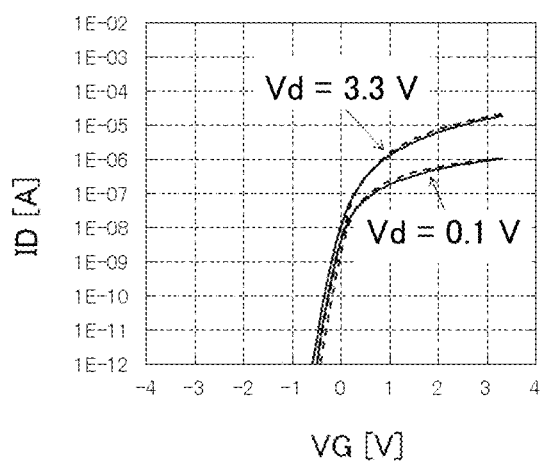

FIGS. 29A to 29C are graphs in which $I_d$-$V_g$ measurement results of Samples A to C at the time the application of stress starts and after the stress was applied for 12 hours are overwritten. FIGS. 29A, 29B, and 29C show the results of Sample A, Sample B, and Sample C, respectively. Note that in FIGS. 29A to 29C, the $I_d$-$V_g$ curves at the time the application of stress starts are represented by dotted lines and the $I_d$-$V_g$ curves after the stress was applied for 12 hours are represented by solid lines.

The comparison among the $I_d$-$V_g$ measurement results in FIGS. 29A to 29C shows that the dotted lines and the solid lines substantially overlap in FIGS. 29A and 29B; which indicates that the $I_d$-$V_g$ curves after the stress was applied for 12 hours hardly changed from the $I_d$-$V_g$ curves at the time when the application of stress starts. In contrast, it is apparent in FIG. 29C that the solid lines shift in the negative direction. Specifically, $\Delta V_{sh}$, which is a change over time from the start of the application of stress to the end of the 12-hour stress application, of Sample A was −0.04 V, $\Delta V_{sh}$ of Sample B was −0.05 V, and $\Delta V_{sh}$ of Sample C was −0.10 V. According to these results, it was found that a change in $I_d$-$V_g$ characteristics of each of Samples A and B including the insulators 272 and 274 is smaller than a change in $I_d$-$V_g$ characteristics of Sample C not including the insulators 272 and 274.

In addition, as described above, the composition of In, Ga, and Zn (atomic ratio) is different between the S3 of Sample A and the S3 of Sample B. In other words, the S3 of Sample A is an In—Ga—Zn oxide formed with a target having an atomic ratio of In:Ga:Zn=1:1:1 and the S3 of Sample B is an In—Ga—Zn oxide formed with a target having an atomic ratio of In:Ga:Zn=1:3:2. From the results in FIGS. 29A and 29B, difference in change in $V_{sh}$ in Sample A and Sample B was small.

Figure 30A:
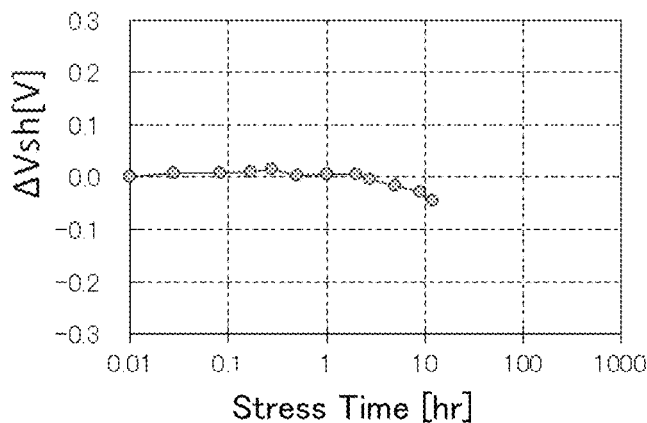
FIGS. 30A to 30C are graphs showing stress time dependence of $\Delta V_{sh}$ of an example.
Figure 30B:
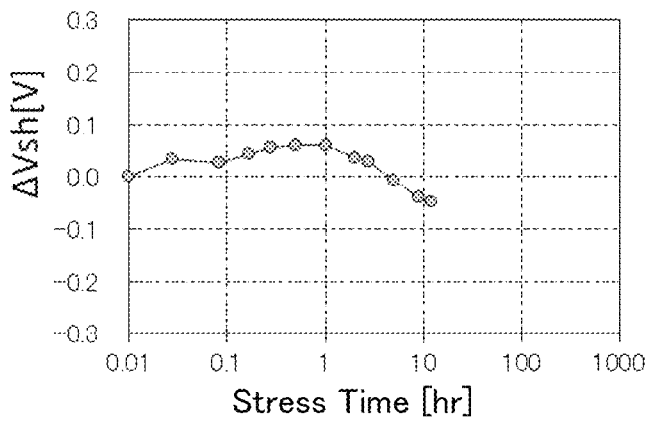
Figure 30C:
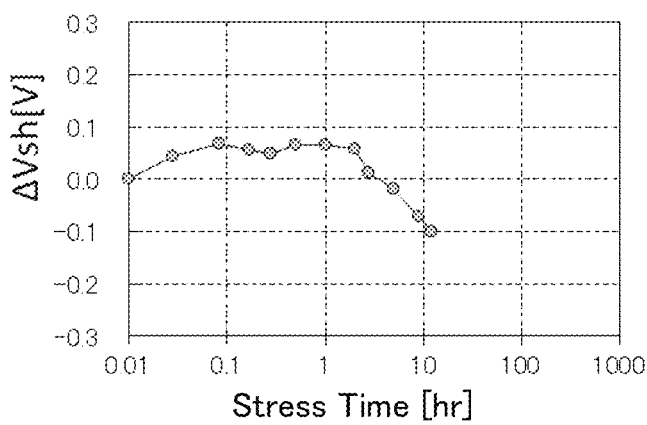

FIGS. 30A, 30B, and 30C are graphs each showing stress time dependence of $\Delta V_{sh}$ when the +GBT stress test was performed for 12 hours on Sample A, Sample B, and Sample C, respectively.

As shown in the results in FIGS. 30A to 30C, in Sample A, change in the $\Delta V_{sh}$ due to the +GBT stress test is very small (FIG. 30A). In Sample B, the change is little larger than that in Sample A (FIG. 30B). In Sample C, the change is larger than that in each of Sample A and Sample B (FIG. 30C).

Figure 31:
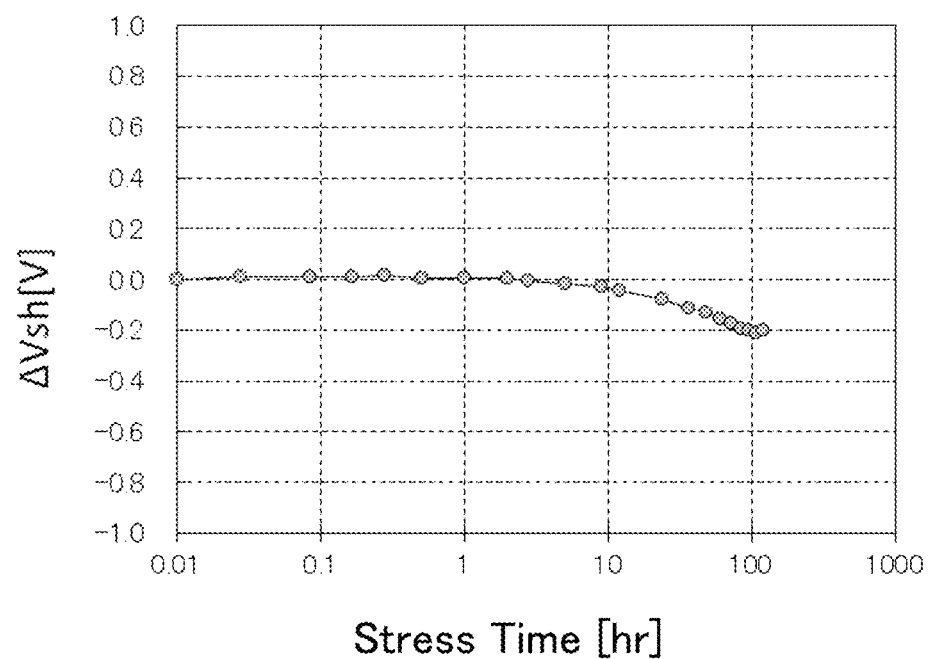
FIG. 31 is a graph showing stress time dependence of $\Delta V_{sh}$ of an example.

The +GBT stress test was continuously performed on Sample A after the stress was applied for 12 hours. FIG. 31 shows changes in the $\Delta V_{sh}$ during the application of stress for 120 hours. The $\Delta V_{sh}$ was approximately −0.2 V even after the stress was applied for 120 hours; thus, Sample A has favorable reliability.

The results of the above +GBT stress tests show that, when the results of the +GBT stress tests on Sample A and Sample B are compared with the result of the +GBT stress test on Sample C, the change in the $V_{sh}$ of each of Sample A and Sample B including the insulators 272 and 274 is apparently smaller than the change in the $V_{sh}$ of Sample C which does not include the insulators 272 and 274; therefore, Sample A and Sample B have high reliability.

EXPLANATION OF REFERENCE

100: capacitor, 101: capacitor, 110: insulator, 112: conductor, 116: conductor, 130: insulator, 132: insulator, 134: insulator, 150: insulator, 200: transistor, 201: transistor, 205: conductor, 205a: conductor, 205b: conductor, 205c: conductor, 207: conductor, 207a: conductor, 207b: conductor, 207c: conductor, 210: insulator, 212: insulator, 214: insulator, 216: insulator, 218: conductor, 220: insulator, 222: insulator, 224: insulator, 230: oxide, 230a: oxide, 230A: oxide film, 230b: oxide, 230B: oxide film, 230c: oxide, 230C: oxide film, 240: conductor, 240a: conductor, 240A: conductive film, 240b: conductor, 240B: conductive film, 245: layer, 245a: layer, 245A: film, 245b: layer, 245B: film, 247a: conductor, 247A: conductive film, 247b: conductor, 247B: conductive film, 250: insulator, 250A: insulating film, 260: conductor, 260a: conductor, 260A: conductive film, 260b: conductor, 260B: conductive film, 260c: conductor, 260C: conductive film, 270: layer, 272: insulator, 274: insulator, 280: insulator, 282: insulator, 284: insulator, 285: conductor, 287: conductor, 290: resist mask, 299: region, 300: transistor, 301: transistor, 311: substrate, 312: semiconductor region, 314: insulator, 316: conductor, 318a: low-resistance region, 318b: low-resistance region, 320: insulator, 322: insulator, 324: insulator, 326: insulator, 328: conductor, 330: conductor, 350: insulator, 352: insulator, 354: insulator, 356: conductor, 358: insulator, 400: transistor, 403: conductor, 403a: conductor, 403b: conductor, 403c: conductor, 405: conductor, 405a: conductor, 405b: conductor, 405c: conductor, 407: conductor, 407a: conductor, 407b: conductor, 407c: conductor, 430: oxide, 450: insulator, 460: conductor, 460a: conductor, 460b: conductor, 460c: conductor, 470: layer, 480: opening, 1000: semiconductor device, 3001: wiring, 3002: wiring, 3003: wiring, 3004: wiring, 3005: wiring, 3006: wiring, 3007: wiring, 3008: wiring, 3009: wiring, 3010: wiring.

This application is based on Japanese Patent Application serial No. 2016-078507 filed with Japan Patent Office on Apr. 8, 2016, the entire contents of which are hereby incorporated by reference.

The invention claimed is:
1. A semiconductor device comprising:
a first insulator;
a second insulator over the first insulator;
a first conductor over the second insulator;
a third insulator over the first conductor;
a first oxide over the third insulator;
a second oxide over the first oxide;
a source electrode and a drain electrode each over the second oxide;
a third oxide over the second oxide, the source electrode, and the drain electrode;
a gate insulating layer over the third oxide;
a gate electrode over the gate insulating layer;
a fourth insulator over the gate electrode;

a fifth insulator covering the first oxide, the second oxide, the third oxide, the source electrode, the drain electrode, the gate electrode the gate insulating layer and the fourth insulator;

a sixth insulator over the fifth insulator; and a seventh insulator between the sixth insulator and the gate electrode, wherein the second oxide is an oxide semiconductor, wherein the third oxide is in contact with a top surface of the third insulator, a side surface of the first oxide, a side surface of the second oxide, and a top surface of the second oxide in a channel width direction, wherein the gate electrode and the second oxide overlap each other, wherein the fifth insulator is in contact with the top surface of the third insulator and the side surface of the second oxide in a channel length direction, wherein each of the first insulator, the second insulator, the fifth insulator, and the sixth insulator comprises aluminum oxide, and wherein the first insulator has a smaller thickness than the second insulator.

2. The semiconductor device according to claim 1, wherein the seventh insulator is in contact with a top surface of the gate electrode, and wherein the seventh insulator comprises aluminum oxide.

3. The semiconductor device according to claim 2, wherein an end portion of the third oxide and an end portion of the seventh insulator are substantially aligned in the channel width direction.

4. The semiconductor device according to claim 2, wherein an end portion of the third oxide, an end portion of the gate insulating layer, and an end portion of the seventh insulator are substantially aligned.

5. The semiconductor device according to claim 1, further comprising:

an eighth insulator over the sixth insulator;

a ninth insulator over the eighth insulator; and a tenth insulator over the ninth insulator, wherein each of the ninth insulator and the tenth insulator comprises aluminum oxide.

6. The semiconductor device according to claim 1, wherein each of the first oxide, the second oxide, and the third oxide comprises In, M, and Zn, and wherein M is an element selected from Al, Ga, Y, and Sn.

7. The semiconductor device according to claim 1, wherein each of the third insulator and the gate insulating layer comprises Si and O.

* * * * *